(12) United States Patent
Koyama

(10) Patent No.: US 8,071,982 B2
(45) Date of Patent: Dec. 6, 2011

(54) LIGHT EMITTING DEVICE AND ELECTRONIC EQUIPMENT

(75) Inventor: Jun Koyama, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/966,379

(22) Filed: Dec. 13, 2010

(65) Prior Publication Data

US 2011/0084281 A1    Apr. 14, 2011

Related U.S. Application Data

(63) Continuation of application No. 10/902,421, filed on Jul. 30, 2004, now Pat. No. 7,851,796, which is a continuation of application No. 10/077,760, filed on Feb. 20, 2002, now Pat. No. 6,777,710.

(30) Foreign Application Priority Data

Feb. 26, 2001    (JP) ................................ 2001-050644

(51) Int. Cl.
*H01L 29/10* (2006.01)
(52) U.S. Cl. ......... 257/59; 257/40; 257/72; 257/E27.12; 345/30; 345/76; 345/77
(58) Field of Classification Search .................... 257/59, 257/40, 72, 88, E27.12; 345/30, 76, 77
See application file for complete search history.

(56) References Cited

U.S. PATENT DOCUMENTS

| | | | |
|---|---|---|---|
| 4,996,523 A | 2/1991 | Bell et al. | |
| 5,684,365 A | 11/1997 | Tang et al. | |
| 5,952,789 A | 9/1999 | Stewart et al. | |
| 5,990,629 A | 11/1999 | Yamada et al. | |
| 6,023,259 A | 2/2000 | Howard et al. | |
| 6,091,203 A * | 7/2000 | Kawashima et al. | 315/169.3 |
| 6,229,506 B1 | 5/2001 | Dawson et al. | |
| 6,246,179 B1 * | 6/2001 | Yamada | 315/169.3 |
| 6,307,322 B1 | 10/2001 | Dawson et al. | |
| 6,351,078 B1 | 2/2002 | Wang et al. | |

(Continued)

FOREIGN PATENT DOCUMENTS

EP    0 365 445 A2    4/1990

(Continued)

OTHER PUBLICATIONS

Bae et al.; "A Novel Pixel Design for an Active Matrix Organic Light Emitting Diode Display"; SID 2000; pp. 358-361, 2000.

(Continued)

*Primary Examiner* — Thinh T Nguyen
(74) *Attorney, Agent, or Firm* — Fish & Richardson P.C.

(57) ABSTRACT

A display device capable of keeping the luminance constant irrespective of temperature change is provided as well as a method of driving the display device. A current mirror circuit composed of transistors is placed in each pixel. A first transistor and a second transistor of the current mirror circuit are connected such that the drain current of the first transistor is kept in proportion to the drain current of the second transistor irrespective of the load resistance value. The drain current of the first transistor is controlled by a driving circuit in accordance with a video signal and the drain current of the second transistor is caused to flow into an OLED, thereby controlling the OLED drive current and the luminance of the OLED.

15 Claims, 31 Drawing Sheets

U.S. PATENT DOCUMENTS

| | | |
|---|---|---|
| 6,359,605 B1 | 3/2002 | Knapp et al. |
| 6,366,116 B1 | 4/2002 | Juang |
| 6,373,454 B1 | 4/2002 | Knapp et al. |
| 6,452,341 B1 | 9/2002 | Yamauchi et al. |
| 6,486,606 B1 | 11/2002 | Ting |
| 6,501,466 B1 | 12/2002 | Yamagishi et al. |
| 6,535,185 B2 | 3/2003 | Kim et al. |
| 6,577,302 B2 | 6/2003 | Hunter et al. |
| 6,753,654 B2 | 6/2004 | Koyama |
| 6,777,710 B1 | 8/2004 | Koyama |
| 6,859,193 B1 | 2/2005 | Yumoto |
| 7,336,035 B2 | 2/2008 | Koyama |
| 7,414,600 B2 | 8/2008 | Nathan et al. |
| 7,569,849 B2 | 8/2009 | Nathan et al. |
| 7,719,498 B2 | 5/2010 | Koyama |
| 7,851,796 B2 | 12/2010 | Koyama |
| 2001/0022565 A1 | 9/2001 | Kimura |
| 2001/0026251 A1 | 10/2001 | Hunter et al. |
| 2001/0045929 A1 | 11/2001 | Prache et al. |
| 2001/0055828 A1 | 12/2001 | Kaneko et al. |
| 2002/0126073 A1 | 9/2002 | Knapp et al. |
| 2002/0135313 A1 | 9/2002 | Koyama |
| 2002/0180369 A1 | 12/2002 | Koyama |
| 2003/0062524 A1 | 4/2003 | Kimura |
| 2004/0129933 A1 | 7/2004 | Nathan et al. |
| 2009/0284501 A1 | 11/2009 | Nathan et al. |
| 2010/0201721 A1 | 8/2010 | Koyama |

FOREIGN PATENT DOCUMENTS

| | | |
|---|---|---|
| EP | 717446 A2 | 6/1996 |
| EP | 1102234 A2 | 5/2001 |
| EP | 1130565 A1 | 9/2001 |
| EP | 2 180 508 A2 | 4/2010 |
| JP | 02-148687 A | 6/1990 |
| JP | 08-234683 A | 9/1996 |
| JP | 10-214060 A | 8/1998 |
| JP | 11-282419 A | 10/1999 |
| JP | 2000-40924 A | 2/2000 |
| JP | 2000-56847 A | 2/2000 |
| JP | 2000-138572 A | 5/2000 |
| JP | 2000-267164 A | 9/2000 |
| JP | 2001-042822 A | 2/2001 |
| JP | 2001-042826 A | 2/2001 |
| JP | 2001-147659 A | 5/2001 |
| JP | 2001-324958 A | 11/2001 |
| JP | 2002-518691 A | 6/2002 |
| JP | 2002-251166 A | 9/2002 |
| JP | 2002-333862 A | 11/2002 |
| JP | 2004-531751 A | 10/2004 |
| WO | WO 98/33165 A1 | 7/1998 |
| WO | WO 99/65012 A2 | 12/1999 |
| WO | WO 01/06484 A1 | 11/2001 |
| WO | 02/067327 A2 | 8/2002 |

OTHER PUBLICATIONS

Baldo et al.; "Highly efficient phosphorescent emission from organic electroluminescent devices"; Nature, vol. 395; pp. 151-154; Sep. 10, 1998.

Baldo et al.; "Very high-efficiency green organic light-emitting devices based on electrophosphorescence"; Applied Physics Letters, vol. 75(1); pp. 4-6; Jul. 5, 1999.

Chapter 6.7 MOS differential amplifiers; Micro-electronics circuits by Sedra/Smith Saunders College Publishing 1991, pp. 447-456.

L.M. Hunter et al., "Active Matrix Addressing of Polymer Light Emitting Diodes Using Low Temperature Poly Silicon TFT's," AM-LCD 2000, Jan. 1, 2000, pp. 249-252.

M. Kimura et al., "Low-Temperature Poly-Si TFT Display Using Light-Emitting-Polymer," AM-LCD 2000, Jan. 1, 2000, pp. 245-248.

R.M.A. Dawson et al., "The Impact of the Transient Response of Organic Light-Emitting Diodes on the Design of Active Matrix OLED Displays," IEDM 98, Jan. 1, 1998, 875-878.

R.M.A. Dawson et al., "Design of an Improved Pixel for a Polysilicon Active-Matrix Organic LED Display," SID 98 Digest, Jan. 1, 1998, 11-14.

R.M.A. Dawson et al., "A Poly-Si Active-Matrix OLED Display with Integrated Drivers," SID 99 Digest, Jan. 1, 1999, pp. 438-441.

Tsutsui et al.; "High Quantum Efficiency in Organic Light-Emitting Devices with Iridium-Complex as a Triplet Emissive Center"; Japan Journal of Applied Physics, vol. 38; pp. L1502-L1504; Part 2, No. 12B; Dec. 15, 1999.

Yumoto et al.; "Pixel-Driving Methods for Large-Sized Poly-Si AM-OLED Displays"; Asia Display/IDW '01; pp. 1395-1398; 2001.

Tetsuo Tsutsui, "Electroluminescence in Organic Thin Films"; Photochemical Processes in Organized Molecular Systems; North-Holland, Amsterdam; 1991; pp. 437-450.

\* cited by examiner

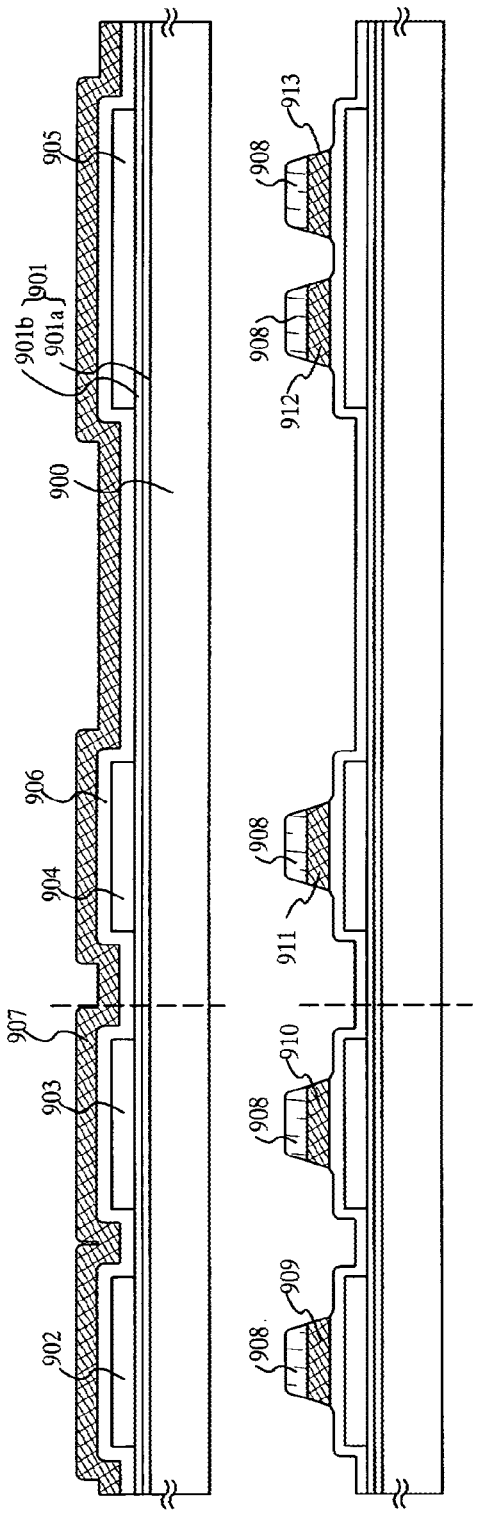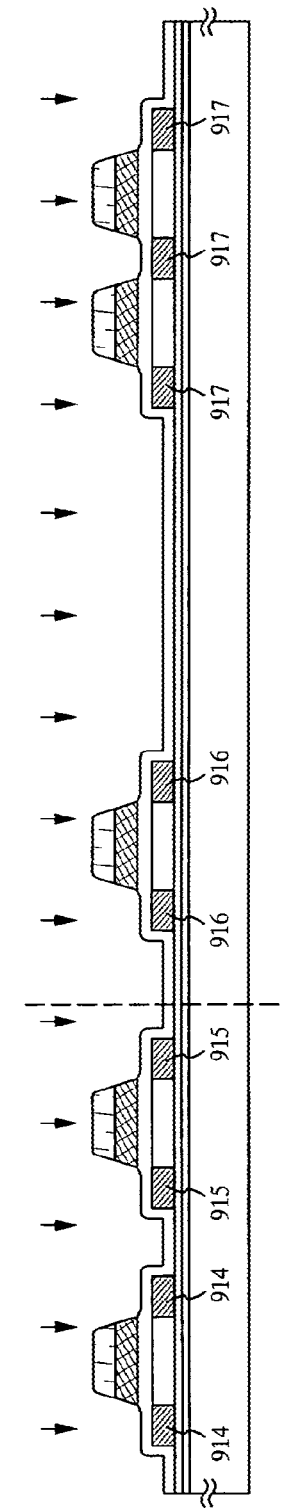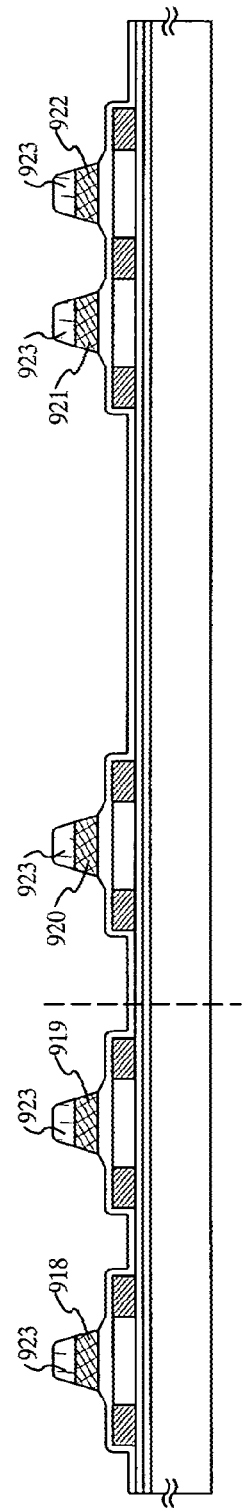

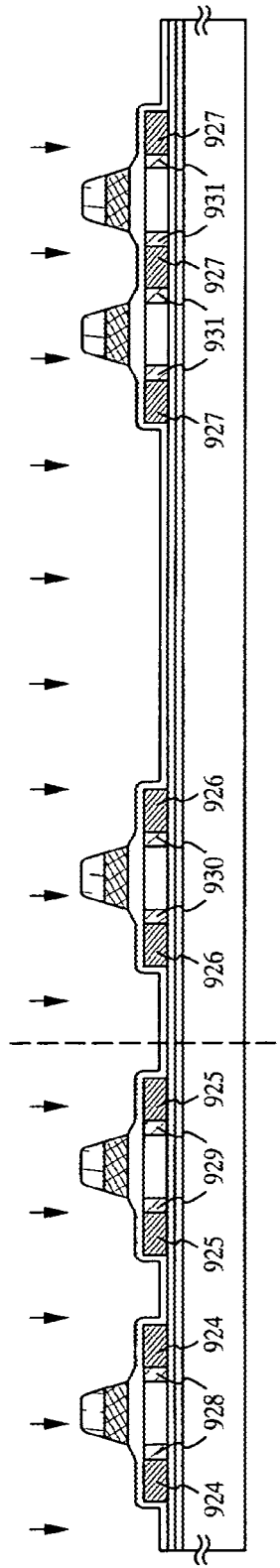
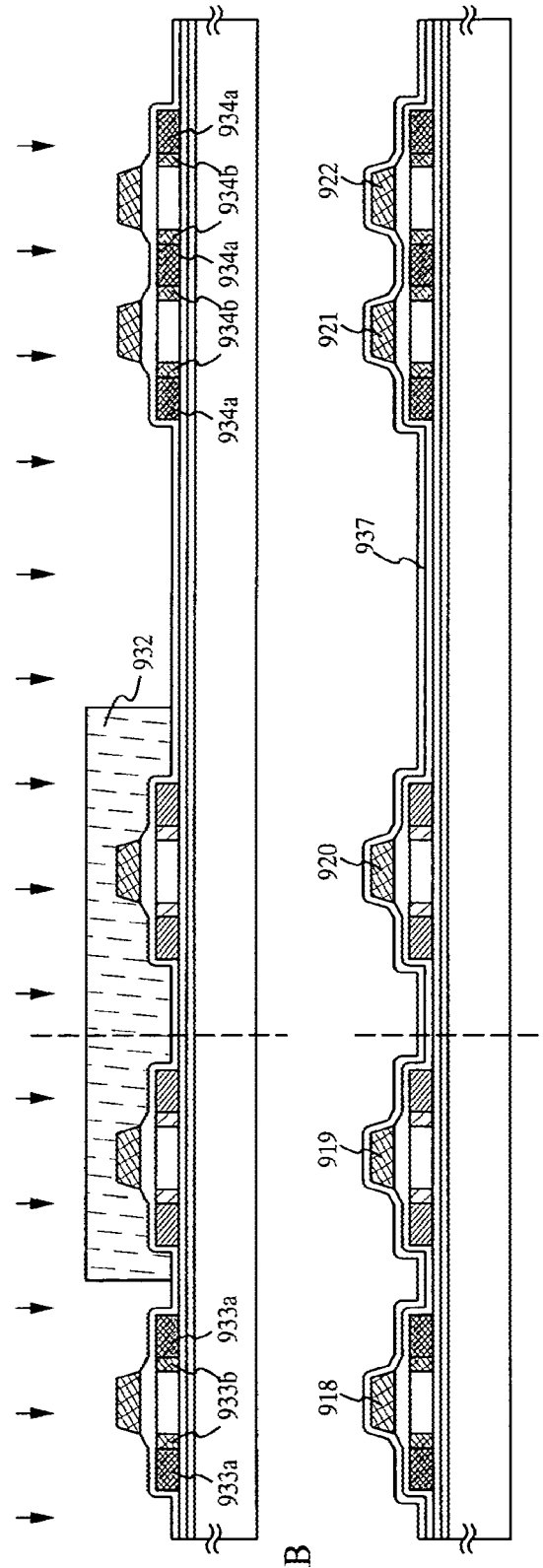
Fig. 10A
Fig. 10B
Fig. 10C

LIGHT EMITTING DEVICE AND ELECTRONIC EQUIPMENT

CROSS-REFERENCE TO RELATED APPLICATIONS

This application is a continuation of U.S. application Ser. No. 10/902,421, filed Jul. 30, 2004, now allowed, which is a continuation of U.S. application Ser. No. 10/077,760, filed Feb. 20, 2002, now U.S. Pat. No. 6,777,710, which claims the benefit of a foreign priority application filed in Japan as Serial No. 2001-050644 on Feb. 26, 2001, all of which are incorporated by reference.

BACKGROUND OF THE INVENTION

1. Field of the Invention

The present invention relates to an OLED (organic light emitting diode) panel obtained by forming an OLED on a substrate and sealing the OLED between the substrate and a cover member. The invention also relates to an OLED module in which an IC including a controller, or the like, is mounted to the OLED panel. In this specification, 'light emitting device' is the generic term for the OLED panel and for the OLED module. Electronic equipment using the light emitting device is also included in the present invention.

2. Description of the Related Art

Being self-luminous, OLEDs eliminate the need for a backlight that is necessary in liquid crystal display devices (LCDs), and thus they are most suitable when manufacturing thinner devices. Also, the self-luminous OLEDs are high in visibility and have no limit in terms of viewing angle. These are the reasons for the attention that light emitting devices using the OLEDs are receiving in recent years as display devices to replace CRTs and LCDs.

An OLED has a layer containing an organic compound (organic light emitting material) that provides luminescence (electroluminescence) when an electric field is applied (the layer is hereinafter referred to as organic light emitting layer), in addition to an anode layer and a cathode layer. Luminescence obtained from organic compounds is classified into light emission upon return to the base state from singlet excitation (fluorescence) and light emission upon return to the base state from triplet excitation (phosphorescence). A light emitting device according to the present invention can use one or both types of the light emission.

In this specification, all the layers that are provided between an anode and a cathode together make an organic light emitting layer. Specifically, the organic light emitting layer includes a light emitting layer, a hole injection layer, an electron injection layer, a hole transporting layer, an electron transporting layer, etc. A basic structure of an OLED is a laminate of an anode, a light emitting layer, and a cathode layered in this order. The basic structure can be modified into a laminate of an anode, a hole injection layer, a light emitting layer, and a cathode layered in this order, or a laminate of an anode, a hole injection layer, a light emitting layer, an electron transporting layer, and a cathode layered in this order.

The problem in putting a light emitting device into practice is lowering in luminance of OLED which accompanies degradation of its organic light emitting material.

Organic light emitting materials are weak against moisture, oxygen, light, and heat, which accelerate degradation of the organic light emitting materials. Specifically, the rate of degradation of an organic light emitting material depends on the structure of a device for driving the light emitting device, characteristics of the organic light emitting material, materials of electrodes, manufacture process conditions, how the light emitting device is driven, etc.

Even when the voltage applied to the organic light emitting layer is constant, the luminance of the OLED is lowered as the organic light emitting layer degrades, and an image displayed therefore becomes unclear. In this specification, a voltage applied to an organic light emitting layer from a pair of electrodes is called an OLED drive voltage (Vel).

When an image is displayed in color by using three types of OLEDs that respectively emit red (R) light, green (G) light, and blue (B) light, different organic materials are used to form organic light emitting layers of OLEDs of different colors. Accordingly, the rate of degradation of organic light emitting layer may vary between OLEDs of different colors. Then the difference in luminance between OLEDs of different colors will be noticeably large as time passes, making it impossible for the light emitting device to display an image in desired colors.

The temperature of organic light emitting layer is influenced by the outside temperature and heat generated from the OLED panel itself. Generally, the amount of current flowing in an OLED varies depending on the temperature. FIG. 26 shows a change in voltage-current characteristic of an OLED when the temperature of its organic light emitting layer is changed. With the voltage kept constant, the OLED drive current is increased as the temperature of the organic light emitting layer rises. Since the OLED drive current is in proportion to the OLED luminance, the luminance of the OLED becomes higher as the OLED drive current becomes larger. Since a change in temperature of the organic light emitting layer thus causes a change in OLED luminance, displaying an image in desired gray scales is difficult and current consumption of the light emitting device is increased accompanying a temperature rise.

Generally, temperature change brings varying degrees of changes in OLED drive current to different types of organic light emitting materials and, therefore, in color display, the luminance could be changed by temperature change differently for OLEDs of different colors. It is impossible to obtain desired colors when OLEDs of different colors lose their luminance balance.

SUMMARY OF THE INVENTION

The present invention has been made in view of the above, and an object of the present invention is therefore to provide a light emitting device capable of keeping the luminance constant and displaying an image in desired colors without being influenced by degradation of its organic light emitting layer or by temperature change.

The present inventors have taken notice of the fact that the luminance of OLED is lowered by degradation less when light is emitted with a current flow to an OLED kept constant than when light is emitted with the OLED drive voltage kept constant. (In this specification, a current flowing into an OLED is called an OLED drive current (Iel).) Then, the present inventors have thought of preventing a change in OLED luminance due to degradation of OLED by controlling the OLED luminance with current instead of voltage.

Specifically, a current mirror circuit composed of transistors is provided in each pixel in the present invention. The current mirror circuit is used to control the OLED drive current. A first transistor and a second transistor of the current mirror circuit are connected such that the drain current of the first transistor is kept substantially equal to the drain current of the second transistor irrespective of the load resistance value.

A drain current $I_1$ of the first transistor is controlled by a signal line driving circuit. The amount of drain current $I_1$ of the first transistor is always equal to the amount of drain current $I_2$ of the second transistor irrespective of the load resistance value. Accordingly, the drain current $I_2$ of the second transistor is controlled by the signal line driving circuit.

The second transistor is connected to an OLED with a single or plural circuit elements interposed therebetween, so that the drain current $I_2$ thereof flows into the OLED. Therefore the value of OLED drive current flowing into the OLED is controlled by the signal line driving circuit irrespective of the load resistance value. In other words, the OLED drive current can be controlled to have a desired value without being influenced by difference in characteristics of transistors or degradation of OLED.

With the above structure, the present invention can prevent the luminance of OLED from lowering even when the organic light emitting layer is degraded and therefore can display a clear image. If the light emitting device is to display an image in color using OLEDs of different colors and the rate of degradation of organic light emitting layer varies between the OLEDs of different colors, the present invention is capable of keeping the luminance of light of different colors balanced and display in desired colors.

Furthermore, the present invention can set the OLED drive current to a desired value despite a change in temperature of the organic light emitting layer due to the outside temperature and heat generated from the OLED panel itself. Since the OLED drive current is in proportion to the OLED luminance, the luminance of OLED can be prevented from changing and current consumption accompanying a temperature rise can be avoided. If the light emitting device is to display an image in color, the luminance of the OLEDs of different colors can be prevented from changing to keep the luminance of light of different colors balanced and display in desired colors.

Generally, temperature change brings varying degrees of changes in OLED drive current to different types of organic light emitting materials and, therefore, in color display, the luminance could be changed by temperature change differently for OLEDs of different colors. However, the light emitting device of the present invention can obtain a desired luminance irrespective of temperature change to thereby keep the luminance of light of different colors balanced. An image thus can be displayed in desired colors.

In a common light emitting device, the electric potential of a wiring line used to supply a current to pixels is slightly lowered as the wiring line becomes longer because of the resistance of the wiring line itself. This electric potential is lowered to widely varying degrees depending on an image to be displayed. When the ratio of higher gray scale pixels to all of the pixels that receive a current from the same wiring line is large, in particular, the current flowing through the wiring lines is increased in amount to make lowering of electric potential noticeable. When the electric potential is lowered, a smaller voltage is applied to the OLED of each pixel to reduce the amount of current supplied to each pixel. Therefore, the amount of current supplied to one pixel is changed as well as the gray scale number thereof when the gray scale number of other pixels that receive a current from the same wiring line as the one pixel is changed, making it impossible for the one pixel to keep a constant gray scale. In the light emitting device of the present invention, on the other hand, a measured value and a reference value are obtained to correct the OLED current each time a new image is displayed. Therefore, a desired gray scale number is obtained for every new image through correction.

In the light emitting device of the present invention, a transistor used in a pixel may be one formed from single crystal silicon or may be a thin film transistor formed from polycrystalline silicon or amorphous silicon.

BRIEF DESCRIPTION OF THE DRAWINGS

In the accompanying drawings:

FIGS. 9A to 9D are diagrams showing a method of manufacturing a light emitting device according to the present invention;

FIGS. 10A to 10C are diagrams showing a method of manufacturing a light emitting device according to the present invention;

DETAILED DESCRIPTION OF THE PREFERRED EMBODIMENTS

Embodiment Mode 1

Figure 1:
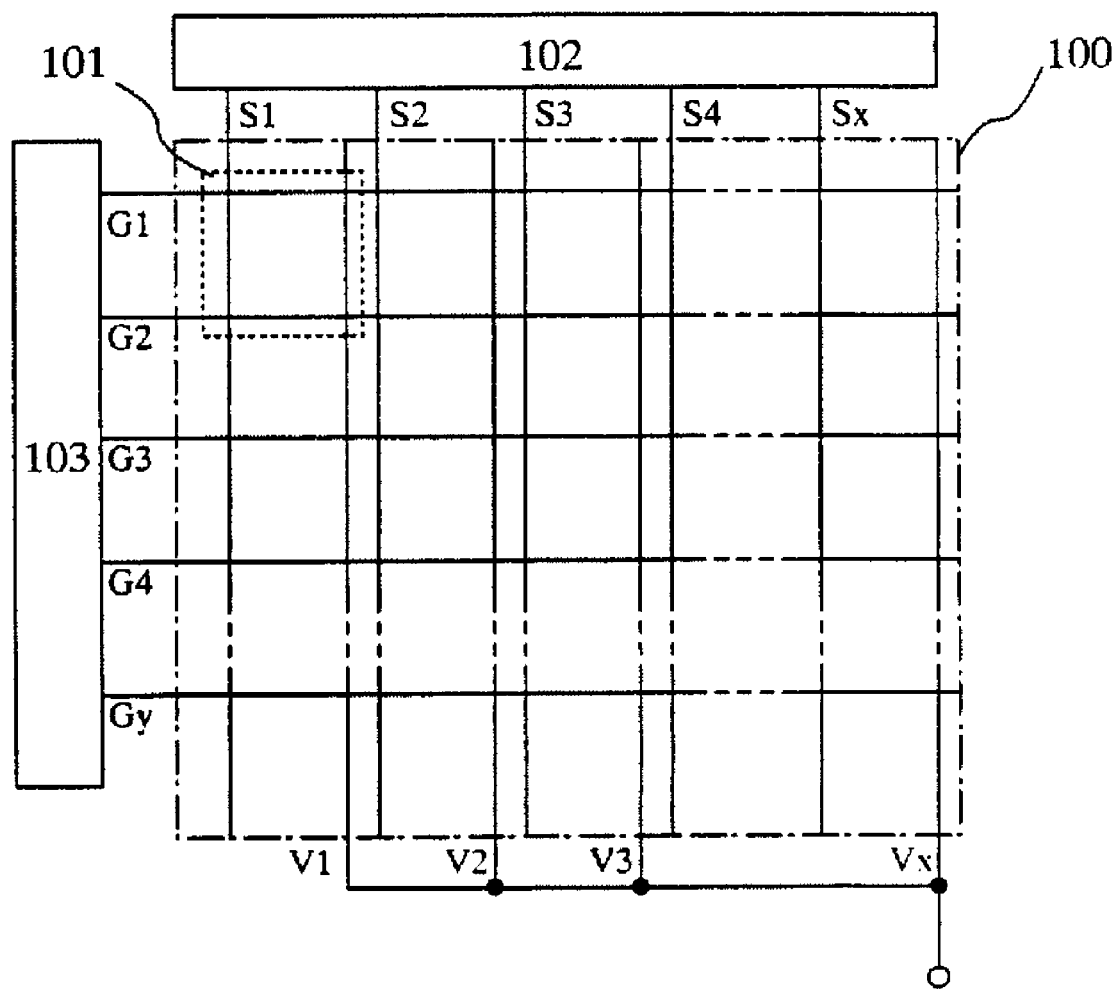
FIG. 1 is a block diagram showing a top view of a light emitting device of the present invention.

FIG. 1 is a block diagram showing the structure of an OLED panel of the present invention. Reference symbol 100 denotes a pixel portion. The pixel portion has a plurality of pixels 101 that form a matrix. Denoted by 102 and 103 are a signal line driving circuit and a scanning line driving circuit, respectively.

In FIG. 1, the signal line driving circuit 102 and the scanning line driving circuit 103 are formed on the same substrate on which the pixel portion 100 is formed. However, the present invention is not limited to this structure. The signal line driving circuit 102 and the scanning line driving circuit 103 may be formed on a substrate that is connected through an FPC or other connectors to a substrate on which the pixel portion 100 is formed. Although the panel in FIG. 1 has one signal line driving circuit 102 and one scanning line driving circuit 103, the present invention is not limited thereto. The number of signal line driving circuits and scanning line driving circuits to be provided is freely determined by a designer.

In this specification, connection means electric connection.

In FIG. 1, the pixel portion 100 is provided with signal lines S1 to Sx, power supply lines V1 to Vx, and scanning lines G1 to Gy. The number of signal lines may not always match the number of power supply lines. The pixel portion may have other wiring lines than these wiring lines.

The power supply lines V1 to Vx are kept at a given electric potential. Although shown in FIG. 1 is the structure of a light emitting device for displaying a monochromatic image, the present invention can be applied to a light emitting device for displaying a color image. In this case, not all of the power supply lines V1 to Vx may be kept at the same level of electric potential and power supply lines for one color may have a different level of electric potential than power supply lines for another color.

Figure 2:
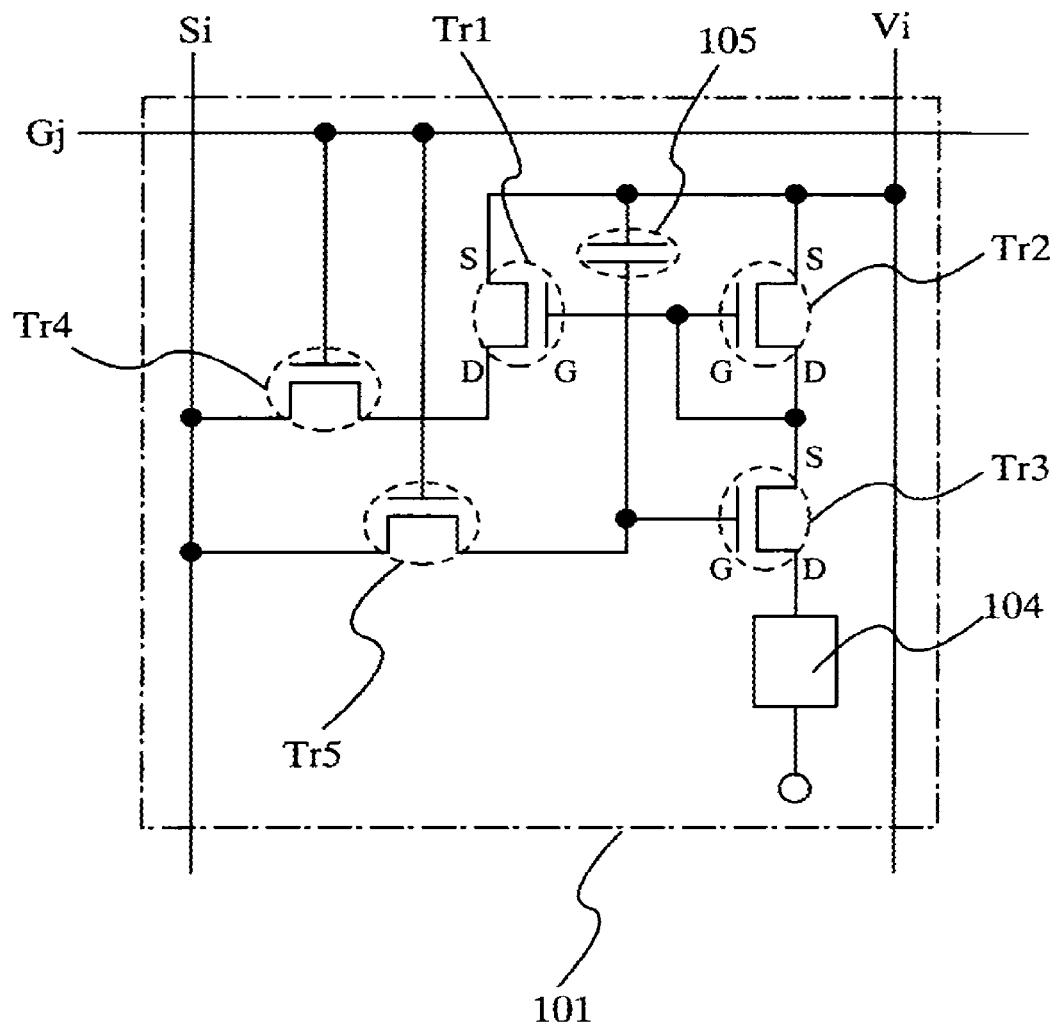
FIG. 2 is a circuit diagram of a pixel in a light emitting device of the present invention.

FIG. 2 shows a detailed structure of the pixels 101 illustrated in FIG. 1. A pixel shown in FIG. 2 is one of the pixels 101. The pixel 101 has a signal line Si (one of S1 to Sx), a scanning line Gj (one of G1 to Gy), and a power supply line Vi (one of V1 to Vx).

Each of the pixels 101 has, at least, a transistor Tr1 (a first current controlling transistor or a first transistor), a transistor Tr2 (a second current controlling transistor or a second transistor), a transistor Tr3 (a third current controlling transistor or a third transistor), a transistor Tr4 (a first switching transistor or a fourth transistor), a transistor Tr5 (a second switching transistor or a fifth transistor), an OLED 104, and a storage capacitor 105.

Gate electrodes of the transistor Tr4 and of the transistor Tr5 are connected to the scanning line Gj.

The transistor Tr4 has a source region and a drain region one of which is connected to the signal line Si and the other of which is connected to a drain region of the transistor Tr1. The transistor Tr5 has a source region and a drain region one of which is connected to the signal line Si and the other of which is connected to a gate electrode of the transistor Tr3.

Gate electrodes of the transistor Tr1 and of the transistor Tr2 are connected to each other. Source regions of the transistor Tr1 and of the transistor Tr2 are connected to the power supply line Vi.

The gate electrode of the transistor Tr2 is connected to a drain region thereof. The drain region of the transistor Tr2 is connected to a source region of the transistor Tr3.

A drain region of the transistor Tr3 is connected to a pixel electrode of the OLED 104. The OLED 104 has an anode and a cathode. In this specification, the cathode is called an opposite electrode (second electrode) when the anode is used as a pixel electrode (first electrode) and, when the cathode serves as the pixel electrode, the anode is called the opposite electrode.

The electric potential of the power supply line Vi (power supply electric potential) is kept constant. The electric potential of the opposite electrode is also kept constant.

The transistor Tr4 may be an n-channel transistor or a p-channel transistor and the same applies to the transistor Tr5. However, the transistor Tr4 and the transistor Tr5 have to have the same polarity.

The transistor Tr1 may be an n-channel transistor or a p-channel transistor and the same applies to the transistors Tr2 and Tr3. However, the transistors Tr1, Tr2, and Tr3 have to have the same polarity. When the pixel electrode serves as an anode and the opposite electrode serves as a cathode, the transistors Tr1, Tr2, and Tr3 are p-channel transistors. On the other hand, n-channel transistors are used for the transistors Tr1, Tr2, and Tr3 when the opposite electrode serves as an anode and the pixel electrode serves as a cathode.

The storage capacitor 105 is formed between the gate electrode of the transistor Tr3 and the power supply line Vi. The storage capacitor 105 is provided to maintain the voltage between the gate electrode of the transistor Tr3 and the source region thereof (gate voltage) more securely but it may not always be necessary.

The transistors Tr1 and Tr2 may have storage capacitor s between their gate electrodes and the power supply line so that the gate voltages of the transistors Tr1 and Tr2 can be maintained more securely.

Figure 3A:
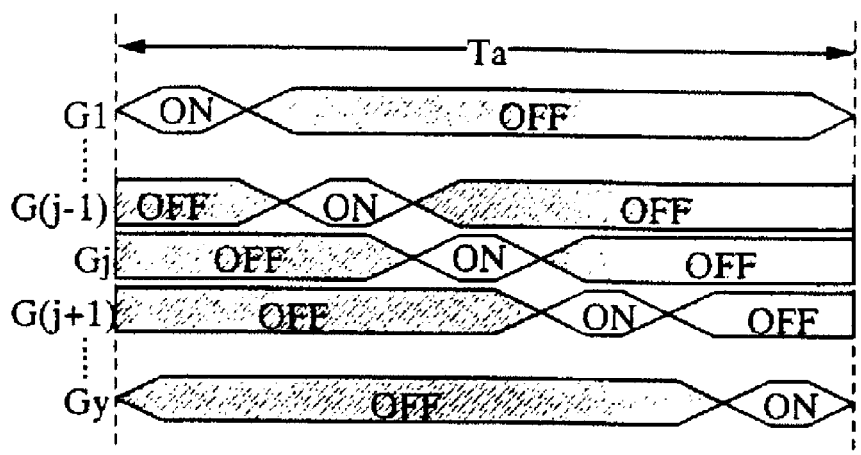
FIGS. 3A and 3B are timing charts of signals inputted to scanning lines.
Figure 3B:
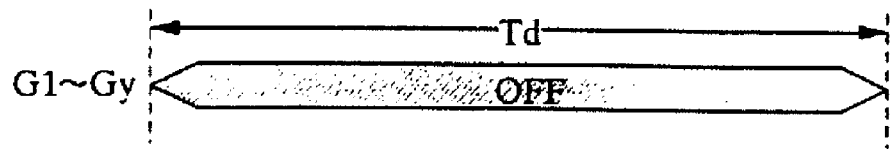
Figure 4A:
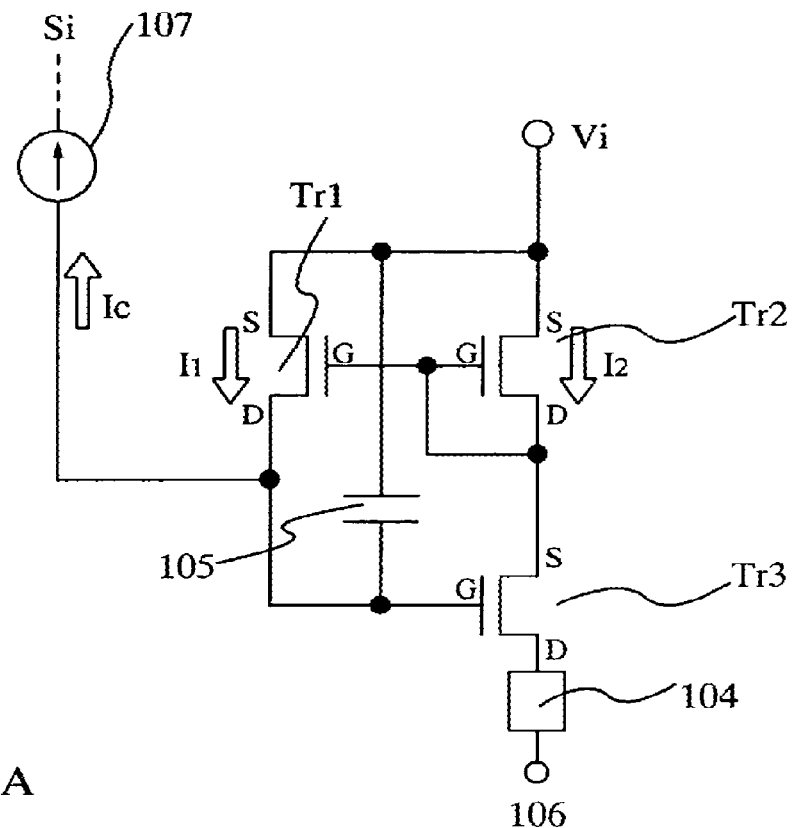
FIGS. 4A and 4B are schematic diagrams of a pixel being driven.
Figure 4B:
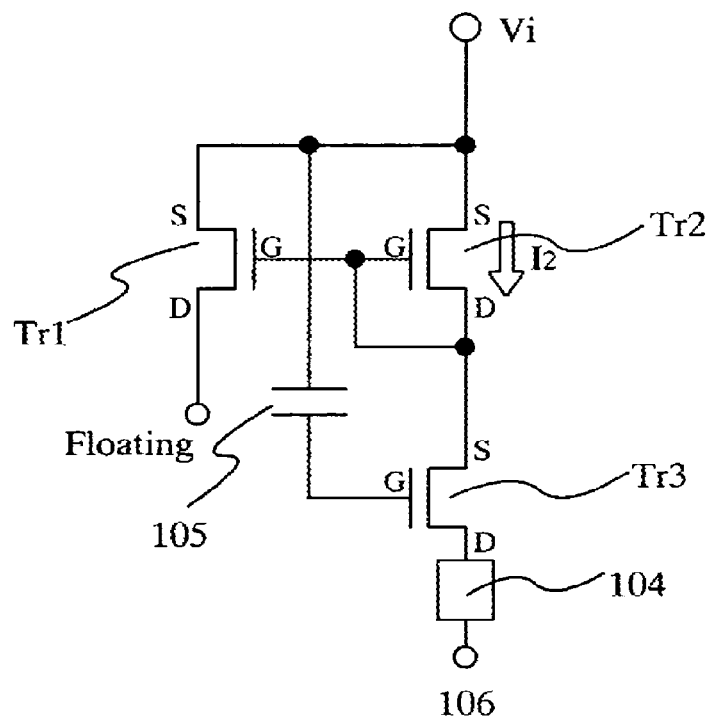

Next, driving of the light emitting device of the present invention will be described with reference to FIGS. 3A to 4B. The description on driving of the light emitting device of the present invention can be divided into a description for a writing period Ta and a description for a display period Td. FIGS. 3A and 3B are timing charts of scanning lines. A period in which a scanning line is selected, in other words, a period in which every transistor whose gate electrode is connected to the selected scanning line is turned ON, is expressed as ON. On the other hand, a period in which a scanning line is not selected, in other words, a period in which every transistor whose gate electrode is connected to the scanning line is turned OFF, is expressed as OFF. FIGS. 4A and 4B schematically show connection of the transistor Tr1, the transistor Tr2 and the transistor Tr3 during a writing period Ta and a display period Td.

In a writing period Ta, the scanning lines G1 to Gy are selected in order as shown in FIG. 3A. Then a constant current Ic flows between the signal lines S1 to Sx and the power supply lines V1 to Vx in accordance with the electric potential of a video signal inputted to the signal line driving circuit 102. In this specification, the current Ic is called a signal current.

FIG. 4A shows a schematic diagram of one of the pixels 1(1)1 when the constant current Ic flows in the signal line Si in a writing period Ta. Denoted by 106 is a terminal for connecting the pixel to a power supply for giving an electric potential to the opposite electrode. 107 denotes a constant current supply of the signal line driving circuit 102.

The transistors Tr4 and Tr5 are ON and, when the signal line Si receives the constant current Ic, the constant current Ic flows between the drain region of the transistor Tr1 and the source region thereof. The amount of the constant current Ic is controlled by the constant current supply 107 so that the transistor Tr1 operates in a saturation range. In the saturation range, $V_{GS}$ is given as the electric potential difference between the gate electrode and the source region (gate voltage), μ is given as the mobility of the transistor. $C_O$ as the gate capacitance per unit area, W/L as the ratio of a channel width W of the channel formation region to a channel length L thereof, $V_{TH}$ as the threshold, and $I_1$ as the drain current of the transistor Tr1. Then the following Equation 1 is obtained.

$$I_1 = \mu C_O W/L (V_{GS} - V_{TH})^2 / 2 \qquad \text{Equation 1}$$

In Equation 1, μ, $C_O$, W/L, and $V_{TH}$ are values fixed for the respective transistors. The drain current $I_1$ of the transistor Tr1 is also kept constant at Ic by the constant current supply 107. Accordingly, the gate voltage $V_{GS}$ of the transistor Tr1 is determined by the value of the current Ic as shown in Equation 1.

The gate electrode of the transistor Tr2 is connected to the gate electrode of the transistor Tr1. The source region of the transistor Tr2 is connected to the source region of the transistor Tr1. Therefore the gate voltage of the transistor Tr2 is equal to the gate voltage of the transistor Tr1. Accordingly, a drain current $I_2$ of the transistor Tr2 is kept at the same level as the drain current of the transistor Tr1 to satisfy $I_2$=Ic.

The drain current of the transistor Tr3 is equal to the drain current $I_2$ of the transistor Tr2. Satisfying Equation 1, the transistor Tr3 generates a gate voltage in an amount according to the drain current $I_2$.

The drain current $I_2$ of the transistor Tr2 thus flows into the OLED 104 through a channel formation region of the transistor Tr3. Accordingly, the OLED drive current is equal to the constant current Ic set by the constant current supply 107.

The OLED 104 emits light at a luminance according to the amount of OLED drive current. When the OLED drive current is extremely close to 0 or when the OLED drive current flows in the reverse bias direction, the OLED 104 does not emit light.

After all of the scanning lines G1 to Gy are selected and the above operation is conducted on pixels in every line, the writing period Ta is ended. As the writing period Ta is ended, a display period Td is started.

FIG. 3B is a timing chart of the scanning lines in the display period Td. In the display period Td, none of the scanning lines G1 to Gy are selected.

FIG. 4B is a schematic diagram of a pixel in the display period Td. The transistors Tr4 and Try are turned OFF. The source regions of the transistor Tr1 and of the transistor Tr2 are connected to the power supply line Vi and kept at a given electric potential (power supply electric potential).

In the display period Td, the drain region of the transistor Tr1 is in a so-called floating state in which Tr1 does not receive an electric potential from other wiring lines nor from a power supply. On the other hand, the transistors Tr2 and Tr3 maintain $V_{GS}$ set in the writing period Ta, which means that the drain current $I_2$ of the transistor Tr2 is still kept at Ic and that the transistor Tr3 remains ON. Therefore the OLED drive current set in the writing period Ta is maintained during the display period Td and the OLED 104 emits light at a luminance according to the amount of the OLED drive current.

In the case of a driving method using an analog video signal (analog driving method), the amount of Ic is determined in accordance with an analog video signal and the OLED 104 emits light at a luminance according to the amount of Ic to obtain a gray scale. In this case, one writing period Ta and one display period Td constitute one frame period, and one image is displayed in one frame period.

Figure 5:
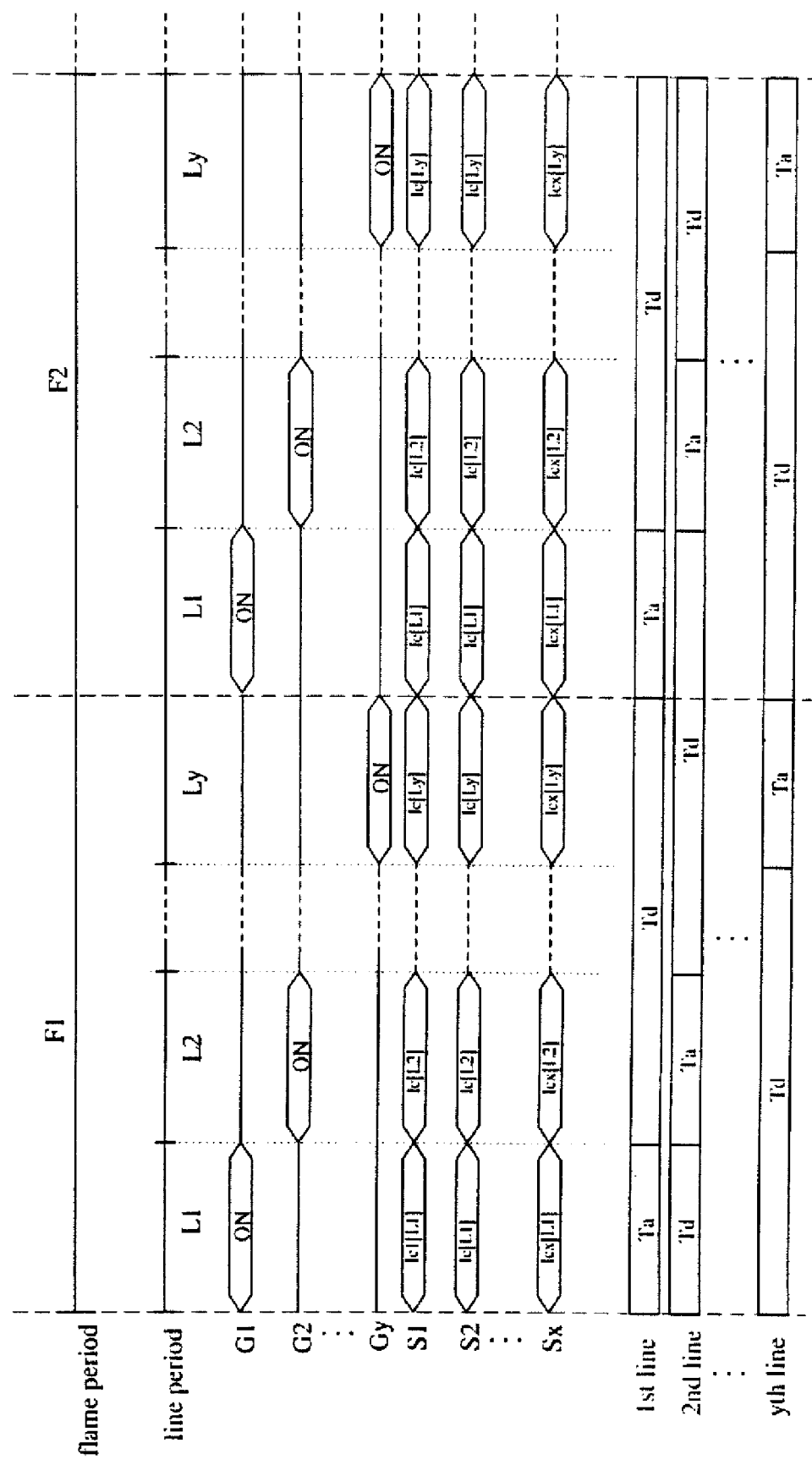
FIG. 5 is a timing chart showing at which points writing periods and display periods are started in an analog driving method.

FIG. 5 is an example of the timing chart in an analog driving method. One frame period has y line periods, and one scanning line is selected in each line period. Constant currents Ic (Ic1 to Icx) flow in signal lines in each line period. In FIG. 5, Ic1[Lj] to Icx[Lj] represent values of signal current flowing in the respective signal lines in a line period Lj (j=1 to y).

Starting points of the writing period Ta and the display period Td vary between different lines and the starting point of a writing period for one line does not coincide with the starting point for another line. When the display period Td is completed for all of the pixels, one image is displayed.

In the case of a time gray scale driving method using a digital video signal (digital driving method), on the other hand, a writing period Ta and a display period Td are repeatedly alternated in one frame period to make it possible to display one image. If an image is displayed using n bit video signals, one frame period has at least n writing periods and n display periods. The n writing periods (Ta1 to Tan) are respectively associated with n bits of the n bit video signals, and so are the n display periods (Td1 to Tdn).

Figure 6:
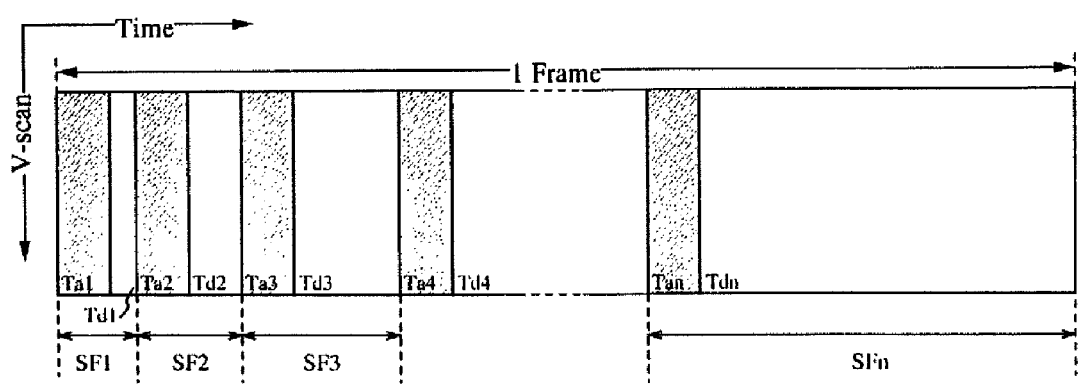
FIG. 6 is a timing chart showing at which points writing periods and display periods are started in a digital driving method.

FIG. 6 shows at which points the n writing periods (Ta1 to Tan) and the n display periods (Td1 to Tdn) are started in one frame period. The axis of abscissa indicates time and the axis of ordinate indicates positions of scanning lines of pixels.

A writing period Tam (m is an arbitrary number ranging from 1 to n) is followed by a display period associated with the same bit number as the writing period Tam, in this case, a display period Tdm. One writing period Ta and one display period Td constitute one sub-frame period SF. A sub-frame period SFm consists of the wiring period Tam and the display period Tdm that are associated with the m-th bit signal.

Lengths of sub-frame periods SF1 to SFn are set so as to satisfy SF1:SF2 : . . . : SFn=$2^0$:$2^1$: . . . : $2^{n-1}$.

A sub-frame period having a long display period may further be divided to improve the quality of an image displayed. Specifics on how such a sub-frame period is divided can be found in Japanese Patent Application No. 2000-267164.

The driving method shown in FIG. 6 obtains gray scale display by controlling the sum of lengths of display periods in one frame period in which a pixel emits light.

With the above structure, the present invention can prevent the luminance of OLED from lowering even when the organic light emitting layer is degraded and therefore can display a clear image. If the light emitting device is to display an image in color using OLEDs of different colors and the rate of degradation of organic light emitting layer varies between the OLEDs of different colors, the present invention is capable of keeping the luminance of light of different colors balanced and display in desired colors.

Furthermore, the present invention can set the OLED drive current to a desired value despite a change in temperature of the organic light emitting layer due to the outside temperature and heat generated from the OLED panel itself. Since the OLED drive current is in proportion to the OLED luminance, the luminance of OLED can be prevented from changing and current consumption accompanying a temperature rise can be avoided. If the light emitting device is to display an image in color, the luminance of the OLEDs of different colors can be prevented from changing to keep the luminance of light of different colors balanced and display in desired colors.

Generally, temperature change brings varying degrees of changes in OLED drive current in accordance with different types of organic light emitting materials and, therefore, in color display, the luminance could be changed by temperature change differently for OLEDs of different colors. However, the light emitting device of the present invention can obtain a desired luminance irrespective of temperature change to thereby keep the luminance of light of different colors balanced. An image thus can be displayed in desired colors.

In a common light emitting device, the electric potential of a wiring line used to supply a current to pixels is slightly lowered as the wiring line becomes longer because of the resistance of the wiring line itself. This electric potential is lowered to widely varying degrees depending on an image to be displayed. When the ratio of higher gray scale pixels to all of the pixels that receive a current from the same wiring line is large, in particular, the current flowing through the wiring lines is increased in amount to make lowering of electric potential noticeable. When the electric potential is lowered, a smaller voltage is applied to the OLED of each pixel to reduce the amount of current supplied to each pixel. Therefore, the amount of current supplied to one given pixel is changed as well as the gray scale number thereof when the gray scale number of other pixels that receive a current from the same wiring line as the one pixel is changed, making it impossible for the one pixel to keep a constant gray scale. In the light emitting device of the present invention, on the other hand, a measured value and a reference value are obtained to correct the OLED current each time a new image is displayed. Therefore a desired gray scale number is obtained for every new image through correction.

Embodiment Mode 2

This embodiment mode describes a structure different from the one in FIG. 2 for the pixels 101 of FIG. 1.

Figure 7:
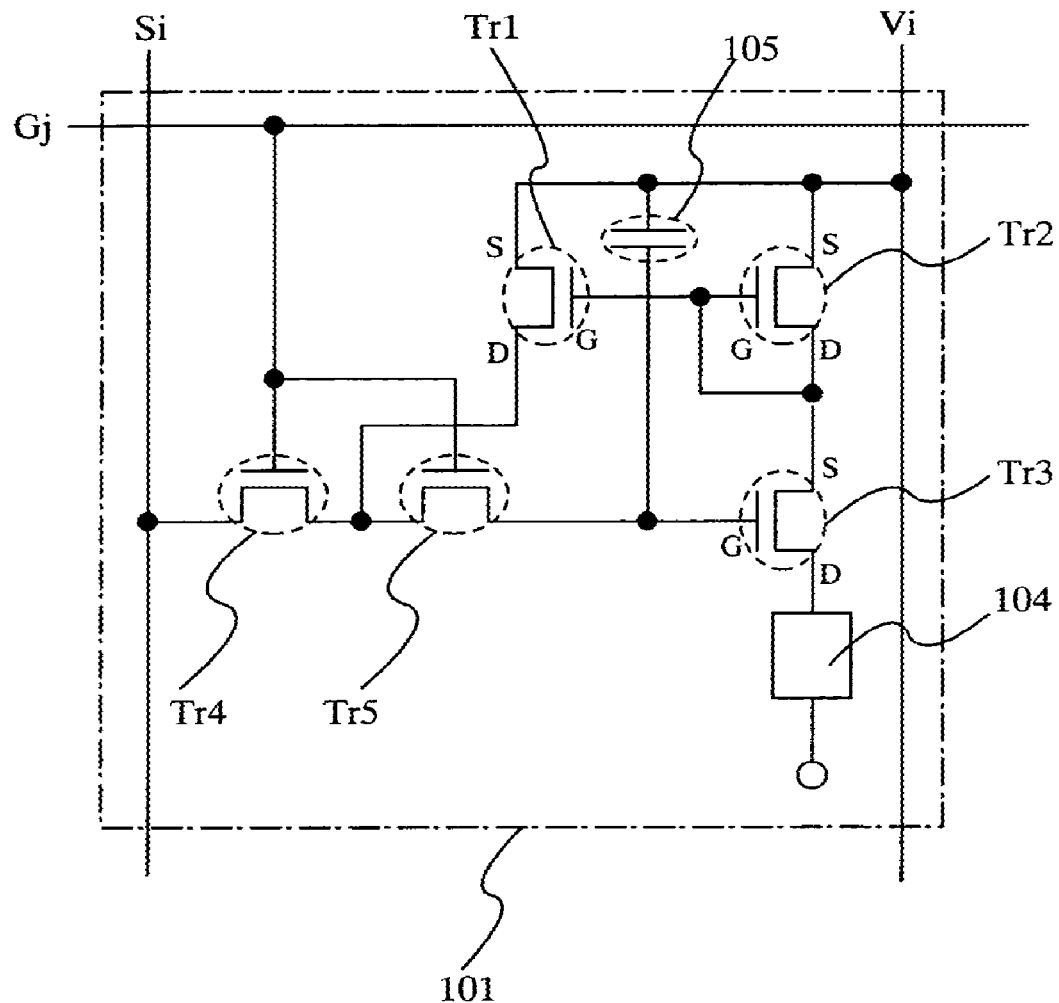
FIG. 7 is a circuit diagram of a pixel in a light emitting device of the present invention.

The pixel structure of this embodiment mode is shown in FIG. 7. A pixel shown in FIG. 7 is one of the pixels 101. The pixel 101 has a signal line Si (one of S1 to Sx), a scanning line Gj (one of G1 to Gy), and a power supply line Vi (one of V1 to Vx).

Each of the pixels 101 has, at least, a transistor Tr1 (a first current controlling transistor or a first transistor), a transistor Tr2 (a second current controlling transistor or a second transistor), a transistor Tr3 (a third current controlling transistor or a third transistor), a transistor Tr4 (a first switching transistor or a fourth transistor), a transistor Try (a second switching transistor or a fifth transistor), an OLED 104, and a storage capacitor 105.

Gate electrodes of the transistor Tr4 and of the transistor Tr5 are connected to the scanning line Gj.

The transistor Tr4 has a source region and a drain region one of which is connected to the signal line Si and the other of which is connected to a drain region of the transistor Tr1. The transistor Tr5 has a source region and a drain region one of which is connected to the drain region of the transistor Tr1 and the other of which is connected to a gate electrode of the transistor Tr3.

Gate electrodes of the transistor Tr1 and of the transistor Tr2 are connected to each other. Source regions of the transistor Tr1 and of the transistor Tr2 are connected to the power supply line Vi.

The gate electrode of the transistor Tr2 is connected to a drain region thereof. The drain region of the transistor Tr2 is connected to a source region of the transistor Tr3.

A drain region of the transistor Tr3 is connected to a pixel electrode of the OLED 104. The electric potential of the power supply line Vi (power supply electric potential) is kept constant. The electric potential of the opposite electrode is also kept constant.

The transistor Tr4 may be an n-channel transistor or a p-channel transistor and the same applies to the transistor Tr5. However, the transistor Tr4 and the transistor Tr5 have to have the same polarity.

The transistor Tr1 may be an n-channel transistor or a p-channel transistor and the same applies to the transistors Tr2 and Tr3. However, the transistors Tr1. Tr2, and Tr3 have to have the same polarity. When the pixel electrode serves as an anode and the opposite electrode serves as a cathode, the transistors Tr1, Tr2, and Tr3 are p-channel transistors. On the other hand, n-channel transistors are used for the transistors Tr1, Tr2, and Tr3 when the opposite electrode serves as an anode and the pixel electrode serves as a cathode.

The storage capacitor 105 is formed between the gate electrode of the transistor Tr3 and the power supply line Vi. The storage capacitor 105 is provided to maintain the gate voltage of the transistor Tr3 more securely but it may not always be necessary.

The transistors Tr1 and Tr2 may have storage capacitor s between their gate electrodes and the power supply line so that the gate voltages of the transistors Tr1 and Tr2 can be maintained more securely.

As in the case of the pixel shown in FIG. 2, the description on operation of a light emitting device that has the pixel of FIG. 7 can be divided into a description for a writing period Ta and a description for a display period Td. The pixel in FIG. 7 operates the same way as the pixel in FIG. 2 in the writing period Ta and the display period Td. Therefore the descriptions given in Embodiment Mode 1 on FIGS. 3A to 4B apply to the pixel in FIG. 7 and will not be repeated here.

Embodiment Mode 3

This embodiment mode describes a structure different from those in FIGS. 2 and 7 for the pixels 101 of FIG. 1.

Figure 8:
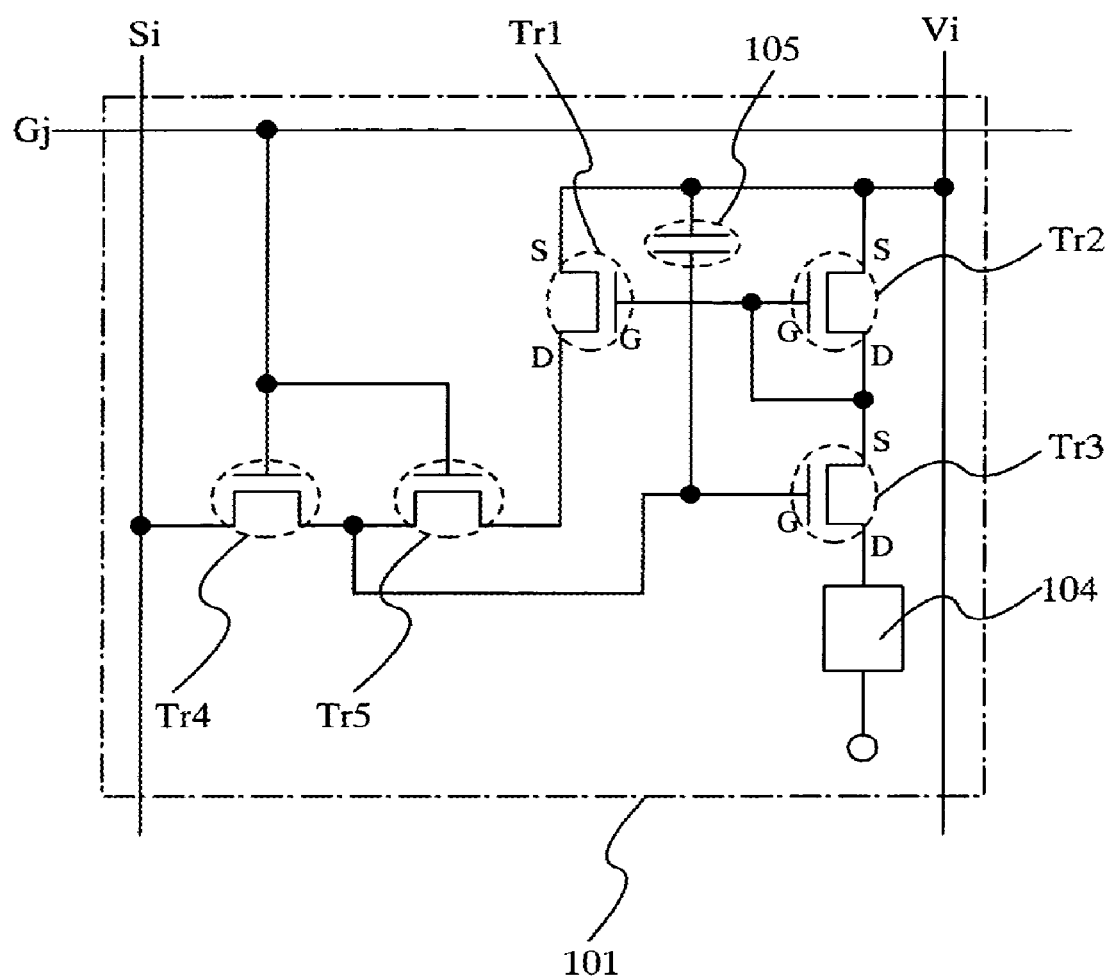
FIG. 8 is a circuit diagram of a pixel in a light emitting device of the present invention.

The pixel structure of this embodiment mode is shown in FIG. 8. A pixel shown in FIG. 8 is one of the pixels 101. The pixel 101 has a signal line Si (one of S1 to Sx), a scanning line Gj (one of G1 to Gy), and a power supply line Vi (one of V1 to Vx).

Each of the pixels 101 has, at least, a transistor Tr1 (a first current controlling transistor or a first transistor), a transistor Tr2 (a second current controlling transistor or a second transistor), a transistor Tr3 (a third current controlling transistor or a third transistor), a transistor Tr4 (a first switching transistor or a fourth transistor), a transistor Tr5 (a second switching transistor or a fifth transistor), an OLED 104, and a storage capacitor 105.

Gate electrodes of the transistor Tr4 and of the transistor Tr5 are connected to the scanning line Gj.

The transistor Tr4 has a source region and a drain region one of which is connected to the signal line Si and the other of which is connected to a gate electrode of the transistor Tr3. The transistor Tr5 has a source region and a drain region one of which is connected to the gate electrode of the transistor Tr3 and the other of which is connected to a drain region of the transistor Tr1.

Gate electrodes of the transistor Tr1 and of the transistor Tr2 are connected to each other. Source regions of the transistor Tr1 and of the transistor Tr2 are connected to the power supply line Vi.

The gate electrode of the transistor Tr2 is connected to a drain region thereof. The drain region of the transistor Tr2 is connected to a source region of the transistor Tr3.

A drain region of the transistor Tr3 is connected to a pixel electrode of the OLED 104. The electric potential of the power supply line Vi (power supply electric potential) is kept constant. The electric potential of the opposite electrode is also kept constant.

The transistor Tr4 may be an n-channel transistor or a p-channel transistor and the same applies to the transistor Try. However, the transistor Tr4 and the transistor Tr5 have to have the same polarity.

The transistor Tr1 may be an n-channel transistor or a p-channel transistor and the same applies to the transistors Tr2 and Tr3. However, the transistors Tr1, Tr2, and Tr3 have to have the same polarity. When the pixel electrode serves as an anode and the opposite electrode serves as a cathode, the transistors Tr1. Tr2, and Tr3 are p-channel transistors. On the other hand, n-channel transistors are used for the transistors Tr1. Tr2, and Tr3 when the opposite electrode serves as an anode and the pixel electrode serves as a cathode.

The storage capacitor 105 is formed between the gate electrode of the transistor Tr3 and the power supply line Vi. The storage capacitor 105 is provided to maintain the voltage between the gate electrode of the transistor Tr3 and the source region thereof (gate voltage) more securely but it may not always be necessary.

The transistors Tr1 and Tr2 may have storage capacitor s between their gate electrodes and the power supply line so that the gate voltages of the transistors Tr1 and Tr2 can be maintained more securely.

As in the case of the pixel shown in FIG. 2, the description on operation of a light emitting device that has the pixel of FIG. 8 can be divided into a description for a writing period Ta and a description for a display period Td. The pixel in FIG. 8 operates the same way as the pixel in FIG. 2 in the writing period Ta and the display period Td. Therefore the descriptions given in Embodiment Mode 1 on FIGS. 3A to 4B apply to the pixel in FIG. 8 and will not be repeated here.

EMBODIMENTS

Embodiments of the present invention are described hereinafter.

Embodiment 1

Next, described with reference to FIGS. 9 to 13 is a method of forming the light emitting device of the present invention. Here, the method of simultaneously forming, on the same substrate, transistors Tr2, Tr3 and Tr5 of the pixel, and transistors of a driving portion provided surrounding the pixel portion is described in detail according to steps. In addition, transistors Tr1 and Tr4 can be manufactured according to the manufacturing method of transistors Tr2, Tr3, and Tr5. The pixels shown in FIGS. 7, 8, 30A, 30B, and 30C can also be manufactured according to the manufacturing method shown in this embodiment.

This embodiment uses a substrate 900 of a glass such as barium borosilicate glass or aluminoborosilicate glass as represented by the glass #7059 or the glass #1737 of Corning Co. There is no limitation on the substrate 900 provided it has a property of transmitting light, and there may be used a quartz substrate. There may be further used a plastic substrate having heat resistance capable of withstanding the treatment temperature of this embodiment.

Referring next to FIG. 9 (A), an underlying film 901 comprising an insulating film such as silicon oxide film, silicon nitride film or silicon oxynitride film is formed on the substrate 900. In this embodiment, the underlying film 901 has a two-layer structure. There, however, may be employed a structure in which a single layer or two or more layers are laminated on the insulating film. The first layer of the underlying film 901 is a silicon oxynitride film 901a formed maintaining a thickness of from 10 to 200 nm (preferably, from 50 to 100 nm) relying upon a plasma CVD method by using $SiH_4$, $NH_3$ and $N_2O$ as reaction gases. In this embodiment, the silicon oxynitride film 901a (having a composition ratio of Si=32%. O=27%, N=24%, H=17%) is formed maintaining a thickness of 50 nm. The second layer of the underlying film 901 is a silicon oxynitride film 901b formed maintaining a thickness of from 50 to 200 nm (preferably, from 100 to 150 nm) relying upon the plasma CVD method by using $SiH_4$ and $N_2O$ as reaction gases. In this embodiment, the silicon oxynitride film 901b (having a composition ratio of Si=32%, O=59%, N=7%, H=2%) is formed maintaining a thickness of 100 nm.

Then, semiconductor layers 902 to 905 are formed on the underlying film 901. The semiconductor layers 902 to 905 are formed by forming a semiconductor film having an amorphous structure by a known means (sputtering method. LPCVD method or plasma CVD method) followed by a known crystallization processing (laser crystallization method, heat crystallization method or heat crystallization method using a catalyst such as nickel), and patterning the crystalline semiconductor film thus obtained into a desired shape. The semiconductor layers 902 to 905 are formed in a thickness of from 25 to 80 nm (preferably, from 30 to 60 nm). Though there is no limitation on the material of the crystalline semiconductor film, there is preferably used silicon or a silicon-germanium ($Si_xGe_{1-x}$ (X=0.0001 to 0.02)) alloy. In this embodiment, the amorphous silicon film is formed maintaining a thickness of 55 nm relying on the plasma CVD method and, then, a solution containing nickel is held on the amorphous silicon film. The amorphous silicon film is dehydrogenated (500° C., one hour), heat-crystallized (550° C. four hours) and is, further, subjected to the laser annealing to improve the crystallization, thereby to form a crystalline silicon film. The crystalline silicon film is patterned by the photolithographic method to form semiconductor layers 902 to 905.

The semiconductor layers 902 to 905 that have been formed may further be doped with trace amounts of an impurity element (boron or phosphorus) to control the threshold value of the TFT.

In forming the crystalline semiconductor film by the laser crystallization method, further, there may be employed an excimer laser of the pulse oscillation type or of the continuously light-emitting type, a YAG laser or a $YVO_4$ laser. When these lasers are to be used, it is desired that a laser beam emitted from a laser oscillator is focused into a line through an optical system so as to fall on the semiconductor film. The conditions for crystallization are suitably selected by a person who carries out the process. When the excimer laser is used, the pulse oscillation frequency is set to be 300 Hz and the laser energy density to be from 100 to 400 $mJ/cm^2$ (typically, from 200 to 300 $mJ/cm^2$). When the YAG laser is used, the pulse oscillation frequency is set to be from 30 to 300 kHz by utilizing the second harmonics and the laser energy density to be from 300 to 600 $mJ/cm^2$ (typically, from 350 to 500 mJ/cm$^2$). The whole surface of the substrate is irradiated with the laser beam focused into a line of a width of 100 to 1000 μm, for example, 400 μm, and the overlapping ratio of the linear beam at this moment is set to be 50 to 90%.

Then, a gate insulating film 906 is formed to cover the semiconductor layers 902 to 905. The gate insulating film 906 is formed of an insulating film containing silicon maintaining a thickness of from 40 to 150 nm by the plasma CVD method or the sputtering method. In this embodiment, the gate insulating film is formed of a silicon oxynitride film (composition ratio of Si=32%, O=59%, N=7%, H=2%) maintaining a thickness of 110 nm by the plasma CVD method. The gate insulating film is not limited to the silicon oxynitride film but may have a structure on which is laminated a single layer or plural layers of an insulating film containing silicon.

When the silicon oxide film is to be formed, TEOS (tetraethyl orthosilicate) and O$_2$ are mixed together by the plasma CVD method, and are reacted together under a reaction pressure of 40 Pa, at a substrate temperature of from 300 to 400° C., at a frequency of 13.56 MHz and a discharge electric power density of from 0.5 to 0.8 W/cm$^2$. The thus formed silicon oxide film is, then, heat annealed at 400 to 500° C. thereby to obtain the gate insulating film having good properties.

Then, a heat resistant conductive layer 907 is formed on the gate insulating film 906 maintaining a thickness of from 200 to 400 nm (preferably, from 250 to 350 nm) to form the gate electrode. The heat-resistant conductive layer 907 may be formed as a single layer or may, as required, be formed in a structure of laminated layers of plural layers such as two layers or three layers. The heat resistant conductive layer contains an element selected from Ta, Ti and W, or contains an alloy of the above element, or an alloy of a combination of the above elements. The heat-resistant conductive layer is formed by the sputtering method or the CVD method, and should contain impurities at a decreased concentration to decrease the resistance and should, particularly, contain oxygen at a concentration of not higher than 30 ppm. In this embodiment, the W film is formed maintaining a thickness of 300 nm. The W film may be formed by the sputtering method by using W as a target, or may be formed by the hot CVD method by using tungsten hexafluoride (Wa). In either case, it is necessary to decrease the resistance so that it can be used as the gate electrode. It is, therefore, desired that the W film has a resistivity of not larger than 20 μΩcm. The resistance of the W film can be decreased by coarsening the crystalline particles. When W contains much impurity elements such as oxygen, the crystallization is impaired and the resistance increases. When the sputtering method is employed, therefore, a W target having a purity of 99.9999% or 99.99% is used, and the W film is formed while giving a sufficient degree of attention so that the impurities will not be infiltrated from the gaseous phase during the formation of the film, to realize the resistivity of from 9 to 20 μΩcm.

On the other hand, the Ta film that is used as the heat-resistant conductive layer 907 can similarly be formed by the sputtering method. The Ta film is formed by using Ar as a sputtering gas. Further, the addition of suitable amounts of Xe and Kr into the gas during the sputtering makes it possible to relax the internal stress of the film that is formed and to prevent the film from being peeled off. The Ta film of α-phase has a resistivity of about 20 μΩcm and can be used as the gate electrode but the Ta film of β-phase has a resistivity of about 180 μΩcm and is not suited for use as the gate electrode. The TaN film has a crystalline structure close to the α-phase. Therefore, if the TaN film is formed under the Ta film, there is easily formed the Ta film of α-phase. Further, though not diagramed, formation of the silicon film doped with phosphorus (P) maintaining a thickness of about 2 to about 20 nm under the heat resistant conductive layer 907 is effective in fabricating the device. This helps improve the intimate adhesion of the conductive film formed thereon, prevent the oxidation, and prevent trace amounts of alkali metal elements contained in the heat resistant conductive layer 907 from being diffused into the gate insulating film 906 of the first shape. In any way, it is desired that the heat-resistant conductive layer 907 has a resistivity over a range of from 10 to 50 μΩcm.

Next, a mask 908 is formed by a resist relying upon the photolithographic technology. Then, a first etching is executed. This embodiment uses an ICP etching device, uses Cl$_2$ and CF$_4$ as etching gases, and forms a plasma with RF (13.56 MHz) electric power of 3.2 W/cm$^2$ under a pressure of 1 Pa. The RF (13.56 MHz) electric power of 224 mW/cm$^2$ is supplied to the side of the substrate (sample stage), too, whereby a substantially negative self bias voltage is applied. Under this condition, the W film is etched at a rate of about 100 nm/min. The first etching treatment is effected by estimating the time by which the W film is just etched relying upon this etching rate, and is conducted for a period of time which is 20% longer than the estimated etching time.

The conductive layers 909 to 913 having a first tapered shape are formed by the first etching treatment. The conductive layers 909 to 913 are tapered at an angle of from 15 to 30°. To execute the etching without leaving residue, over-etching is conducted by increasing the etching time by about 10 to 20%. The selection ratio of the silicon oxynitride film (gate insulating film 906) to the W film is 2 to 4 (typically, 3). Due to the over etching, therefore, the surface where the silicon oxynitride film is exposed is etched by about 20 to about 50 nm (FIG. 9 (B)).

Then, a first doping treatment is effected to add an impurity element of a first type of electric conduction to the semiconductor layer. Here, a step is conducted to add an impurity element for imparting the n-type. A mask 908 forming the conductive layer of a first shape is left, and an impurity element is added by the ion-doping method to impart the n-type in a self-aligned manner with the conductive layers 909 to 913 having a first tapered shape as masks. The dosage is set to be from 1×10$^{13}$ to 5×10$^{14}$ atoms/cm$^2$ so that the impurity element for imparting the n-type reaches the underlying semiconductor layer penetrating through the tapered portion and the gate insulating film 906 at the ends of the gate electrode, and the acceleration voltage is selected to be from 80 to 160 keV. As the impurity element for imparting the n-type, there is used an element belonging to the Group 15 and, typically, phosphorus (P) or arsenic (As). Phosphorus (P) is used, here. Due to the ion-doping method, an impurity element for imparting the n-type is added to the first impurity regions 914 to 917 over a concentration range of from 1×10$^{20}$ to 1×10$^{21}$ atoms/cm$^3$ (FIG. 9 (C)).

In this step, the impurities turn down to the lower side of the conductive layers 909 to 913 of the first shape depending upon the doping conditions, and it often happens that the first impurity regions 914 to 917 are overlapped on the conductive layers 909 to 913 of the first shape.

Next, the second etching treatment is conducted as shown in FIG. 9 (D). The etching treatment, too, is conducted by using the ICP etching device, using a mixed gas of CF$_4$ and Cl$_2$ as an etching gas, using an RF electric power of 3.2 W·cm$^2$ (13.56 MHz), a bias power of 45 mW/cm$^2$ (13.56 MHz) under a pressure of 1.0 Pa. Under this condition, there are formed the conductive layers 918 to 921 of a second shape. The end portions thereof are tapered, and the thickness gradually increases from the ends toward the inside. The rate of isotropic etching increases in proportion to a decrease in the bias electricity applied to the side of the substrate as compared to the first etching treatment, and the angle of the tapered portions becomes 30 to 60°. The mask 908 is etched at the edge by etching to form a mask 923. In the step of FIG. 9 (D), the surface of the gate insulating film 906 is etched by about 40 nm.

Then, the doping is effected with an impurity element for imparting the n-type under the condition of an increased acceleration voltage by decreasing the dosage to be smaller than that of the first doping treatment. For example, the acceleration voltage is set to be from 70 to 120 keV, the dosage is set to be $1\times10^{13}$/cm$^2$ thereby to form first impurity regions 924 to 927 having an increased impurity concentration, and second impurity regions 928 to 931 that are in contact with the first impurity regions 924 to 927. In this step, the impurity may turn down to the lower side of the conductive layers 918 to 921 of the second shape, and the second impurity regions 928 to 931 may be overlapped on the conductive layers 918 to 922 of the second shape. The impurity concentration in the second impurity regions is from $1\times10^{16}$ to $1\times10^{18}$ atoms/cm$^3$: (FIG. 10 (A)).

Referring to FIG. 10 (B), impurity regions 933 (933a. 933b) and 934 (934a, 934b) of the conduction type opposite to the one conduction type are formed in the semiconductor layers 902, 905 that form the p-channel TFTs. In this case, too, an impurity element for imparting the p-type is added using the conductive layers 918, 921 and 922 of the second shape as masks to form impurity regions in a self-aligned manner. At this moment, the semiconductor layers 903 and 904 forming the n-channel TFTs are entirely covered for their surfaces by forming a mask 932 of a resist. Here, the impurity regions 933 and 934 are formed by the ion-doping method by using diborane ($B_2H_6$). The impurity element for imparting the p-type is added to the impurity regions 933 and 934 at a concentration of from $2\times10^{20}$ to $2\times10^{21}$ atoms/cm$^3$.

If closely considered, however, the impurity regions 933, 934 can be divided into two regions containing an impurity element that imparts the n-type. Third impurity regions 933a and 934a contain the impurity element that imparts the n-type at a concentration of from $1\times10^{20}$ to $1\times10^{21}$ atoms/cm$^3$ and fourth impurity regions 933b and 934b contain the impurity element that imparts the n-type at a concentration of from $1\times10^{17}$ to $1\times10^{20}$ atoms/cm$^3$. En the impurity regions 933b and 934b, however, the impurity element for imparting the p-type is contained at a concentration of not smaller than $1\times10^{19}$ atoms/cm$^3$ and in the third impurity regions 933a and 934a, the impurity element for imparting the p-type is contained at a concentration which is 1.5 to 3 times as high as the concentration of the impurity element for imparting the n-type. Therefore, the third impurity regions work as source regions and drain regions of the p-channel TFTs without arousing any problem.

Referring next to FIG. 10 (C), a first interlayer insulating film 937 is formed on the conductive layers 918 to 921 of the second shape and on the gate insulating film 906. The first interlayer insulating film 937 may be formed of a silicon oxide film, a silicon oxynitride film, a silicon nitride film, or a laminated layer film of a combination thereof. In any case, the first interlayer insulating film 937 is formed of an inorganic insulating material. The first interlayer insulating film 937 has a thickness of 100 to 200 nm. When the silicon oxide film is used as the first interlayer insulating film 937. TEOS and $O_2$ are mixed together by the plasma CVD method, and are reacted together under a pressure of 40 Pa at a substrate temperature of 300 to 400° C. while discharging the electric power at a high frequency (13.56 MHz) and at a power density of 0.5 to 0.8 W/cm$^2$. When the silicon oxynitride film is used as the first interlayer insulating film 937, this silicon oxynitride film may be formed from $SiH_4$, $N_2O$ and $NH_3$, or from $SiH_4$ and $N_2O$ by the plasma CVD method. The conditions of formation in this case are a reaction pressure of from 20 to 200 Pa, a substrate temperature of from 300 to 400° C. and a high-frequency (60 MHz) power density of from 0.1 to 1.0 W/cm$^2$. As the first interlayer insulating film 937, further, there may be used a hydrogenated silicon oxynitride film formed by using $SiH_4$, $N_2O$ and $H_2$. The silicon nitride film, too, can similarly be formed by using $SiH_4$ and $NH_3$ by the plasma CVD method.

Then, a step is conducted for activating the impurity elements that impart the n-type and the p-type added at their respective concentrations. This step is conducted by thermal annealing method using an annealing furnace. There can be further employed a laser annealing method or a rapid thermal annealing method (RTA method). The thermal annealing method is conducted in a nitrogen atmosphere containing oxygen at a concentration of not higher than 1 ppm and, preferably, not higher than 0.1 ppm at from 400 to 700° C. and, typically, at from 500 to 600° C. In this embodiment, the heat treatment is conducted at 550° C. for 4 hours. When a plastic substrate having a low heat resistance temperature is used as the substrate 900, it is desired to employ the laser annealing method.

Following the step of activation, the atmospheric gas is changed, and the heat treatment is conducted in an atmosphere containing 3 to 100% of hydrogen at from 300 to 450° C. for from 1 to 12 hours to hydrogenate the semiconductor layer. This step is to terminate the dangling bonds of $10^{16}$ to $10^{18}$/cm$^3$ in the semiconductor layer with hydrogen that is thermally excited. As another means of hydrogenation, the plasma hydrogenation may be executed (using hydrogen excited with plasma). In any way, it is desired that the defect density in the semiconductor layers 902 to 905 be suppressed to be not larger than $10^{16}$/cm$^3$. For this purpose, hydrogen may be added in an amount of from 0.01 to 0.1 atomic %.

Then, a second interlayer insulating film 939 of an organic insulating material is formed maintaining an average thickness of from 1.0 to 2.0 µm. As the organic resin material, there can be used polyimide, acrylic, polyamide, polyimideamide, or BCB (benzocyclobutene). When there is used, for example, a polyimide of the type that is heat polymerized after being applied onto the substrate, the second interlayer insulating film is formed being fired in a clean oven at 300° C. When there is used an acrylic, there is used the one of the two-can type. Namely, the main material and a curing agent are mixed together, applied onto the whole surface of the substrate by using a spinner, pre-heated by using a hot plate at 80° C. for 60 seconds, and are fired at 250° C. for 60 minutes in a clean oven to form the second interlayer insulating film.

Thus, the second interlayer insulating film 939 is formed by using an organic insulating material featuring good and flattened surface. Further, the organic resin material, in general, has a small dielectric constant and lowers the parasitic capacitance. The organic resin material, however, is hygroscopic and is not suited as a protection film. It is, therefore, desired that the second interlayer insulating film is used in combination with the silicon oxide film, silicon oxynitride film or silicon nitride film formed as the first interlayer insulating film 937.

Thereafter, the resist mask of a predetermined pattern is formed, and contact holes are formed in the semiconductor layers to reach the impurity regions serving as source regions or drain regions. The contact holes are formed by dry etching.

In this case, a mixed gas of $CF_4$, $O_2$ and He is used as the etching gas, and the second interlayer insulating film 939 of the organic resin material is etched. Thereafter, $CF_4$ and $O_2$ are used as the etching gas to etch the first interlayer insulating film 937. In order to further enhance the selection ratio relative to the semiconductor layer, $CHF_3$ is used as the etching gas to etch the gate insulating film 906 of the third shape, thereby to form the contact holes.

Here, the conductive metal film is formed by sputtering and vacuum vaporization and is patterned by using a mask and is, then, etched to form connecting wirings 940 to 947. Further, though not diagramed in this embodiment, the wiring is formed by a laminate of a 50 nm thick Ti film and a 500 nm thick alloy film (alloy film of Al and Ti).

Then, a transparent conductive film is formed thereon maintaining a thickness of 80 to 120 nm, and is patterned to form a pixel electrode 948 (FIG. 11 (A)). Therefore, the pixel electrode 948 is formed by using an indium oxide-tin (ITO) film as a transparent electrode or a transparent conductive film obtained by mixing 2 to 20% of a zinc oxide (ZnO) into indium oxide.

Further, the pixel electrode 948 is formed being in contact with, and overlapped on, the connecting wiring 946 that is electrically connected to the drain region of the transistor Tr3.

Figure 11A:
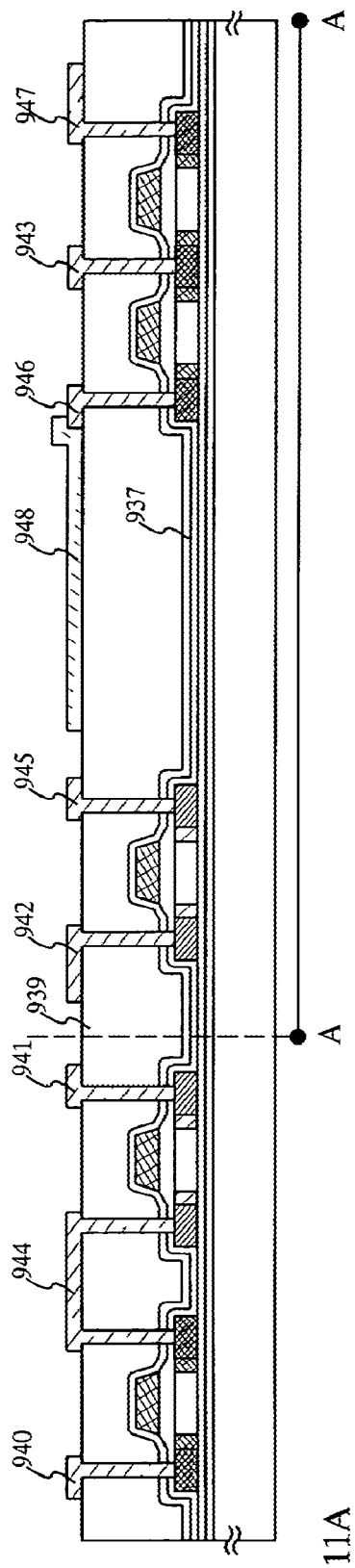
FIGS. 11A and 11B are diagrams showing a method of manufacturing a light emitting device according to the present invention.
Figure 12:
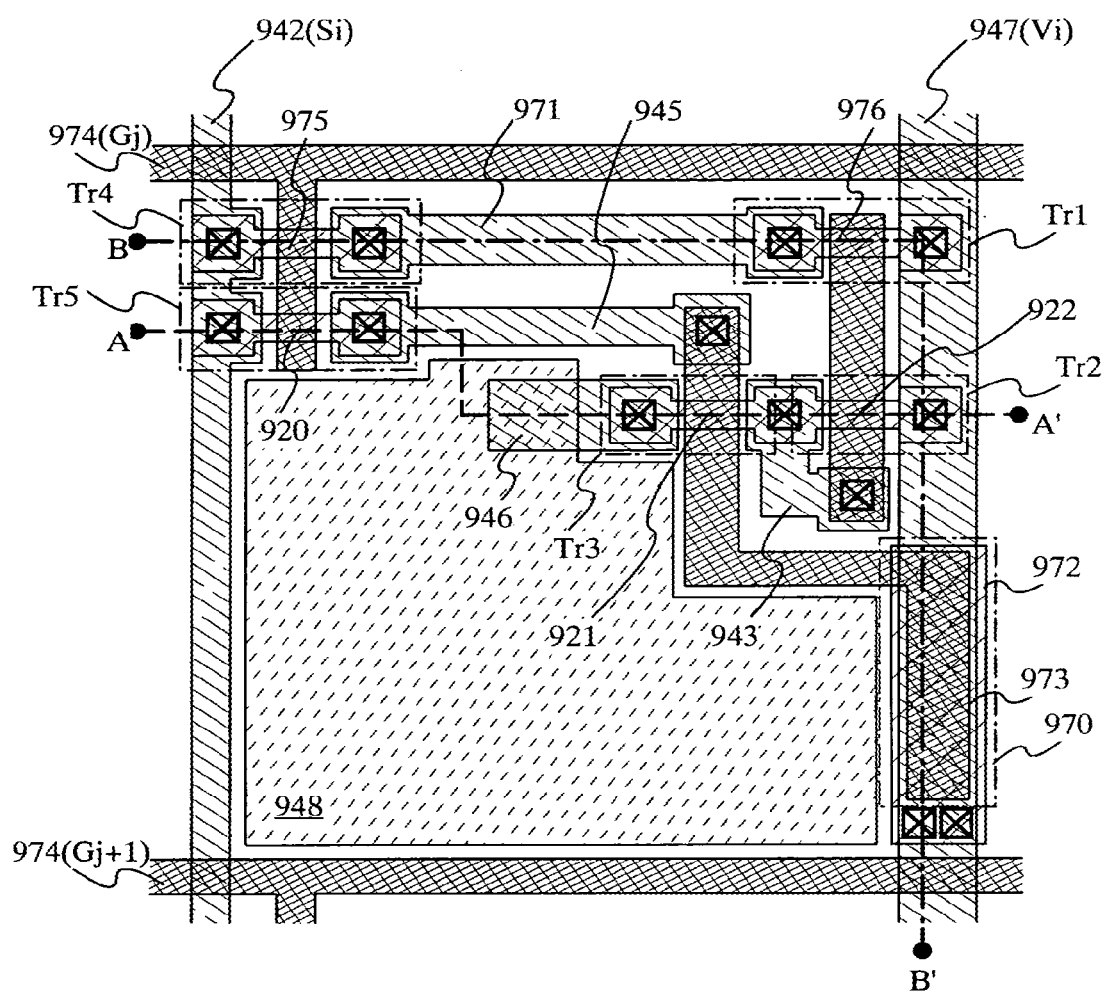
FIG. 12 is a top view of a pixel in a light emitting device of the present invention.

FIG. 12 is a top view of the pixel after the process up through the step of FIG. 11A is finished. The insulating film and the interlayer insulating film are omitted from FIG. 12 in order to show positions of the wiring lines and of the semiconductor layers clearly. A sectional view taken along the line A-A' in FIG. 12 corresponds to the area indicated by A-A' in FIG. 11A.

Figure 13:
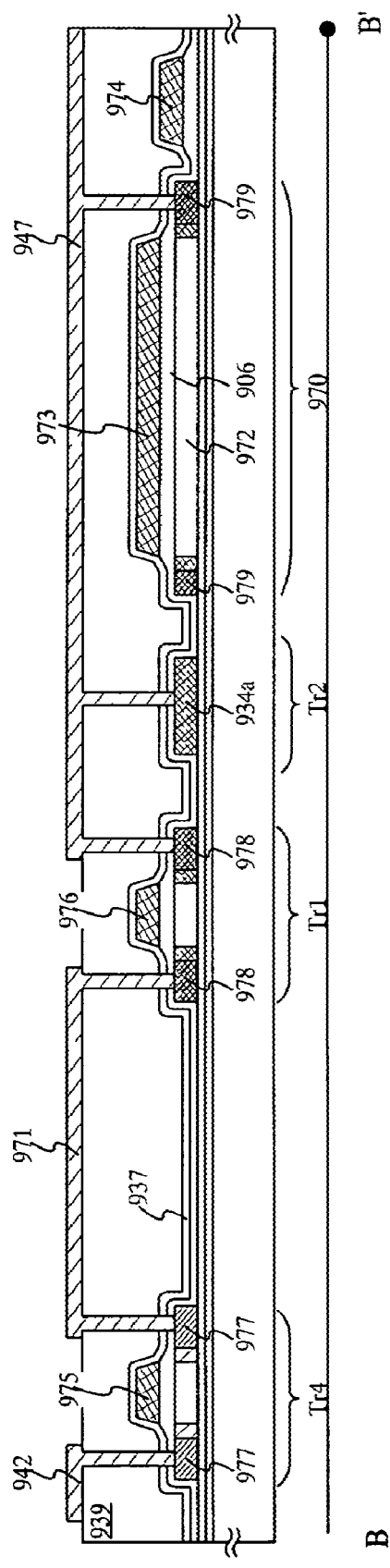
FIG. 13 is a sectional view of a pixel in a light emitting device of the present invention.

FIG. 13 is a sectional view taken along the line B-B' in FIG. 12. The transistor Tr4 has a gate electrode 975 that is a part of a scanning line 974. The gate electrode 975 is connected to a gate electrode 920 of the transistor Tr5. The semiconductor layer of the transistor Tr4 have two impurity regions 977 one of which is connected to the connection wiring line 942 that functions as the signal line Si and the other of which is connected to a connection wiring line 971.

The transistor Tr1 has a gate electrode 976, which is connected to a gate electrode 922 of the transistor Tr2. The semiconductor layer of the transistor Tr1 have two impurity regions 978 one of which is connected to the connection wiring line 971 and the other of which is connected to the connection wiring line 947 that functions as the power supply line Vi.

The connection wiring line 943 is connected to the impurity region 934a common to the transistors Tr2 and Tr3, and is connected to the gate electrode 922 of the transistor Tr2.

Denoted by 970 is a storage capacitor, which has a semiconductor layer 972, the gate insulating film 906, and a capacitance wiring line 973. One of impurity regions 979 in the semiconductor layer 972 is connected to the connection wiring line 947 that functions as a power supply line.

Figure 11B:
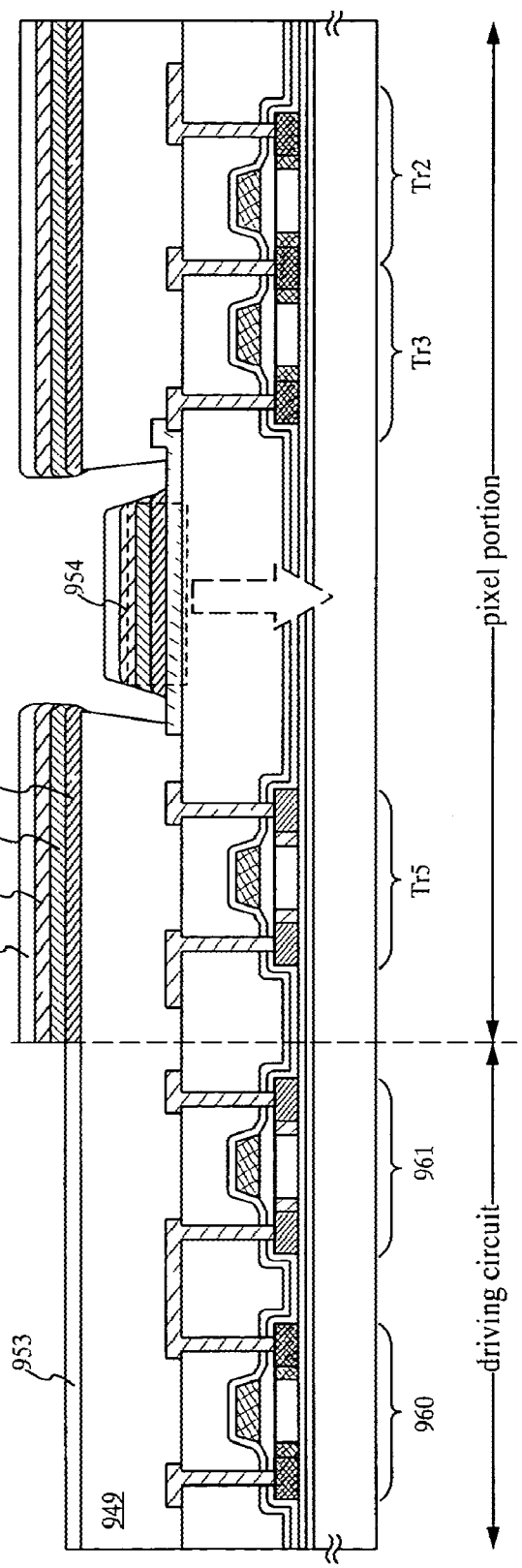

Next, a third interlayer insulating film 949 having opening at a position that coincides with the pixel electrode 948 is formed as shown in FIG. 11B. The third interlayer insulating film 949 is capable of insulating, and functions as a bank to separate organic light emitting layers of adjacent pixels from each other. This embodiment uses a resist to form the third interlayer insulating film 949.

The third interlayer insulating film 949 in this embodiment has a thickness of about 1 μm. The opening has a so-called reverse taper shape whose width increases as the distance from the pixel electrode 948 is closed. The reverse taper shape is obtained by covering the resist film except the portion where the opening is to be formed, irradiating the film with UV light, and then removing the exposed portion with a developer.

By shaping the third interlayer insulating film 949 into a reverse taper shape as in this embodiment, organic light emitting layers of adjacent pixels are separated from each other when forming the organic light emitting layers in a later step. Therefore cracking or peeling of organic light emitting layers can be prevented even when the organic light emitting layers and the third interlayer insulating film 949 have different coefficient of thermal expansion.

Although a resist is used for the third interlayer insulating film in this embodiment, polyimide, polyamide, acrylic, BCB (benzocyclobutene), or silicon oxide to may be used instead in some cases. The third interlayer insulating film 949 may be an organic or inorganic material as long as it is capable of insulating.

An organic light emitting layer 950 is formed next by evaporation. Then a cathode (MgAg electrode) 951 and a protective electrode 952 are formed by evaporation. It is desirable to remove moisture completely from the pixel electrode 948 by subjecting the pixel electrode to heat treatment prior to forming the organic light emitting layer 950 and the cathode 951. This embodiment uses a MgAg electrode as the cathode of the OLED but the cathode may be formed from other known materials.

A known material can be used for the organic light emitting layer 950. In this embodiment, the organic light emitting layer has a two-layer structure consisting of a hole transporting layer and a light emitting layer. The organic light emitting layer may additionally have one or more layers out of a hole injection layer, an electron injection layer, and an electron transporting layer. Various combinations have been reported and the organic light emitting layer of this embodiment can take any of those.

The hole transporting layer of this embodiment is formed by evaporation from polyphenylene vinylene. The light emitting layer of this embodiment is formed by evaporation from polyvinyl carbazole with 30 to 40% of PBD, that is a 1,3,4-oxadiazole derivative, being molecule-dispersed. The light emitting layer is doped with about 1% of Coumarin 6 as green luminescent center.

The protective electrode 952 alone can protect the organic light emitting layer 950 from moisture and oxygen, but it is more desirable to add a protective film 953. This embodiment uses a silicon nitride film with a thickness of 300 nm as the protective film 953. The protective film and the protective electrode 952 may be formed in succession without exposing the device to the air.

The protective electrode 952 also prevents degradation of the cathode 951. A typical material of the protective electrode is a metal film mainly containing aluminum. Other materials may of course be used. Since the organic light emitting layer 950 and the cathode 91 are extremely weak against moisture, the organic light emitting layer, the cathode, and the protective electrode 952 are desirably formed in succession without exposing them to the air. The organic light emitting layer and the cathode are thus protected from the outside air.

The organic light emitting layer 950 is 10 to 400 nm in thickness (typically 60 to 150 nm), and the cathode 951 is 80 to 200 nm in thickness (typically 100 to 150 nm).

Thus completed is a light emitting device structured as shown in FIG. 11B. An area 954 where the pixel electrode 948, the organic light emitting layer 950, and the cathode 951 overlap corresponds to the OLED.

A p-channel TFT 960 and an n-channel TFT 961 are TFTs of the driving circuit and constitute a CMOS circuit. The transistor Tr2 and the transistor Try are TFTs of the pixel portion. The TFTs of the driving circuit and the TFTs of the pixel portion can be formed on the same substrate.

In the case of a light emitting device using an OLED, its driving circuit can be operated by a power supply having a voltage of 5 to 6 V, 10 V, at most. Therefore degradation of TFTs due to hot electron is not a serious problem. Also, smaller gate capacitance is preferred for the TFTs since the driving circuit needs to operate at high speed. Accordingly, in a driving circuit of a light emitting device using an OLED as in this embodiment, the second impurity region 929 and the fourth impurity region 933b of the semiconductor layers of the TFTs preferably do not overlap with the gate electrode 918 and the gate electrode 919, respectively.

The method of manufacturing the light emitting device of the present invention is not limited to the one described in this embodiment. The light emitting device of the present invention can be manufactured by a known method.

Embodiment 2

In this embodiment, a method of manufacturing a light emitting device different from that in Embodiment 1 is described.

Figure 14A:
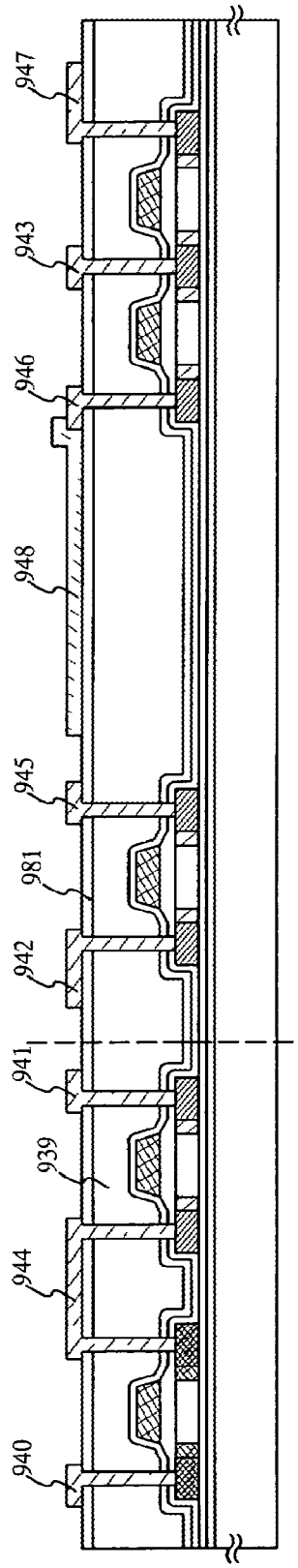
FIGS. 14A and 14B are diagrams showing a method of manufacturing a light emitting device according to the present invention.

The process through the formation of the second interlayer insulating film 939 is the same as in Embodiment 1. As shown in FIG. 14(A), after the second interlayer insulating film 939 is formed, a passivation film 981 is formed to contact the second interlayer insulating film 939.

The passivation film 981 is effective in preventing moisture contained in the second interlayer insulating film 939 from permeating the organic light emitting layer 950 through the pixel electrode 948 or a third interlayer insulating film 982. In the case where the second interlayer insulating film 939 includes an organic resin material, it is particularly effective to provide the passivation film 981 since the organic resin material contains a large amount of moisture.

In this embodiment, a silicon nitride film is used as the passivation film 981.

Thereafter, a resist mask having a predetermined pattern is formed, and contact holes reaching impurity regions, which are source regions or drain regions, are formed in the respective semiconductor layers. The contact holes are formed by a dry etching method. In this case, the passivation film 981 is first etched by using a gas mixture of the $CF_4$ and $O_2$ as an etching gas, and then second interlayer insulating film 939 comprised of the organic resin material is etched by using a gas mixture of $CF_4$, $O_2$ and He as an etching gas. Subsequently, the first interlayer insulating film 937 is etched with $CF_4$ and $O_2$ as an etching gas. Further, in order to raise a selection ratio with the semiconductor layer, the etching gas is changed to CHF: to etch the third shape gate insulating film 906, whereby the contact holes can be formed.

Then, a conductive metal film is formed by a sputtering method or a vacuum evaporation method, patterning is performed with a mask, and thereafter, etching is performed. Thus, the connecting wirings 940 to 947 are formed. Although not shown, the wirings are formed of a lamination film of a Ti film with a thickness of 50 nm and an alloy film with a thickness of 500 nm (alloy film of Al and Ti) in this embodiment.

Subsequently, a transparent conductive film is formed thereon with a thickness of 80 to 120 nm, and the pixel electrode 948 is formed by patterning (FIG. 14 (A)). Note that an indium-tin oxide (ITO) film or a transparent conductive film in which indium oxide is mixed with 2 to 20% of zinc oxide (ZnO) is used for a transparent electrode in this embodiment.

Further, the pixel electrode 948 is formed so as to contact and overlap the connecting wiring 946. Thus, electrical connection between the pixel electrode 948 and the drain region of the transistor Tr2 is formed.

Figure 14B:
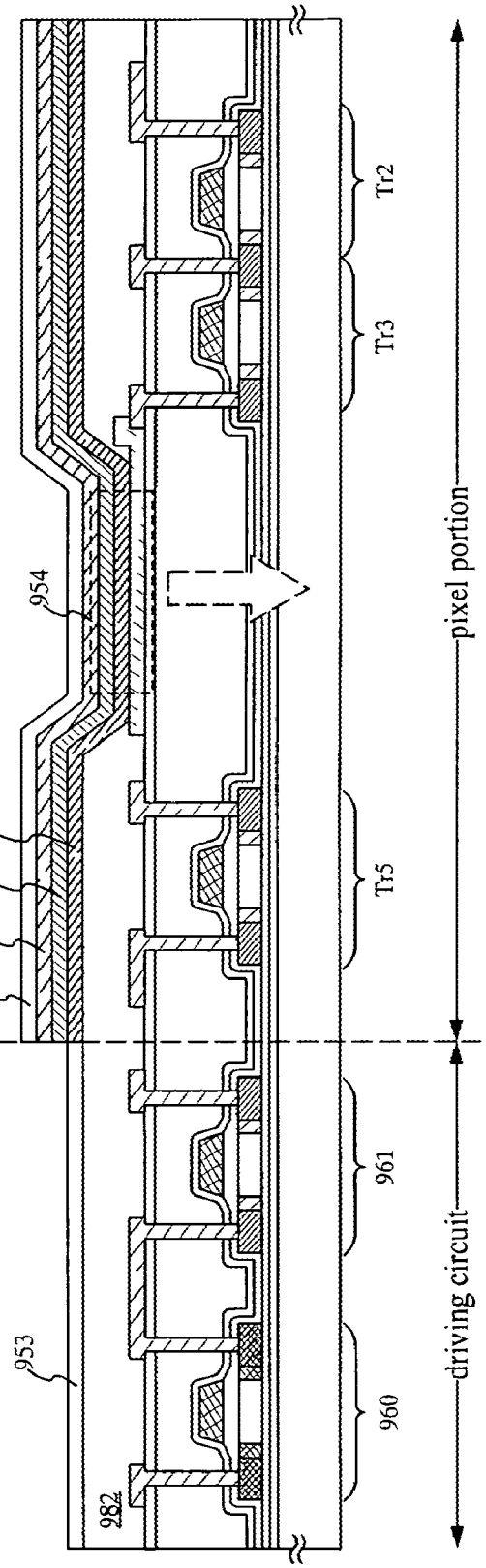

Next, as shown in FIG. 14 (B), the third interlayer insulating film 982 having an opening portion at the position corresponding to the pixel electrode 948 is formed. In this embodiment, side walls having a tapered shape are formed by using a wet etching method in forming the opening portion. Differently from the case shown in Embodiment 1, the organic light emitting layer formed on the third interlayer insulating film 982 is not separated. Thus, the deterioration of the organic light emitting layer which derives from a step becomes a conspicuous problem if the side walls of the opening portion are not sufficiently gentle, which requires attention.

Note that although a film made of silicon oxide is used as the third interlayer insulating film 982 in this embodiment, an organic resin film such as polyimide, polyamide, acrylic or BCB (benzocyclobutene) may also be used depending on circumstances.

Then, it is preferable that, before the organic light emitting layer 950 is formed on the third interlayer insulating film 982, plasma processing using argon is conducted to the surface of the third interlayer insulating film 982 to make close the surface of the third interlayer insulating film 982. With the above structure, it is possible to prevent moisture from permeating the organic light emitting layer 950 from the third interlayer insulating film 982.

Next, the organic light emitting layer 950 is formed by an evaporation method, and further, the cathode (MgAg electrode) 951 and the protecting electrode 952 are formed by the evaporation method. At this time, it is desirable that heat treatment is conducted to the pixel electrode 948 to completely remove moisture prior to the formation of the organic light emitting layer 950 and the cathode 951. Note that, the MgAg electrode is used as the cathode of the OLED in this embodiment, but other known materials may also be used.

Note that a known material can be used for the organic light emitting layer 950. In this embodiment, the organic light emitting layer takes a two-layer structure constituted of a hole transporting layer and a light emitting layer. However, there may be a case where any one of a hole injecting layer, an electron injecting layer and an electron transporting layer is included in the organic light emitting layer. Various examples of combinations have been reported as described above, and any structure among those may be used.

In this embodiment, polyphenylene vinylene is formed by the evaporation method to for forming the hole transporting layer. Further, polyvinylcarbazole dispersed with PBD of 1,3,4-oxadiazole derivative with 30 to 40% molecules is formed by the evaporation method for forming the light emitting layer, and about 1% of coumarin 6 is added thereto as the emission center of green color.

Further, it is possible to protect the organic light emitting layer 950 from moisture and oxygen in the protecting electrode 952, but the protective film 953 may be, more preferably, provided. In this embodiment, a silicon nitride film with a thickness of 300 nm is provided as the protective film 953. This protective film may be continuously formed without exposure to an atmosphere after the formation of the protecting electrode 952.

Moreover, the protecting electrode 952 is provided for preventing deterioration of the cathode 951 and is typified by a metal film containing aluminum as its main constituent. Of course, other materials may also be used. Further, since the organic light emitting layer 950 and the cathode 951 are extremely easily affected by moisture, it is desirable that the formation is continuously performed through the formation of the protecting electrode 952 without exposure to an atmosphere to thereby protect the organic light emitting layer against an outer atmosphere.

Note that the thickness of the organic light emitting layer 950 may be 10 to 400 nm (typically, 60 to 150 nm) and the thickness of the cathode 951 may be 80 to 200 nm (typically, 100 to 150 nm).

Thus, the light emitting device with the structure as shown in FIG. 14 (B) is completed. Note that the portion 954, where the pixel electrode 948, the organic light emitting layer 950 and the cathode 951 are overlapped one another, corresponds to the OLED.

The p-channel TFT 960 and the n-channel TFT 961 are the TFTs of the driver circuit, and form a CMOS. The transistor Tr2, Tr3 and Tr5 are the TFTs of the pixel portion. The TFTs of the driver circuit and the TFTs of the pixel portion can be formed on the same substrate.

The method of manufacturing the light emitting device of the present invention is not limited to the manufacturing method described in this embodiment. The light emitting device of the present invention can be manufactured by using a known method.

Embodiment 3

Figure 15:
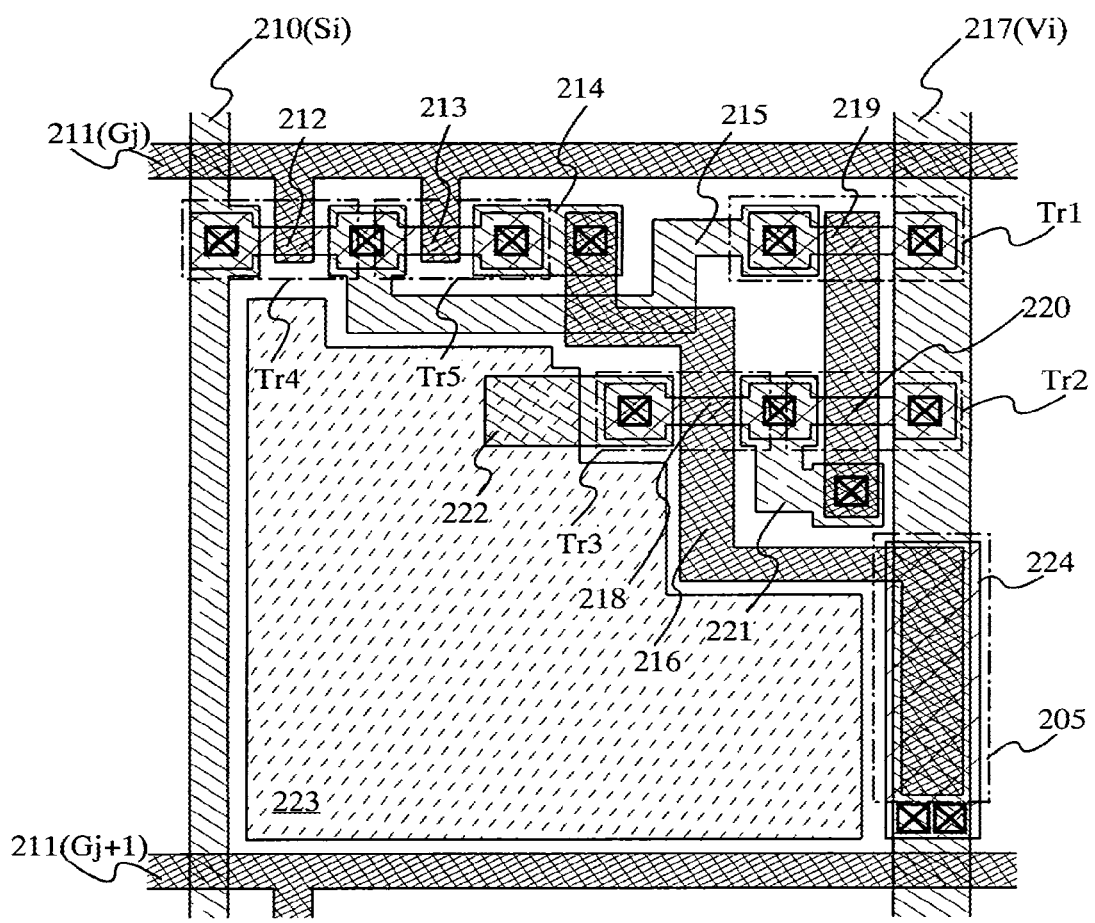
FIG. 15 is a top view of a pixel in a light emitting device of the present invention.

This embodiment gives a description on the top view of the pixel shown in FIG. 7. FIG. 15 shows a top view of a pixel of this embodiment. Insulating films such as a insulating gate film and an interlayer insulating film are omitted from FIG. 15 in order to show positions of wiring lines and of semiconductor layers clearly. In FIG. 15, wiring lines formed on the same layer are similarly hatched. The top view in FIG. 15 is of the pixel after a pixel electrode is formed and before an organic light emitting layer is formed.

The pixel shown in FIG. 15 has one scanning line 211, one signal line 210, and one power supply line 217. Portions of the scanning line 211 are denoted by 212 and 213 and respectively serve as gate electrodes of transistors Tr4 and Tr5.

The transistor Tr4 has a source region and a drain region one of which is connected to the signal line 210 and the other of which is connected to a drain region of a transistor Tr1 through a connection wiring line 215. The transistor Tr5 has a source region and a drain region one of which is connected to the drain region of the transistor Tr1 through the connection wiring line 215 and the other of which is connected to a capacitance wiring line 216 through a connection wiring line 214.

A gate electrode 219 of the transistor Tr1 and a gate electrode 22() of a transistor Tr2 are connected to each other. The gate electrodes 219 and 220 of the transistors Tr1 and Tr2 are connected to a drain region of the transistor Tr2 through a connection wiring line 221.

A source region of the transistor Tr1 is connected to the power supply line 217. A source region of the transistor Tr2 is connected to the power supply line 217.

A portion of the capacitance wiring line 216 is denoted by 218 and serves as a gate electrode of a transistor Tr3. The transistor Tr3 has a source region and a drain region one of which is connected to the drain region of the transistor Tr2 and the other of which is connected to a pixel electrode 223 through a connection wiring line 222.

Denoted by 224 is an active layer for forming a storage capacitor. Above the active layer 224 for forming, a storage capacitor, the capacitance wiring line 216 is formed with a gate insulating film (not shown in the drawing) interposed therebetween. An area where the capacitance wiring line 216 overlaps the gate insulating film and the active layer 224 for forming a storage capacitor corresponds to a storage capacitor 205. Above the capacitance wiring line 216, the power supply line 217 is formed with an interlayer insulating film (not shown) interposed therebetween. Alternatively, a capacitor formed in an area where the capacitance wiring line 216, the interlayer insulating film, and the power supply line 217 overlap may be used as the storage capacitor 205.

Partitioning walls (banks) for separating pixels from one another are formed on the power supply line 217. This makes it possible to obtain a storage capacitor and a power supply line without reducing the aperture ratio.

The top view of the pixel in this embodiment merely shows an example of the structure of the present invention, and this embodiment does not limit the top view structure of the pixel shown in FIG. 7. This embodiment may be combined freely with Embodiment 1 or 2.

Embodiment 4

Figure 16:
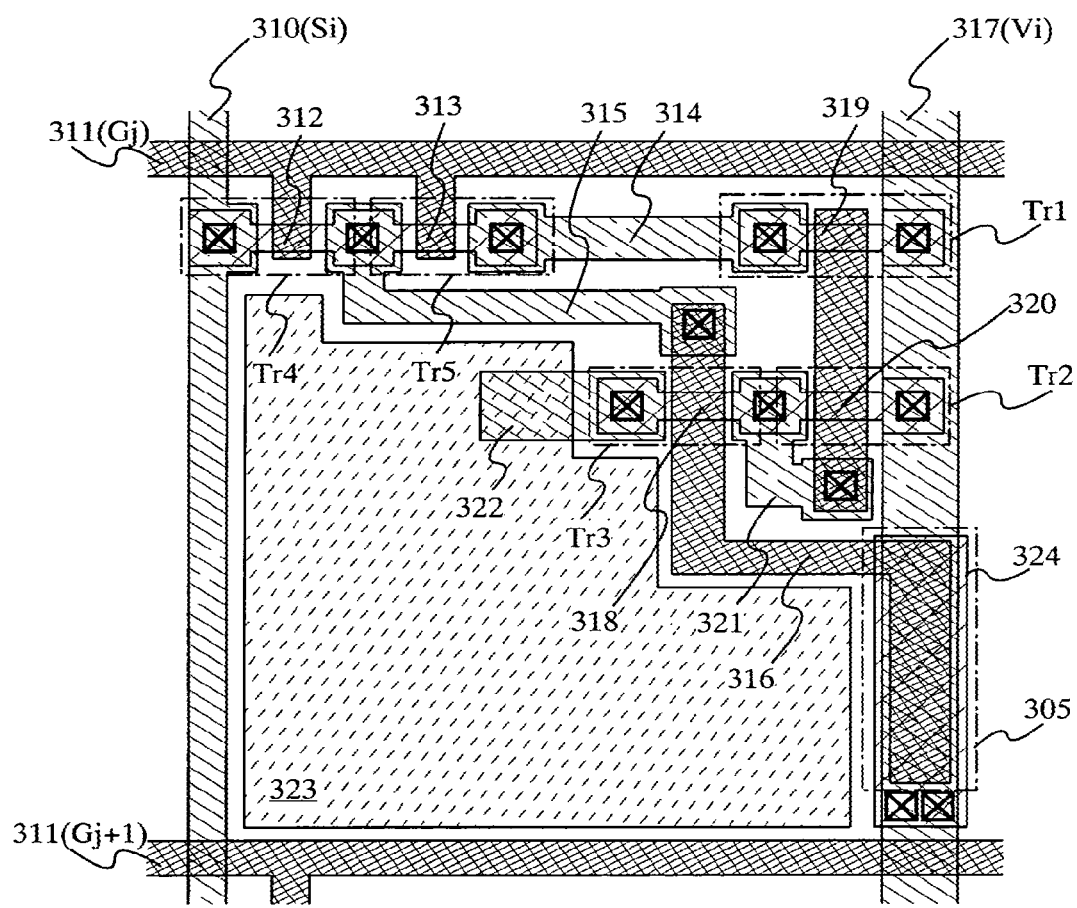
FIG. 16 is a top view of a pixel in a light emitting device of the present invention.

This embodiment gives a description on the top view of the pixel shown in FIG. 8. FIG. 16 shows a top view of a pixel of this embodiment. Insulating films such as an insulating film and an interlayer insulating film are omitted from FIG. 16 in order to show positions of wiring lines and of semiconductor layers clearly. In FIG. 16, wiring lines formed on the same layer are similarly hatched. The top view in FIG. 16 is of the pixel after a pixel electrode is formed and before an organic light emitting layer is formed.

The pixel shown in FIG. 16 has one scanning line 311, one signal line 310, and one power supply line 317. Portions of the scanning line 311 are denoted by 312 and 313 and respectively serve as gate electrodes of transistors Tr4 and Tr5.

The transistor Tr4 has a source region and a drain region one of which is connected to the signal line 310 and the other of which is connected to a capacitance wiring line 316 through a connection wiring line 315. The transistor Tr5 has a source region and a drain region one of which is connected to a drain region of the transistor Tr1 through a connection wiring line 314 and the other of which is connected to the capacitance wiring line 316 through the connection wiring line 315.

A gate electrode 319 of the transistor Tr1 and a gate electrode 320 of a transistor Tr2 are connected to each other. The gate electrodes 319 and 320 of the transistors Tr1 and Tr2 are connected to a drain region of the transistor Tr2 through a connection wiring line 321.

A source region of the transistor Tr1 is connected to the power supply line 317. A source region of the transistor Tr2 is connected to the power supply line 317.

A portion of the capacitance wiring line 316 is denoted by 318 and serves as a gate electrode of a transistor Tr3. The transistor Tr3 has a source region and a drain region one of which is connected to the drain region of the transistor Tr2 and the other of which is connected to a pixel electrode 323 through a connection wiring line 322.

Denoted by 324 is an active layer for forming a storage capacitor. Above the active layer 324 for forming a storage capacitor, the capacitance wiring line 316 is formed with a gate insulating film (not shown in the drawing) interposed therebetween. An area where the capacitance wiring line 316 overlaps the gate insulating film and the active layer 324 for forming a storage capacitor corresponds to a storage capacitor 305. Above the capacitance wiring line 316, the power supply line 317 is formed with an interlayer insulating film (not shown) interposed therebetween. Alternatively, a capacitor formed in an area where the capacitance wiring line 316, the interlayer insulating film, and the power supply line 317 overlap may be used as the storage capacitor 305.

The top view of the pixel in this embodiment merely shows an example of the structure of the present invention, and this embodiment does not limit the top view structure of the pixel shown in FIG. 8. This embodiment may be combined freely with Embodiment 1 or 2.

Embodiment 5

This embodiment describes a light emitting device having a structure different from the one in Embodiment 1.

Figure 27:
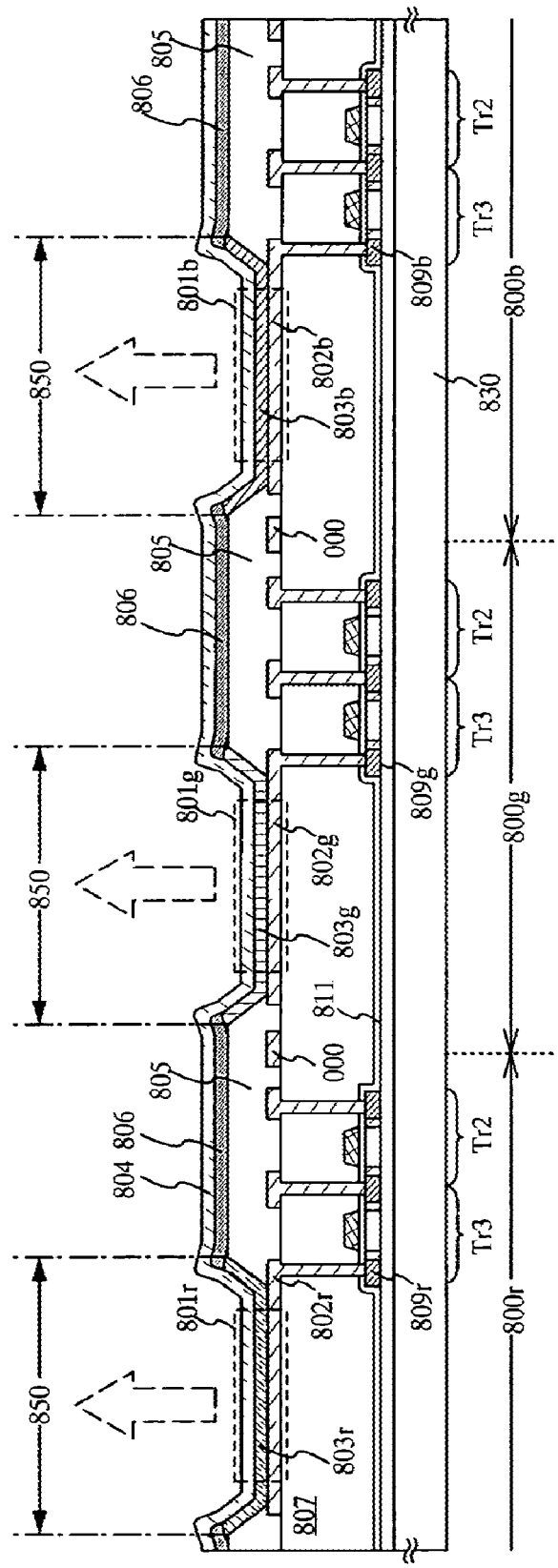
FIG. 27 is a sectional view of a pixel in a light emitting device of the present invention.

FIG. 27 is a sectional view of a pixel portion in the light emitting device of this embodiment. The light emitting device shown in FIG. 27 has a red color pixel (R pixel) 800r, a green color pixel (G pixel) 800g, and a blue color pixel (B pixel) 800b. The structure of this embodiment is applicable to a light emitting device for displaying a monochromatic image as well as a light emitting device for color display.

Each of the pixels has transistors Tr2 and Tr3 formed on a substrate 830. In a light emitting device of the present invention, each pixel has at least transistors Tr1. Tr2. Tr3, Tr4, and Try. However, the transistor Tr2 and Tr3 are shown in FIG. 27.

Pixel electrodes 802r, 802g, and 802b (pixel electrodes 802) are connected, through contact holes formed in a gate insulating film 811 and an interlayer insulating film 807, to drain regions 809r, 809g, and 809b of the third transistors Tr3, respectively.

The pixel electrodes are cathodes in this embodiment and do not transmit light. MgAg electrodes are used as the cathodes of the OLEDs in this embodiment but other known materials may be used instead.

Then an interlayer insulating film 805 having an opening 850 is formed to cover the pixel electrodes 802r, 802g, and 802b and the interlayer insulating film 807. The opening 850 are positioned so as to overlap the pixel electrodes 802r, 802g, and 802b. Although a silicon oxide film is used as the interlayer insulating film 805 in this embodiment, organic resin films formed from polyimide, polyamide, acrylic, or BCB (benzocyclobutene) may be used in some cases.

Organic light emitting layers 803r, 803g, and 803b (organic light emitting layers 803) are formed in the opening of the interlayer insulating film 805 so as to come into contact with the pixel electrodes 802r, 802g, and 802b, respectively. The organic light emitting layers 803r, 803g, and 803b are separately formed by evaporation using a metal mask in the order in accordance with each color. During evaporation, materials of the organic light emitting layers 803r, 803g, and 803b may overflow or run from the opening. So try to contain the organic light emitting layers in the opening of the third interlayer insulating film 805.

Next, metal-containing conductive layers 806 are formed by evaporation on the interlayer insulating film 805 except the opening. The material of the conductive layers 806 is desirably a low resistant metal. The conductive layers 806 may be a laminate of plural conductive layers. The material used for the conductive layers 806 is copper in this embodiment but it is not limited thereto. Any known metal material can be used as long as it has a resistance lower than that of the material of opposite electrodes. The conductive layers 806 help to reduce the resistance of the opposite electrodes to be formed later and, therefore, this embodiment is suitable for a large-sized substrate.

Opposite electrodes 804 are formed next of a transparent conductive film to cover the organic light emitting layers 803r, 803g, and 803b and the conductive layers 806. The transparent conductive film used in this embodiment is an ITO film. The ITO film can be formed by evaporation. This embodiment describes particularly the case of using ion plating to form the ITO film.

Ion plating is one of vapor surface treatment techniques classified as evaporation. In ion plating, an evaporation material evaporated in one way or other is ionized or excited by high frequency plasma or vacuum electric discharge. The resultant ions are accelerated by giving a negative electric potential to the substrate to which the material is to be deposited, so that the ions are adhered to the substrate.

Specific conditions for forming the opposite electrodes by ion plating include setting the pressure at 0.01 to 1 Pa in an inert gas atmosphere and keeping the substrate temperature at 100 to 300° C. during evaporation. Desirably, ITO as an evaporation source has a sintered density of 70% or higher. The optimal conditions for ion plating can be set suitably by an operator.

When an evaporation material is ionized or excited by high frequency plasma, the ionization rate or excitation rate of the evaporation material is enhanced and, since the ionized or excited evaporation material is in a high energy state, the ions are fully coupled with oxygen while keeping the evaporation rate high. Accordingly, a quality film can be obtained quickly.

The opposite electrodes 804 in this embodiment are formed from a transparent conductive film by the ion plating described above to a thickness of 80 to 120 nm. In this embodiment, the transparent electrodes are formed from an indium tin oxide (ITO) film or a transparent conductive film obtained by mixing 2 to 20% of zinc oxide (ZnO) with indium oxide.

The method of forming the opposite electrodes of this embodiment is not limited to the ion plating described above. However, an ITO film formed by ion plating adheres well and has high crystallinity at a relatively low temperature, reducing the resistance thereof. Furthermore, ion plating can form a uniform film over a relatively large area and therefore is suitable for a large-sized substrate.

An R OLED 801r, a G OLED 801g, and a B OLED 801b are thus completed in each pixel. The OLEDs respectively have the pixel electrodes 802r, 802g, and 802b, the organic light emitting layers 803r, 803g, and 803b, and the opposite electrodes 804.

Figure 28:
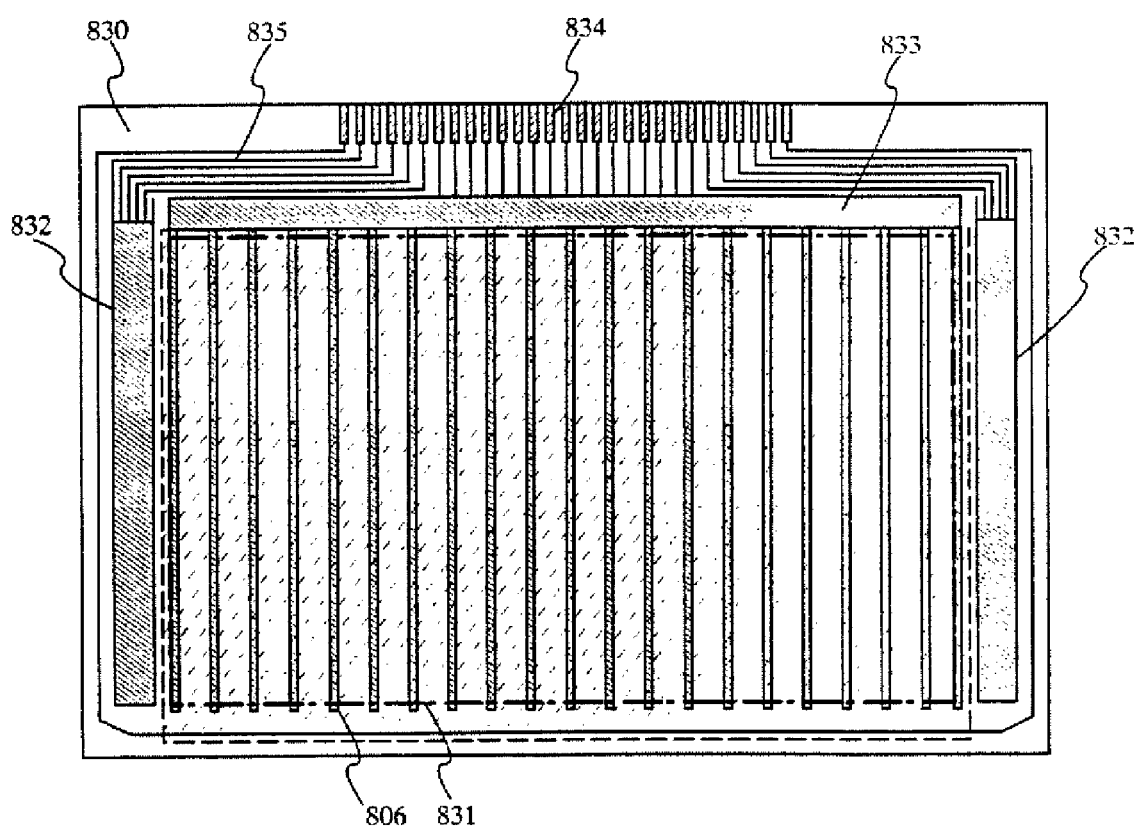
FIG. 28 is a top view of an element substrate in a light emitting device of the present invention.

FIG. 28 is a top view of a substrate (element substrate) on which the transistors of this embodiment are formed. In FIG. 28, a pixel portion 831, a scanning line driving circuit 832, a signal line driving circuit 833, and a terminal 834 are formed on a substrate 830. The driving circuits as well as power supply lines and opposite electrodes formed in the pixel portion are connected to the terminal 834 through lead-out wiring lines 835.

If necessary, an IC chip on which a CPU, a memory and the like are formed may be mounted to the element substrate by COG (chip on glass).

Figure 29:
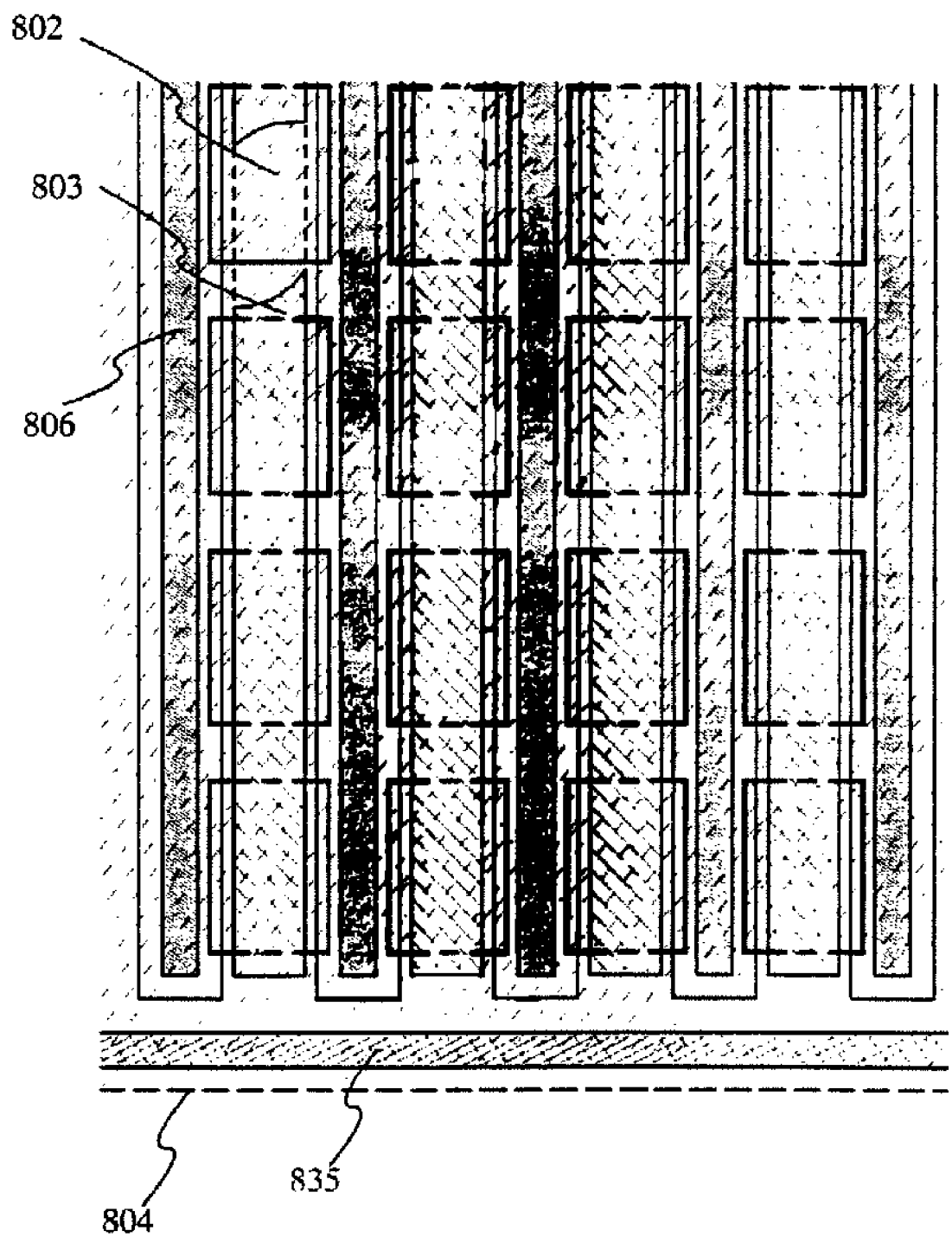
FIG. 29 is an enlarged view of an element substrate in a light emitting device of the present invention.

The OLEDs are formed between the conductive layers 806 and the structure thereof is shown in FIG. 29. The pixel electrodes 802 are electrodes of the pixels and formed between the conductive layers 806. In the layer above the pixel electrodes, the organic compound layers 803 are formed between the conductive layers 806. The organic compound layers 803 successively form a stripe pattern over the plural pixel electrodes 802.

The opposite electrodes 804 are formed in the layer above the organic compound layers 803 and the conductive layers 806 to come into contact with the conductive layers 806.

The lead-out wiring lines 835 are formed in the same layer as scanning lines (not shown) and are not in direct contact with the conductive layers 806. The contact is formed between the lead-out wiring lines 835 and the opposite electrodes 804 at points where they overlap.

This embodiment may be combined freely with Embodiment 3 or 4.

Embodiment 6

This embodiment describes structures of driving circuits (a signal line driving circuit and a scanning line driving circuit) in a light emitting device of the present invention which is driven by a digital driving method.

Figure 17:
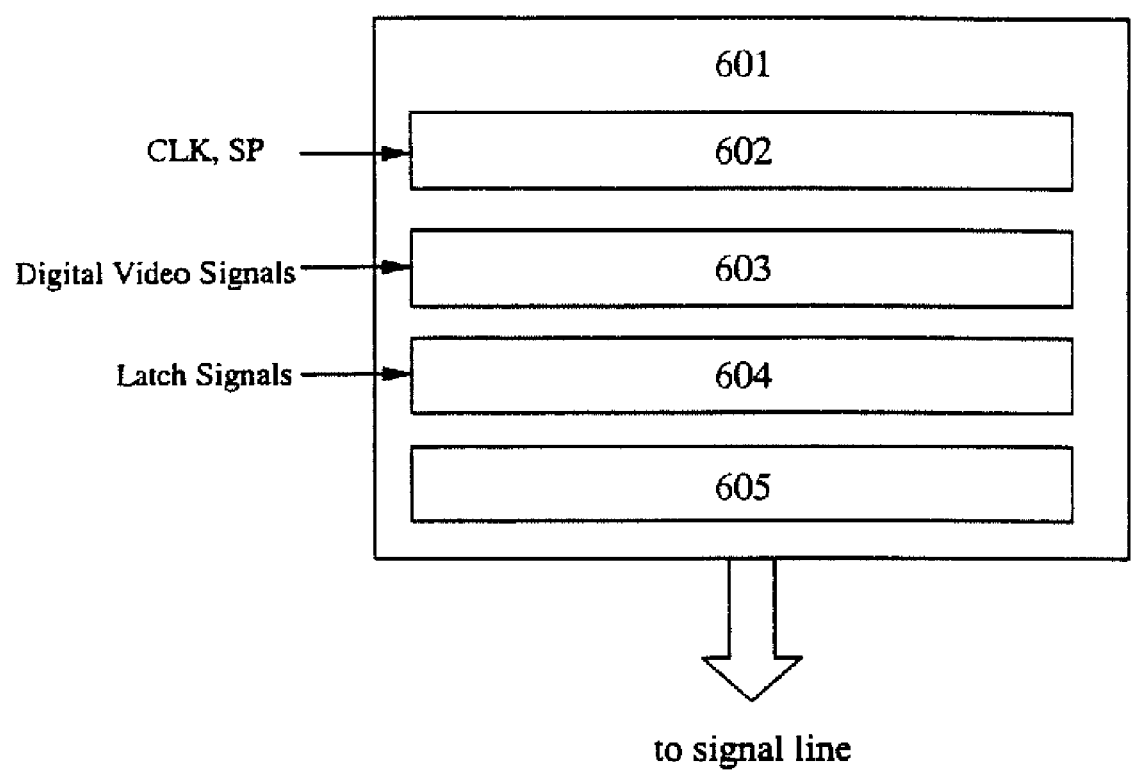
FIG. 17 is a block diagram of a signal line driving circuit.

FIG. 17 is a block diagram showing the structure of a signal line driving circuit 601. Reference symbol 602 denotes a shift register, 603, a memory circuit A, 604, a memory circuit B, and 605, a constant current circuit.

Clock signals CLK and start pulse signals SP are inputted to the shift register 602. Digital video signals are inputted to the memory circuit A 603 and latch signals are inputted to the memory circuit B 604. The constant current circuit 605 outputs a constant signal current Ic, which is inputted to signal lines.

Figure 18:
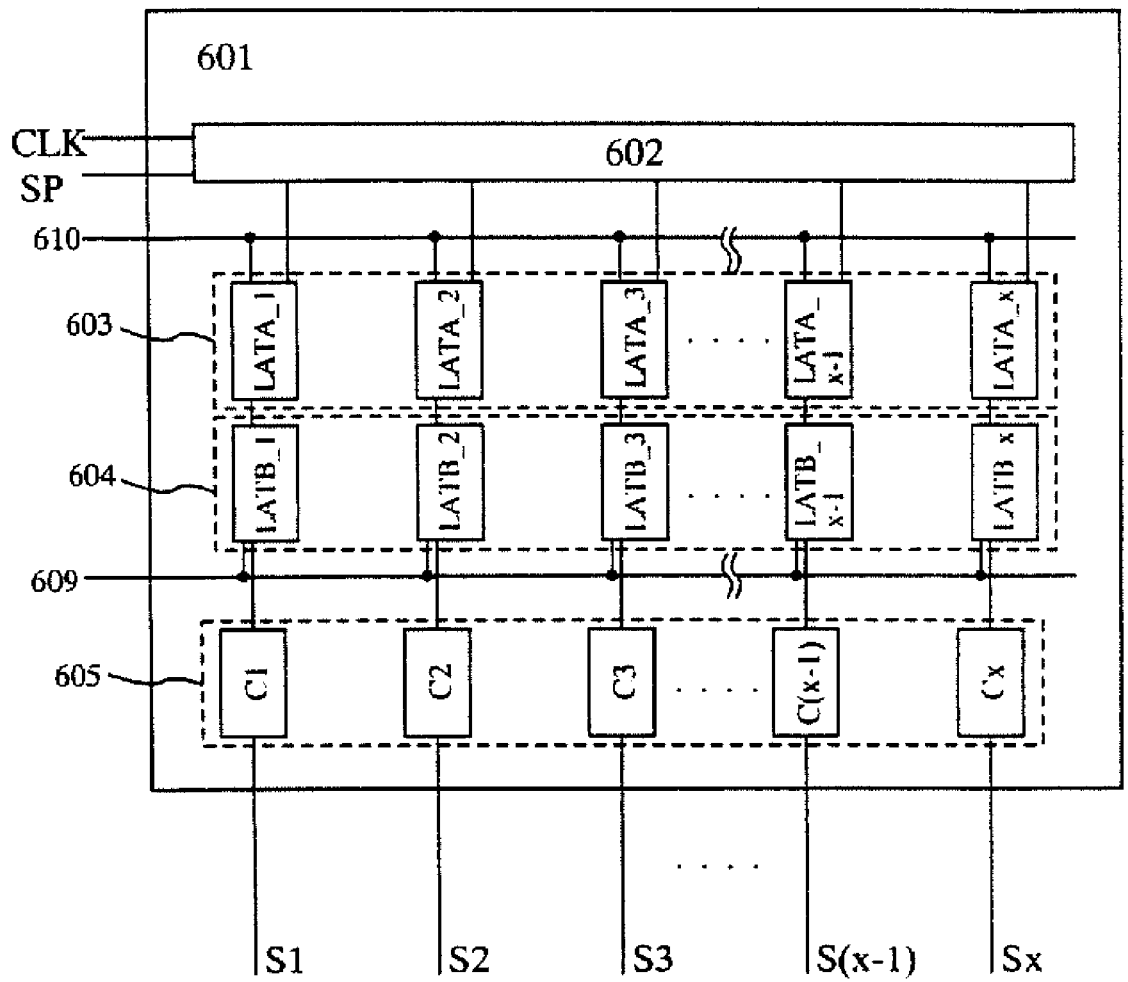
FIG. 18 is a detailed diagram of a signal line driving circuit in a digital driving method.

FIG. 18 shows a more detailed structure of the signal line driving circuit 601.

The shift register 602 generates timing signals in response to clock signals CLK and start pulse signals SP inputted from given wiring lines. The timing signals are respectively inputted to a plurality of latches A (LATA_1 to LATA_x) of the memory circuit A 603. The timing signals generated in the shift register 602 may be buffered and amplified by a buffer or the like before inputting the signals to the plural latches A (LATA_1 to LATA_x) of the memory circuit A 603.

When timing signals are inputted to the memory circuit A 603, in sync with the timing signals, digital video signals equivalent to one bit which are inputted to a video signal line 610 are sequentially written in the plural latches A (LATA_1 to LATA_x) to be stored therein.

In this embodiment, digital video signals are sequentially inputted to the plural latches A (LATA_1 to LATA_x) of the memory circuit A 603 when inputting digital video signals into the memory circuit A 603. However, the present invention is not limited thereto. The invention may employ a so-called division driving in which the plural stages of lathes of the memory circuit A 603 are divided into a few groups and digital video signals are inputted to the respective groups simultaneously. The number of groups in division driving is referred to as number of division. For example, if four stages of latches make one group, then it is four division driving.

The time required for completing writing digital video signals once into all stages of latches of the memory circuit A 603 is called a line period. In practice, sometimes the line period defined as above plus a horizontal retrace period are regarded as a line period.

Upon completion of one line period, latch signals are supplied to a plurality of latches B (LATB_1 to LATB_x) of the memory circuit B 604 through a latch signal line 609. At this instant, the digital video signals that have been held in the plural latches A (LATA_1 to LATA_x) of the memory circuit A 603 are sent to the plural latches B (LATB_1 to LATB_x) of the memory circuit B 604 all at once to be written and held therein.

Having sent the digital video signals to the memory circuit B 604, the memory circuit A 603 now receives the next supply of digital video signals equivalent to one bit so that the digital video signals are sequentially written in response to timing signals from the shift register 602.

After one line period is thus started for the second time, the digital video signals written and held in the memory circuit B 604 are inputted to the constant current circuit 605.

The constant current circuit 605 has a plurality of current setting circuits (C1 to Cx). When digital video signals are respectively inputted to the current setting circuits (C1 to Cx), information of '0' or '1' contained in the digital video signals determines whether a constant current Ic flows in the signal line or the signal line receives the electric potential of power supply lines V1 to Vx.

Figure 19:
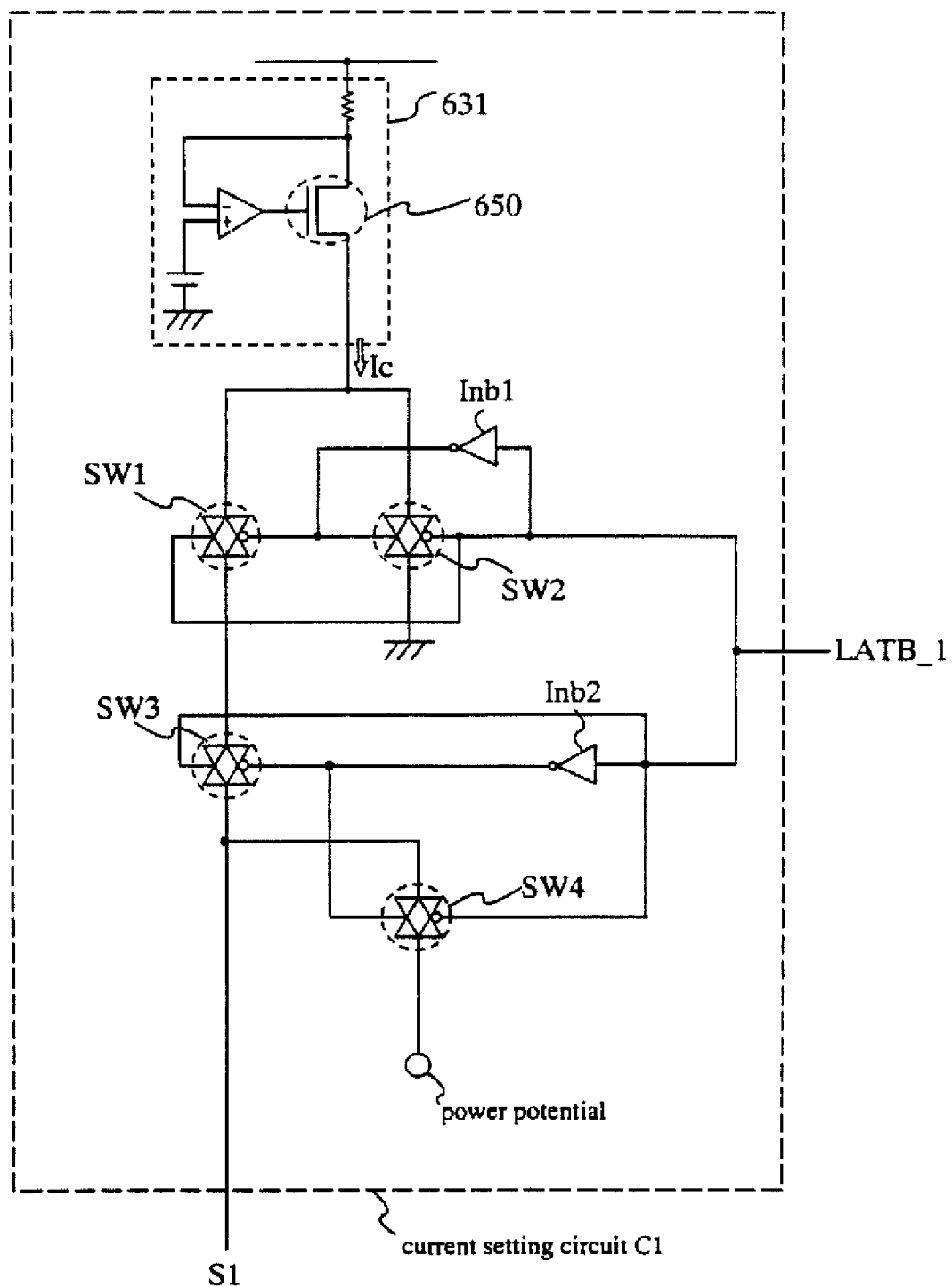
FIG. 19 is a circuit diagram of a current setting circuit in a digital driving method.

FIG. 19 shows an example of the specific structure for the current setting circuit C1. This structure is shared by the current setting circuits C2 to Cx.

The current setting circuit C1 has a constant current source 631, four transmission gates SW1 to SW4, and two inverters Inb1 and Inb2. A transistor 650 of the constant current source 631 has the same polarity as those of transistors Tr1 and Tr2 of each pixel.

Digital video signals outputted from the LATB_1 of the memory circuit B 604 are used to control switching of SW1 to SW4. Digital video signals inputted to SW1 and SW3 are inverted by Inb1 and Inb2 and the inverted digital video signals are inputted to SW2 and SW4. Accordingly, SW2 and SW4 are OFF when SW1 and SW3 are ON and, when SW1 and SW3 are OFF, SW2 and SW4 are ON.

When SW1 and SW3 are ON, the current Ic having a given value other than 0 is inputted from the constant current source 631 to a signal line S1 through SW1 and SW3.

On the other hand, when SW2 and SW4 are ON, the current Ic from the constant current source 631 is dropped to the ground through SW2 and the power supply electric potential of the power supply lines V1 to Vx is given to the signal line S1 to set Ic nearly equal to 0 through SW4.

Back to FIG. 18, the operation described above is simultaneously conducted in all of the current setting circuits (C1 to Cx) of the constant current circuit 605 in one line period. Therefore the value of the signal current Ic to be inputted is determined for the respective signal lines by digital video signals.

The structure of the scanning line driving circuit is described next.

Figure 20:
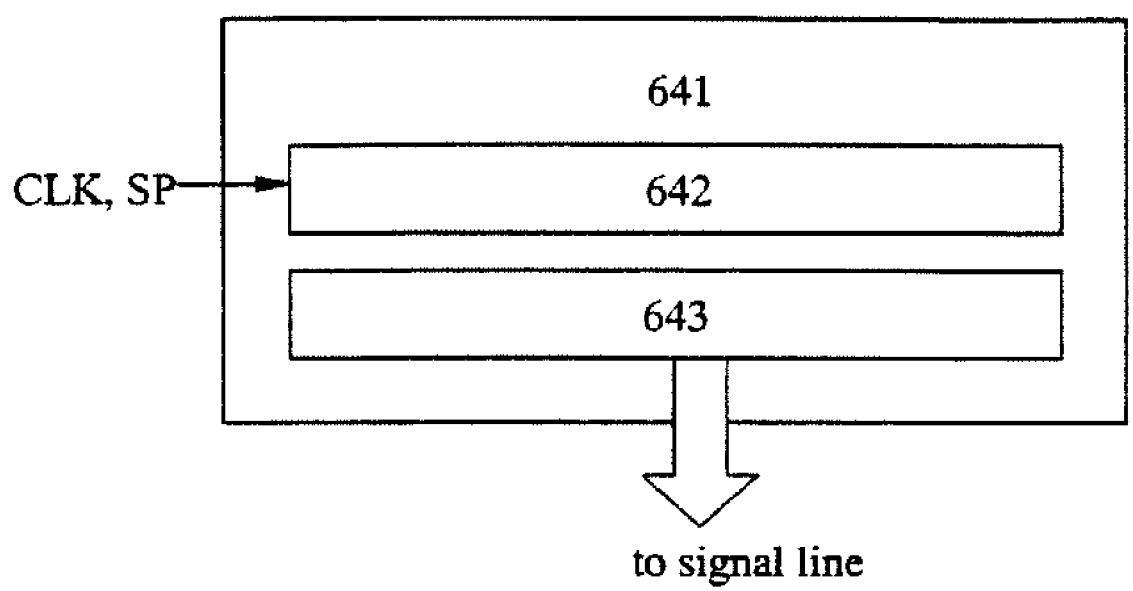
FIG. 20 is a block diagram of a scanning line driving circuit.

FIG. 20 is a block diagram showing the structure of a scanning line driving circuit 641.

The scanning line driving circuit 641 has a shift register 642 and a buffer 643. In some cases, the scanning line driving circuit may have a level shifter.

In the scanning line driving circuit 641, timing signals are generated upon input of clock signals CLK and start pulse signals SP to the shift register 642. The timing signals generated are buffered and amplified by the buffer 643 and then the signals are supplied to associated scanning lines.

One scanning line is connected to gate electrodes of first switching transistors and second switching transistors of one line of pixels. Since the first switching transistors and second switching transistors of one line of pixels have to be turned ON all at once, the buffer 643 used is capable of causing a large amount of current to flow.

Structures of the driving circuits used in the present invention are not limited to those shown in this embodiment. The structure of the constant current circuit of this embodiment is not limited to the one illustrated in FIG. 19. The constant current circuit used in the present invention can have any structure as long as it can cause the signal current Ic whose value is chosen from two values by a digital video signal to flow into a signal line.

The structure of this embodiment can be combined freely with Embodiments through 5.

Embodiment 7

This embodiment describes an order sub-frame periods SF1 to SFn turn up in a method of driving a light emitting device of the present invention for n bit digital video signals.

Figure 21:
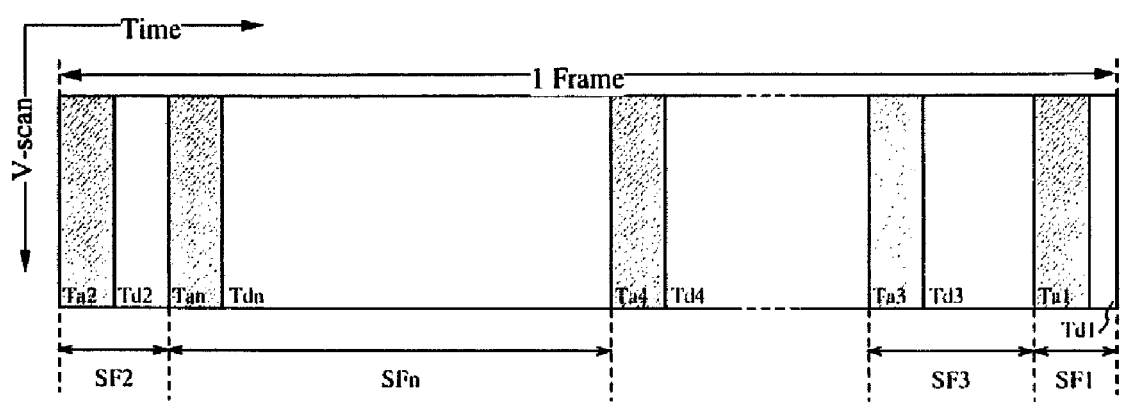
FIG. 21 is a timing chart showing at which points writing periods and display periods are started in a digital driving method.

FIG. 21 shows at which points n writing periods (Ta1 to Tan) and n display periods (Td1 to Tdn) are started in one frame period. The axis of abscissa indicates time whereas the axis of ordinate indicates positions of scanning lines of pixels. Descriptions on details about how the pixels operate are omitted here but can be found in Embodiment Modes.

According to the driving method of this embodiment, the sub-frame period that has the longest display period in one frame period (in this embodiment. SFn) does not come first or last in the one frame period. In other words, the sub-frame period that has the longest display period in one frame period is interposed between other sub-frame periods of the same frame period.

This makes it difficult for the human eye to recognize uneven display caused by light emission in close display periods in adjacent frame periods when an image is displayed with intermediate gray scales.

The structure of this embodiment is effective when $n \geq 3$. This embodiment may be combined freely with Embodiments 1 through 6.

Embodiment 8

This embodiment describes a case of driving a light emitting device of the present invention using 6 bit digital video signals.

Figure 22:
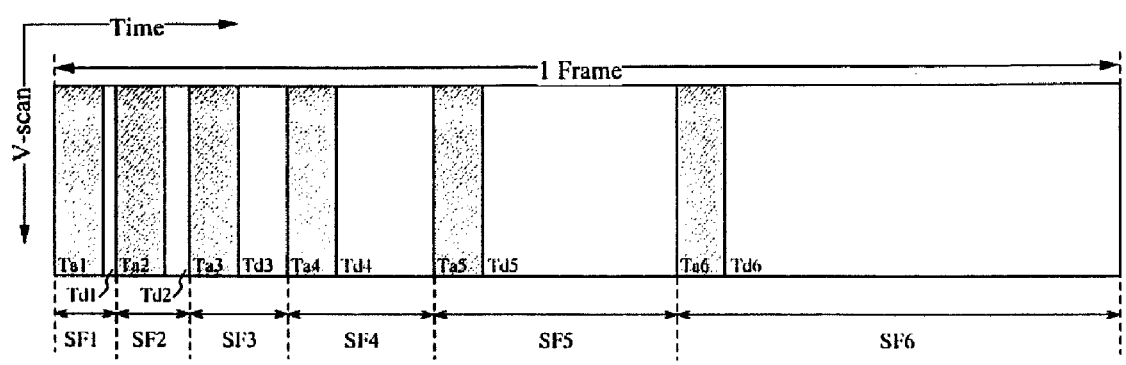
FIG. 22 is a timing chart showing at which points writing periods and display periods are started in a digital driving method.

FIG. 22 shows at which points six writing periods (Ta1 to Ta6) and six display periods (Td1 to Td6) are started in one frame period. The axis of abscissa indicates time whereas the axis of ordinate indicates positions of scanning lines of pixels. Descriptions on details about how pixels operate are omitted here but can be found in Embodiment Modes.

When the light emitting device is driven using 6 bit digital video signals, at least six sub-frame periods SF1 to SF6 are provided in one frame period.

The sub-frame periods SF1 to SF6 are respectively associated with 1 bit digital video signals to 6 bit digital signals. The sub-frame periods SF1 to SF6 have six writing periods (Ta1 to Ta6) and six display periods (Td1 to Td6).

A sub-frame period SFm (m is an arbitrary number out of 1 through 6) has a writing period Tam and a display period Tdm that are associated with the m-th bit digital video signals. The writing period Tam is followed by a display period that is associated with the same bit number, in this case, the display period Tdm.

A writing period Ta and a display period Td are repeatedly alternated in one frame period to make it possible to display one image.

Lengths of the display periods Td1 to Td6 are set to satisfy $Td1:Td2: \ldots :Td6 = 2^0:2^1: \ldots :2^5$.

In the driving method according to the present invention, gray scales are obtained by controlling the sum of lengths of display periods in one frame period in which light is emitted.

The structure of this embodiment may be combined freely with Embodiments 1 through 7.

Embodiment 9

This embodiment describes a driving method using n bit digital video signals which is different from those illustrated in FIGS. 6 and 21.

Figure 23:
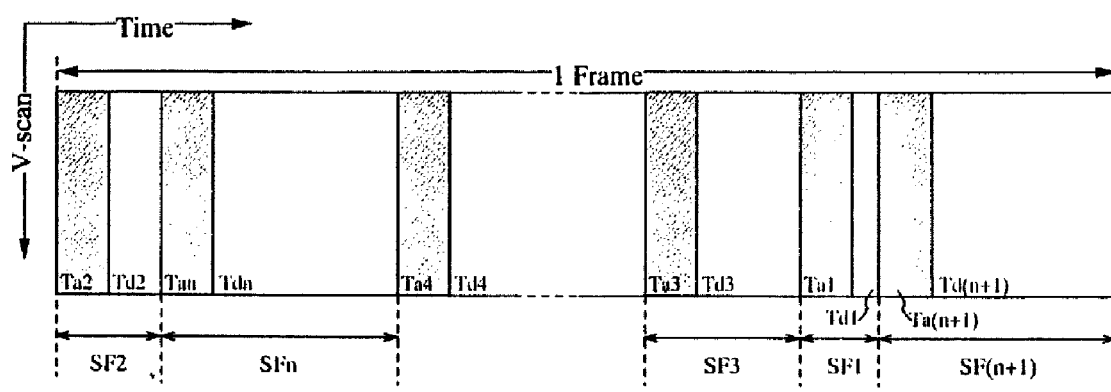
FIG. 23 is a timing chart showing at which points writing periods and display periods are started in a digital driving method.

FIG. 23 shows at which points n+1 writing periods (Ta1 to Ta (n+1)) and n+1 display periods (Td1 to Td (n+1)) are started in one frame period. The axis of abscissa indicates time whereas the axis of ordinate indicates positions of scanning lines of pixels. Descriptions on details about how the pixels operate are omitted here but can be found in Embodiment Modes.

In this embodiment, one frame period has n+1 sub-frame periods SF1 to SF (n+1) in accordance with n bit digital video signals. The sub-frame periods SF1 to SF (n+1) have n+1 writing periods (Ta1 to Ta (n+1)) and n+1 display periods (Td1 to Td (n+1)).

A writing period Tam (m is an arbitrary number ranging from 1 to n+1) and a display period Tdm make a sub-frame period SFm. The writing period Tam is followed by a display period associated with the same bit number, in this case, the display period Tdm.

The sub-frame periods SF1 to SF (n−1) are respectively associated with 1 bit digital video signals to (n−1) bit digital video signals. The sub-frame periods SFn and SF (n+1) are both associated with the n-th bit digital video signals.

The sub-frame periods SFn and SF (n+1) that are for the same bit number do not immediately follow each other in this embodiment. In other words, the sub-frame periods SFn and SF (n+1) that are for digital video signals of the same bit number sandwich another sub-frame period.

A writing period Ta and a display period Td are repeatedly alternated in one frame period to make it possible to display one image.

Lengths of the display periods Td1 to Td (n+1) are set so as to satisfy $Td1:Td2: \ldots :(Tdn+Td(n+1)) = 2^0:2^1: \ldots :2^{n-1}$.

According to the driving method of the present invention, gray scale display is obtained by controlling the total light emission time of a pixel in one frame period, namely, for how many display periods in one frame period the pixel emits light.

The above structure makes the uneven display in intermediate gray scale display less recognizable to the human eye than in the cases illustrated in FIGS. 6 and 21. The uneven display is caused by adjoining display periods during which light is emitted in adjacent frame periods.

Described in this embodiment is the case in which two sub-frame periods are provided for digital video signal of the same bit. However, the present invention is not limited thereto. Three or more sub-frame periods may be provided for the same bit in one frame period.

Although a plurality of sub-frame periods are provided for the most significant bit digital video signal in this embodiment, the present invention is not limited thereto. A digital video signal of other bit than the most significant bit may have a plurality of sub-frame periods. There is no need to limit the number of digital video signal bits that can have a plurality of sub-frame periods to one. A digital video signal of certain bit and a digital video signal of another bit can respectively have plural sub-frame periods.

The structure of this embodiment is effective when $n \geq 2$. This embodiment can be combined freely with Embodiments 1 through 8.

Embodiment 10

This embodiment describes the structure of a signal line driving circuit in a light emitting device of the present invention when the device is driven by an analog driving method. A scanning line driving circuit of this device can have the structure shown in Embodiment 6 and the description thereof is omitted here.

Figure 31A:
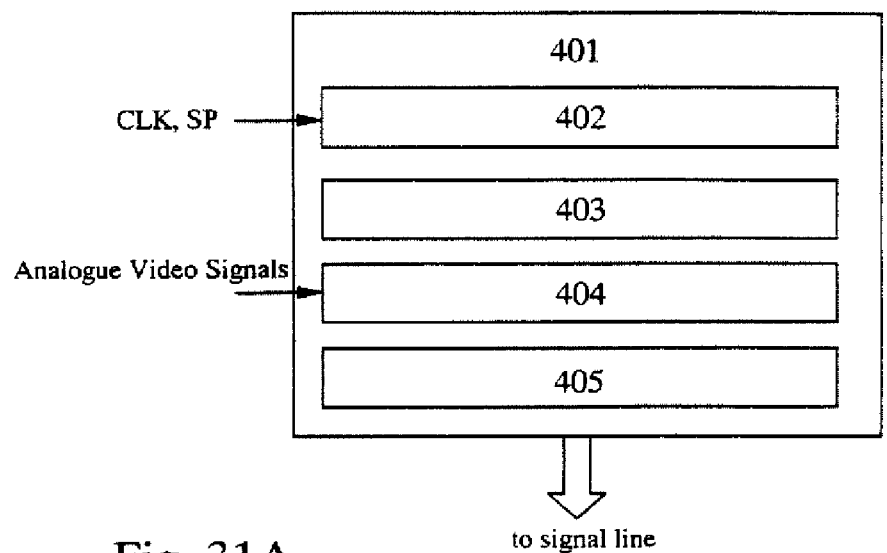
FIGS. 31A and 31B are detailed diagrams of a signal line driving circuit in a digital driving method.

FIG. 31A is a block diagram of a signal line driving circuit 401 of this embodiment. Reference symbol 402 denotes a shift register, 403, a buffer, 404, a sampling circuit, and 405, a current converting circuit.

Clock signals (CLK) and start pulse signals (SP) are inputted to the shift register 402. The shift register 402 generates timing signals in response to input of clock signals (CLK) and start pulse signals (SP).

The timing signals generated are amplified, or buffered and amplified, by the buffer 403 before inputted to the sampling circuit 404. The timing signals may be amplified by a level shifter instead of a buffer. Alternatively, the driving circuit may have a buffer and a level shifter both.

Figure 31B:
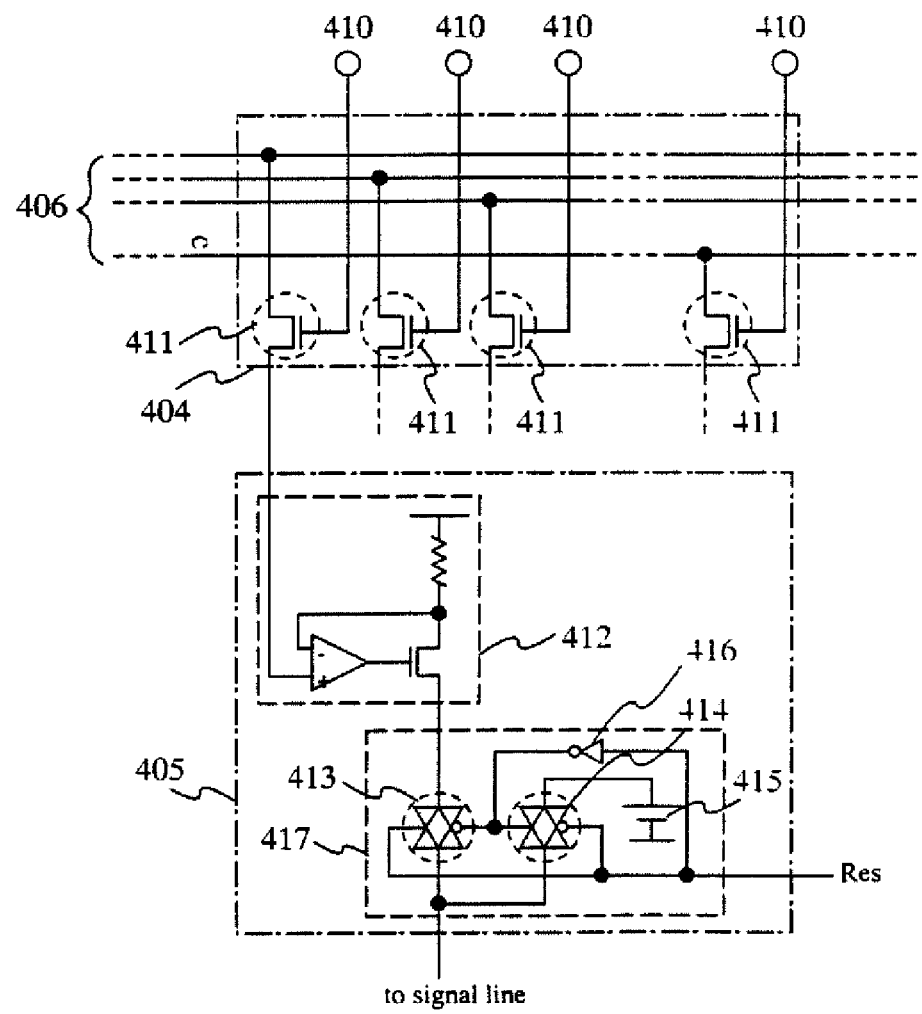

FIG. 31B shows specific structures of the sampling circuit 404 and the current converting circuit 405. The sampling circuit 404 is connected to the buffer 403 at a terminal 410.

The sampling circuit 404 is provided with a plurality of switches 411. Analog video signals are inputted from video signal lines 406 to the sampling circuit 404. The switches 411 sample the analog video signals in sync with the timing signals and then input the sampled signals to the current converting circuit 405 downstream thereof. The only current converting circuit 405 shown in FIG. 31B is one that is connected to one of the switches 411 of the sampling circuit 404. However, current converting circuits identical with the current converting circuit 405 shown in FIG. 31B are connected downstream of the respective switches 411.

Each of the switches 411 is composed of one transistor in this embodiment. However, the structure of the switches 411 is not limited to the one shown in this embodiment and any switch can be used as long as it can sample analog video signals in sync with timing signals.

The analog video signals sampled are inputted to a current output circuit 412 of the current converting circuit 405. The current output circuit 412 outputs a current (signal current) in an amount according to the voltage of the inputted video signals. Although the current output circuit in FIG. 31B is composed of an amplifier and a transistor, the present invention is not limited thereto. The current output circuit may be any circuit as long as it can output a current in an amount according to the voltage of a signal inputted.

The signal current is inputted to a reset circuit 417 within the same current converting circuit 405. The reset circuit 417 has two analog switches 413 and 414, an inverter 416, and a power supply 415.

Reset signals (Res) are inputted to the analog switch 414. Reset signals (Res) inverted by the inverter 416 are inputted to the analog switch 413. The analog switch 413 and the analog switch 414 operate in sync with inverted reset signals and reset signals, respectively, and therefore one is ON while the other is OFF.

When the analog switch 413 is ON, the signal current is inputted to the associated signal line. When the analog, switch 414 is ON, on the other hand, the electric potential of the power supply 415 is given to the signal line to reset the signal line. The electric potential of the power supply 415 is desirably at almost the same level as that of the electric potential of a power supply line provided in a pixel. The closer the current flowing in a signal line during reset of the signal line to 0, the better.

It is desirable to reset a signal line during a retrace period. However, if necessary, a signal line may be reset during a period other than a retrace period except when an image is displayed.

The signal line driving circuit and scanning line driving circuit for driving the light emitting device of the present invention are not limited to the structures shown in this embodiment. The structure of this embodiment can be combined freely with the structures of Embodiments 1 through 9.

Embodiment 11

In this embodiment, an external light emitting quantum efficiency can be remarkably improved by using an organic light emitting material by which phosphorescence from a triplet exciton can be employed for emitting a light. As a result, the power consumption of the OLED can be reduced, the lifetime of the OLED can be elongated and the weight of the OLED can be lightened.

The following is a report where the external light emitting quantum efficiency is improved by using the triplet exciton (T. Tsutsui, C. Adachi. S. Saito. Photochemical processes in Organized Molecular Systems, ed. K. Honda, (Elsevier Sci. Pub., Tokyo, 1991) p. 437).

The molecular formula of an organic light emitting material (coumarin pigment) reported by the above article is represented as follows.

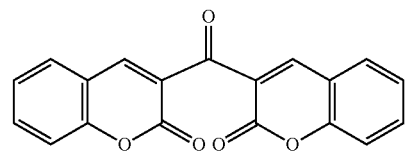

Chemical formula 1

(M. A. Baldo, D. F. O Brien. Y. You. A. Shoustikov, S. Sibley. M. E. Thompson. S. R. Forrest. Nature 395 (1998) p. 151)

The molecular formula of an organic light emitting material (Pt complex) reported by the above article is represented as follows.

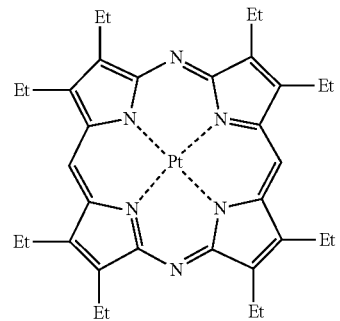

Chemical formula 2

(M. A. Baldo, S. Lamansky, P. E. Burrows, M. E. Thompson, S.R. Forrest. Appl. Phys. Lett., 75 (1999) p. 4.)
(T. Tsutsui, M.-J.Yang, M. Yahiro, K. Nakamura, T. Watanabe. T. Tsuji, Y. Fukuda, T. Wakimoto, S. Mayaguchi, Jpn, Appl. Phys., 38 (12B) (1999) L1502.)

The molecular formula of an organic light emitting material (Ir complex) reported by the above article is represented as follows.

Chemical formula 3

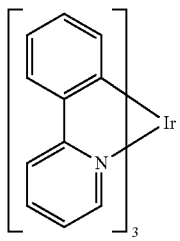

As described above, if phosphorescence from a triplet exciton can be put to practical use, it can realize the external light emitting quantum efficiency three to four times as high as that in the case of using fluorescence from a singlet exciton in principle.

The structure according to this embodiment can be freely implemented in combination of any structures of the Embodiments 1 to 10.

Embodiment 12

In this embodiment, an example of manufacturing the light emitting device using the present invention is described with reference to FIGS. 24 (A) to 24(C).

Figure 24A:
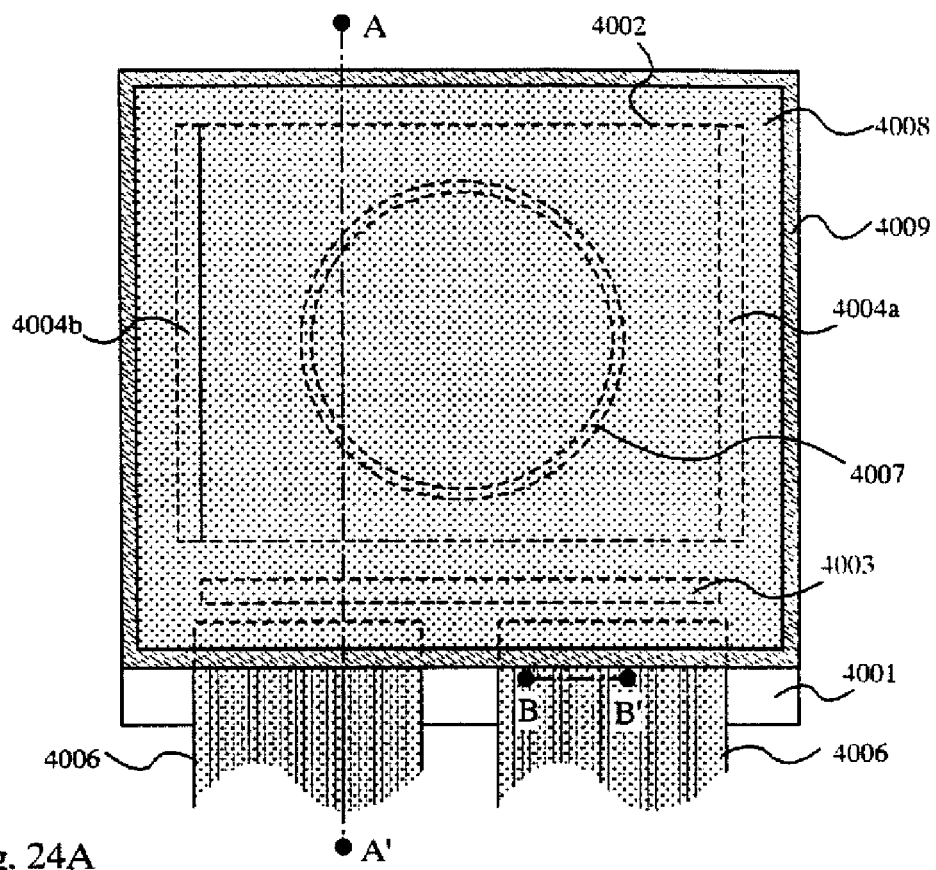
FIGS. 24A to 24C are diagrams showing the exterior and sectional views of a light emitting device of the present invention.
Figure 24B:
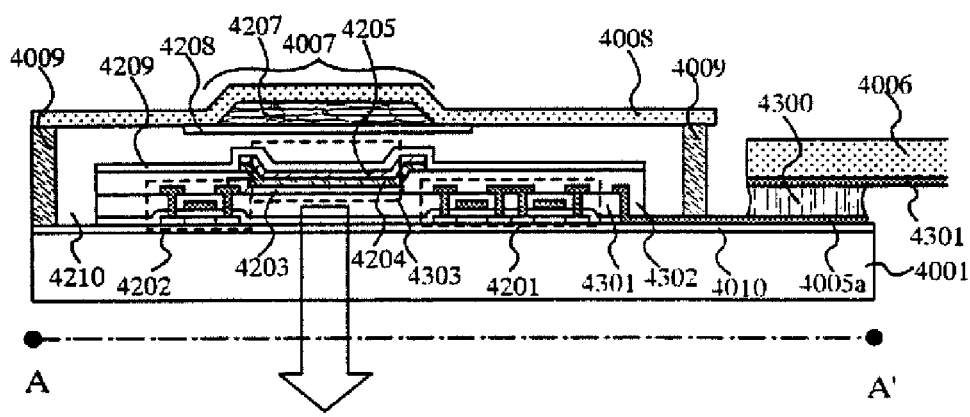

FIG. 24 is a top view of the light emitting device which is formed according as the element substrate with the transistor is sealed by sealing materials. FIG. 24 (B) is a cross sectional view taken along with a line A-A' of FIG. 24 (A), and FIG. 24 (C) is a cross to sectional view taken along with a line B-B' of FIG. 24 (A).

A seal member 4009 is provided so as to surround a pixel portion 4002, a signal line driver circuit 4003, and the first, second scanning line driver circuits 4004a, 4004b, which are provided on a substrate 4001. Further, a sealing material 4008 is provided on the pixel portion 4002, the signal line driver circuit 4003, and the first, the second scanning line driver circuits 4004a, 4004b. Thus, the pixel portion 4002, the signal line driver circuit 4003, and the first, the second scanning line driver circuits 4004a, 4004b are sealed by the substrate 4001, the seal member 4009 and the sealing material 4008 together with a filler 4210.

Further, the pixel portion 4002, the signal line driver circuit 4003, and the first, the second scanning line driver circuits 4004a, 4004b, which are provided on the substrate 4001, have a plurality of TFTs. In FIG. 24 (B), a driver circuit TFT (Here, an n-channel TFT and a p-channel TFT are shown in the figure.) 4201 included in the signal line driver circuit 4003 and a current controlling TFT (transistor Tr3) 4202 included in the pixel portion 4002, which are formed on a base film 4010, are typically shown.

In this embodiment, the p-channel TFT or the n-channel TFT manufactured by a known method is used as the driver circuit TFT 4201, and the p-channel TFT manufactured by a known method is used as the current controlling TFT 4202. Further, the display pixel portion 4002 is provided with a storage capacitor (not shown) connected to a gate electrode of the current controlling TFT 4202.

An interlayer insulating film (leveling film) 4301 is formed on the driver circuit TFT 4201 and the current controlling TFT 4202, and a pixel electrode (anode) 4203 electrically connected to a drain of the current controlling TFT 4202 is formed thereon. A transparent conductive film having a large work function is used for the pixel electrode 4203. A compound of indium oxide and tin oxide, a compound of indium oxide and zinc oxide, zinc oxide, tin oxide or indium oxide can be used for the transparent conductive film. The above transparent conductive film added with gallium may also be used.

Then, an insulating film 4302 is formed on the pixel electrode 4203, and the insulating film 4302 is formed with an opening portion on the pixel electrode 4203. In to this opening portion, an organic light emitting layer 4204 is formed on the pixel electrode 4203. A known organic light emitting material or inorganic light emitting material may be used for the organic light emitting layer 4204. Further, there exist a low molecular weight (monomer) material and a high molecular weight (polymer) material as the organic light emitting materials, and both the materials may be used.

A known evaporation technique or application technique may be used as a method of forming the organic light emitting layer 4204. Further, the structure of the organic light emitting layer may take a lamination structure or a single layer structure by freely combining a hole injecting layer, a hole transporting layer, a light emitting layer, an electron transporting layer and an electron injecting layer.

A cathode 4205 made of a conductive film having light shielding property (typically, conductive film containing aluminum, copper or silver as its main constituent or lamination film of the above conductive film and another conductive film) is formed on the organic light emitting layer 4204. Further, it is desirable that moisture and oxygen that exist on an interface of the cathode 4205 and the organic light emitting layer 4204 are removed as much as possible. Therefore, such a device is necessary that the organic light emitting layer 4204 is formed in a nitrogen or rare gas atmosphere, and then, the cathode 4205 is formed without exposure to oxygen and moisture. In this embodiment, the above-described film deposition is enabled by using a multi-chamber type (cluster tool type) film forming device. In addition, a predetermined voltage is given to the cathode 4205.

As described above, an OLED 4303 constituted of the pixel electrode (anode) 4203, the organic light emitting layer 4204 and the cathode 4205 is formed. Further, a protective film 4303 is formed on the insulating film 4302 so as to cover the OLED 4303. The protective film 4209 is effective in preventing oxygen, moisture and the like from permeating the OLED 4303.

Reference numeral 4005a denotes a wiring drawn to be connected to the power supply line, and the wiring 4005a is electrically connected to a source region of the current controlling TFT 4202. The drawn wiring 4005a passes between the seal member 4009 and the substrate 4001, and is electrically connected to an FPC wring 4301 of an FPC 4006 through an anisotropic conductive film 4300.

A glass material, a metal material (typically, stainless material), a ceramics material or a plastic material (including a plastic film) can be used for the sealing material 4008. As the plastic material, an FRP (fiberglass-reinforced plastics) plate, a PVF (polyvinyl fluoride) film, a Mylar film, a polyester film or an acrylic resin film may be used. Further, a sheet with a structure in which an aluminum foil is sandwiched with the PVF film or the Mylar film can also be used.

However, in the case where the light from the OLED is emitted toward the cover member side, the cover member needs to be transparent. In this case, a transparent substance such as a glass plate, a plastic plate, a polyester film or an acrylic film is used.

Further, in addition to an inert gas such as nitrogen or argon, an ultraviolet curable resin or a thermosetting resin may be used as the filler 4210, so that PVC (polyvinyl chloride), acrylic, polyimide, epoxy resin, silicone resin, PVB (polyvinyl butyral) or EVA (ethylene vinyl acetate) can be used. In this embodiment, nitrogen is used for the filler.

Moreover, a concave portion 4007 is provided on the surface of the sealing material 4008 on the substrate 4001 side, and a hygroscopic substance or a substance that can absorb oxygen 4207 is arranged therein in order that the filler 4210 is made to be exposed to the hygroscopic substance (preferably, barium oxide) or the substance that can absorb oxygen. Then, the hygroscopic substance or the substance that can absorb oxygen 4207 is held in the concave portion 4007 by a concave portion cover member 4208 such that the hygroscopic substance or the substance that can absorb oxygen 4207 is not scattered. Note that the concave portion cover member 4208 has a fine mesh form, and has a structure in which air and moisture are penetrated while the hygroscopic substance or the substance that can absorb oxygen 4207 is not penetrated. The deterioration of the OLED 4303 can be suppressed by providing the hygroscopic substance or the substance that can absorb oxygen 4207.

Figure 24C:
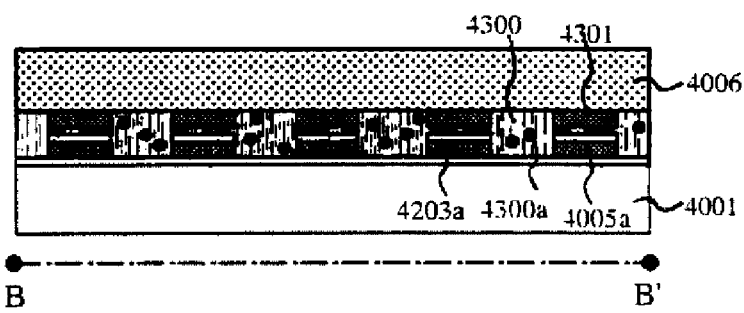
Figure 25A:
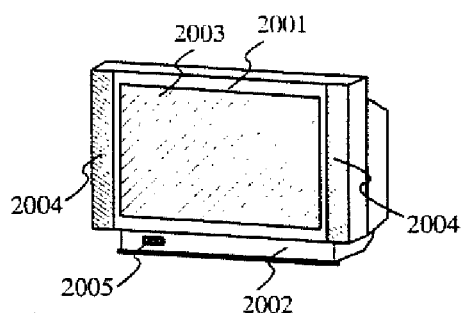
FIGS. 25A to 25H are diagrams of electronic equipment using a light emitting device of the present invention.
Figure 25B:
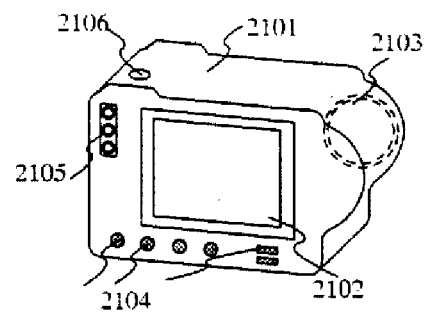
Figure 25C:
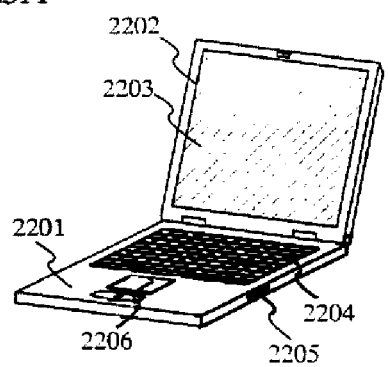
Figure 25D:
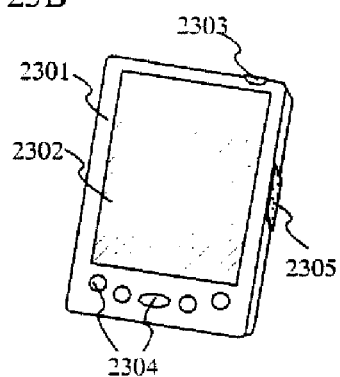
Figure 25E:
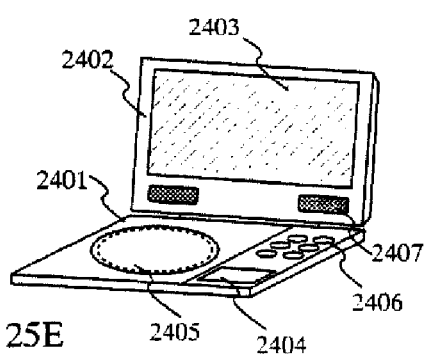
Figure 25F:
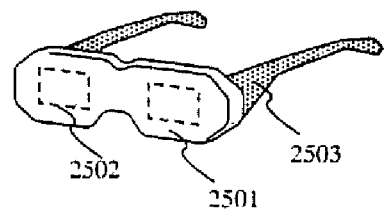
Figure 25G:
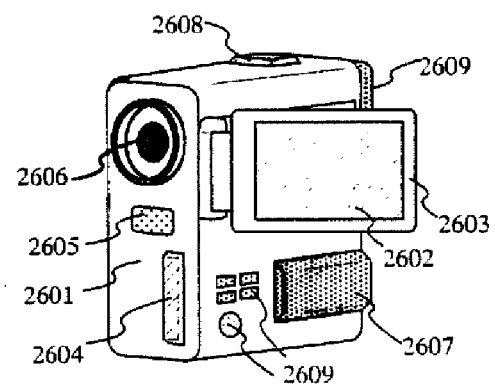
Figure 25H:
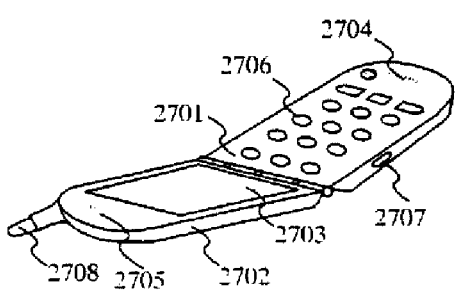
Figure 26:
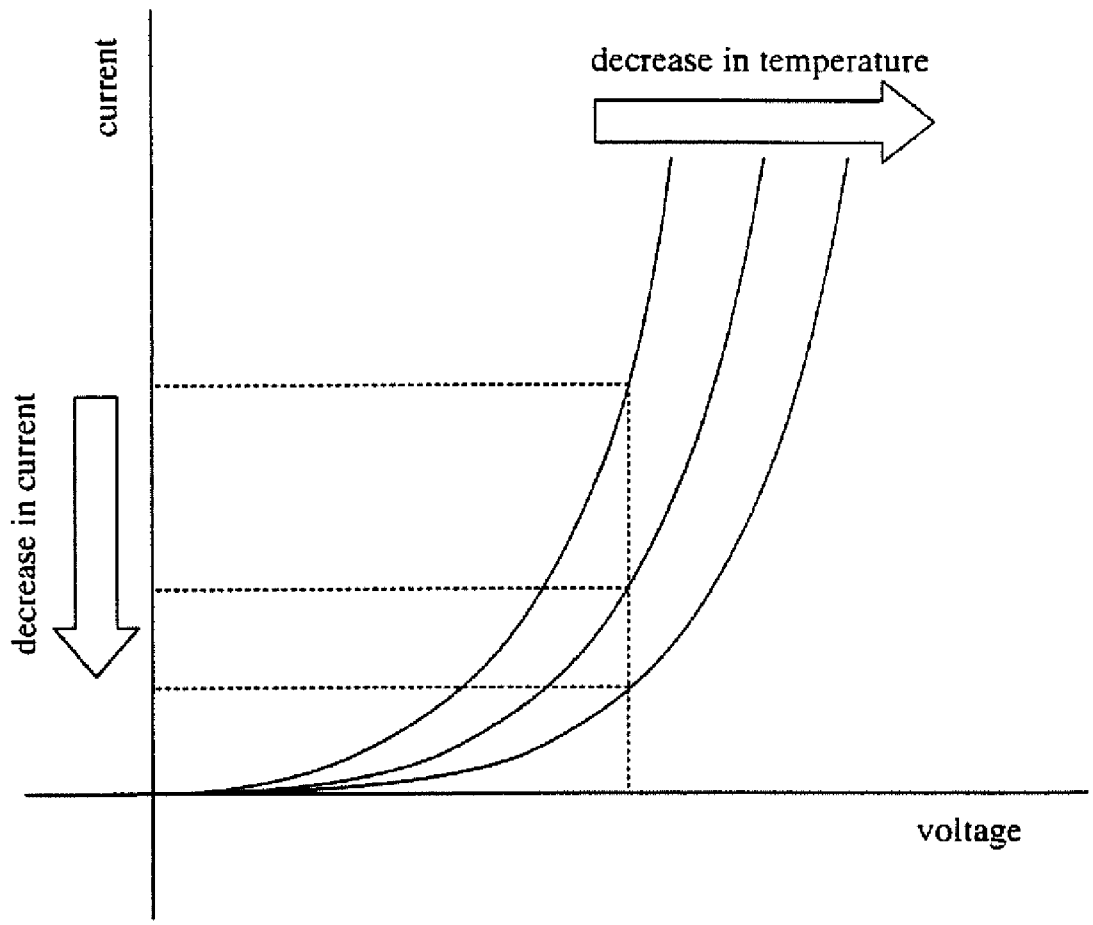
FIG. 26 is a graph showing the voltage-current characteristic of an OLED.

As shown in FIG. 24(C), the pixel electrode 4203 is formed, and at the same time, a conductive film 4203a is formed so as to contact the drawn wiring 4005a.

Further, the anisotropic conductive film 4300 has conductive filler 4300a. The conductive film 4203a on the substrate 4001 and the FPC wiring 4301 on the FPC 4000 are to electrically connected to each other by the conductive filler 43011a by heat-pressing the substrate 4001 and the FPC 4006.

Note that this embodiment can be implemented by being freely combined with Embodiments 1 to 11.

Embodiment 13

This embodiment describes an example of the structure of a pixel in a light emitting device of the present invention which is different from the examples illustrated in FIGS. 2, 7, and 8.

Figure 30A:
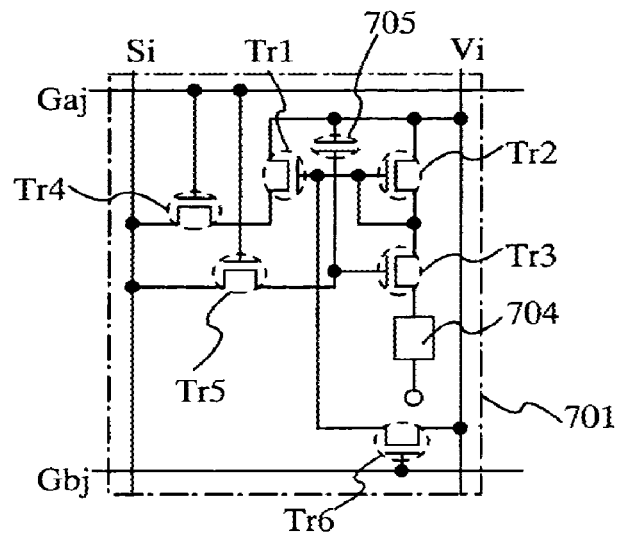
FIGS. 30A to 30C are circuit diagrams of pixels in a light emitting device of the present invention.

The pixel structure of this embodiment is shown in FIG. 30A. A pixel shown in FIG. 30A is denoted by 701 and has a signal line Si (one of S1 to Sx), a first scanning line Gaj (one of Ga1 to Gay), a second scanning line Gbj (one of Gb1 to Gby), and a power supply line Vi (one of V1 to Vx). The number of first scanning lines and the number of second scanning lines in a pixel portion may not always match.

The pixel 701 has, at least, a transistor Tr1 (a first current controlling transistor or a first transistor), a transistor Tr2 (a second current controlling transistor or a second transistor), a transistor Tr3 (a third current controlling transistor or a third transistor), a transistor Tr4 (a first switching transistor or a fourth transistor), a transistor Tr5 (a second switching transistor or a fifth transistor), a transistor Tr6 (an erasing transistor or a sixth transistor), an OLED 704, and a storage capacitor 705.

Gate electrodes of the transistor Tr4 and of the transistor Tr5 are connected to the first scanning line Gaj.

The transistor Tr4 has a source region and a drain region one of which is connected to the signal line Si and the other of which is connected to a drain region of the transistor Tr1. The transistor Tr5 has a source region and a drain region one of which is connected to the signal line Si and the other of which is connected to a gate electrode of the transistor Tr3.

Gate electrodes of the transistor Tr1 and of the transistor Tr2 are connected to each other. Source regions of the transistor Tr1 and of the transistor Tr2 are connected to the power supply line Vi.

The gate electrode of the transistor Tr2 is connected to a drain region thereof. The drain region of the transistor Tr2 is connected to a source region of the transistor Tr3.

A gate electrode of the transistor Tr6 is connected to the second scanning line Gbj. The transistor Tr6 has a source region and a drain region one of which is connected to the power supply line Vi and the other of which is connected to the gate electrodes of the transistor Tr1 and of the transistor Tr2.

A drain region of the transistor Tr3 is connected to a pixel electrode of the OLED 704. The electric potential of the power supply line Vi (power supply electric potential) is kept constant. The electric potential of an opposite electrode is also kept constant.

The transistor Tr4 may be an n-channel transistor or a p-channel transistor and the same applies to the transistor Tr5. However, the transistor Tr4 and the transistor Tr5 have to have the same polarity.

The transistor Tr1 may be an n-channel transistor or a p-channel transistor and the same applies to the transistors Tr2 and Tr3. However, the transistors Tr1, Tr2, and Tr3 have to have the same polarity. When the pixel electrode serves as an anode and the opposite electrode serves as a cathode, the transistors Tr1, Tr2, and Tr3 are p-channel transistors. On the other hand, n-channel transistors are used for the transistors Tr1. Tr2, and Tr3 when the opposite electrode serves as an anode and the pixel electrode serves as a cathode.

The transistor Tr6 may be an n-channel TFT or a p-channel TFT.

The storage capacitor 705 is formed between the gate electrode of the transistor Tr3 and the power supply line Vi. The storage capacitor 705 is provided to maintain the voltage between the gate electrode of the transistor Tr3 and the source region thereof (gate voltage) more securely but it may not always be necessary.

The transistors Tr1 and Tr2 may have storage capacitor s between their gate electrodes and the power supply line so that the gate voltages of the transistors Tr1 and Tr2 can be maintained more securely.

Figure 30B:
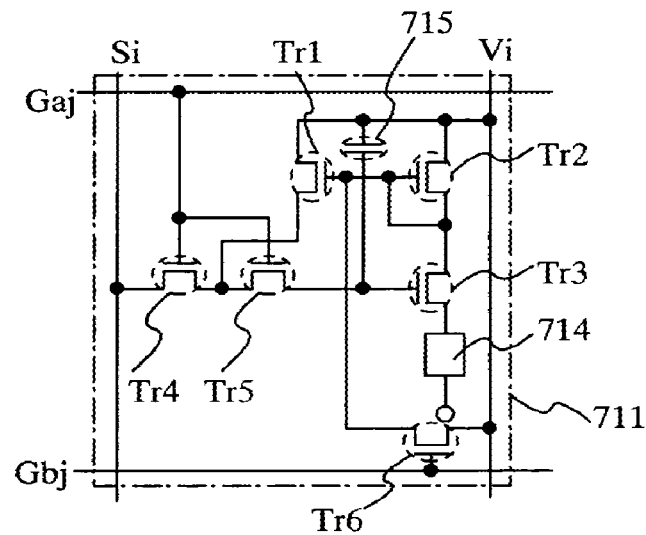

FIG. 30B shows another structure for the pixel of this embodiment. A pixel shown in FIG. 30B is denoted by 711 and has a signal line Si (one of S1 to Sx), a first scanning line Gaj (one of Ga1 to Gay), a second scanning line Gbj (one of Gb1 to Gby), and a power supply line Vi (one of V1 to Vx). The number of first scanning lines and the number of second scanning lines in a pixel portion may not always match.

The pixel 711 has, at least, a transistor Tr1 (a first current controlling transistor or a first transistor), a transistor Tr2 (a second current controlling transistor or a second transistor), a transistor Tr3 (a third current controlling transistor or a third transistor), a transistor Tr4 (a first switching transistor or a fourth transistor), a transistor Tr5 (a second switching transistor or a fifth transistor), a transistor Tr6 (an erasing transistor or a sixth transistor), an OLED 714, and a storage capacitor 715.

Gate electrodes of the transistor Tr4 and of the transistor Tr5 are connected to the first scanning line Gaj.

The transistor Tr4 has a source region and a drain region one of which is connected to the signal line Si and the other of which is connected to a drain region of the transistor Tr1. The transistor Tr5 has a source region and a drain region one of which is connected to the drain region of the transistor Tr1 and the other of which is connected to a gate electrode of the transistor Tr3.

Gate electrodes of the transistor Tr1 and of the transistor Tr2 are connected to each other. Source regions of the transistor Tr1 and of the transistor Tr2 are connected to the power supply line Vi.

The gate electrode of the transistor Tr2 is connected to a drain region thereof. The drain region of the transistor Tr2 is connected to a source region of the transistor Tr3.

A gate electrode of the transistor Tr6 is connected to the second scanning line Gbj. The transistor Tr6 has a source region and a drain region one of which is connected to the power supply line Vi and the other of which is connected to the gate electrodes of the transistor Tr1 and of the transistor Tr2.

A drain region of the transistor Tr3 is connected to a pixel electrode of the OLED 714. The electric potential of the power supply line Vi (power supply electric potential) is kept constant. The electric potential of an opposite electrode is also kept constant.

The transistor Tr4 may be an n-channel transistor or a p-channel transistor and the same applies to the transistor Try. However, the transistor Tr4 and the transistor Try have to have the same polarity.

The transistor Tr1 may be an n-channel transistor or a p-channel transistor and the same applies to the transistors Tr2 and Tr3. However, the transistors Tr1, Tr2, and Tr3 have to have the same polarity. When the pixel electrode serves as an anode and the opposite electrode serves as a cathode, the transistors Tr1, Tr2, and Tr3 are p-channel transistors. On the other hand, n-channel transistors are used for the transistors Tr1, Tr2, and Tr3 when the opposite electrode serves as an anode and the pixel electrode serves as a cathode.

The transistor Tr6 may be an n-channel transistor or a p-channel transistor.

The storage capacitor 715 is formed between the gate electrode of the transistor Tr3 and the power supply line Vi. The storage capacitor 715 is provided to maintain the gate voltage of the transistor Tr3 more securely but it may not always be necessary.

The transistors Tr1 and Tr2 may have storage capacitor s between their gate electrodes and the power supply line so that the gate voltages of the transistors Tr1 and Tr2 can be maintained more securely.

Figure 30C:
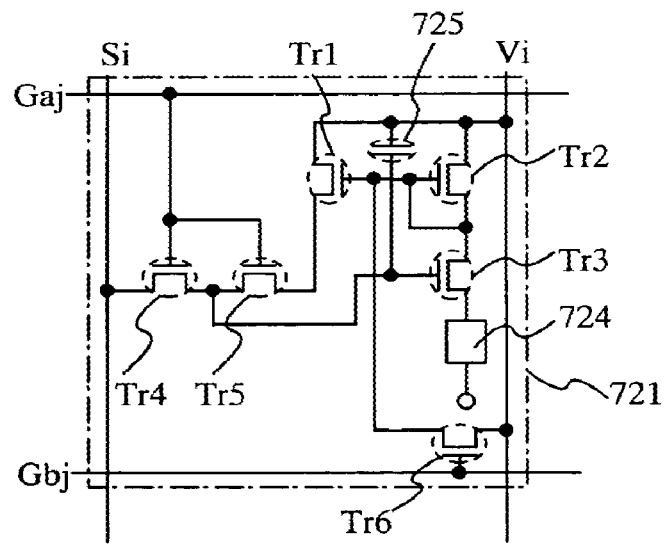

FIG. 30C shows another structure for the pixel of this embodiment. A pixel shown in FIG. 30C is denoted by 721 and has a signal line Si (one of S1 to Sx), a first scanning line Gaj (one of Ga1 to Gay), a second scanning line Gbj (one of Gb1 to Gby), and a power supply line Vi (one of V1 to Vx). The number of first scanning lines and the number of second scanning lines in a pixel portion may not always match.

The pixel 721 has, at least, a transistor Tr1 (a first current controlling transistor or a first transistor), a transistor Tr2 (a second current controlling transistor or a second transistor), a transistor Tr3 (a third current controlling transistor or a third transistor), a transistor Tr4 (a first switching transistor or a fourth transistor), a transistor Tr5 (a second switching transistor or a fifth transistor), a transistor Tr6 (an erasing, transistor or a sixth transistor), an OLED 724, and a storage capacitor 725.

Gate electrodes of the transistor Tr4 and of the transistor Tr5 are connected to the first scanning line Gaj.

The transistor Tr4 has a source region and a drain region one of which is connected to the signal line Si and the other of which is connected to a gate electrode of the transistor Tr3. The transistor Tr5 has a source region and a drain region one of which is connected to the gate electrode of the transistor Tr3 and the other of which is connected to a drain region of the transistor Tr1.

Gate electrodes of the transistor Tr1 and of the transistor Tr2 are connected to each other. Source regions of the transistor Tr1 and of the transistor Tr2 are connected to the power supply line Vi.

The gate electrode of the transistor Tr2 is connected to a drain region thereof. The drain region of the transistor Tr2 is connected to a source region of the transistor Tr3.

A gate electrode of the transistor Tr6 is connected to the second scanning line Gbj. The transistor Tr6 has a source region and a drain region one of which is connected to the power supply line Vi and the other of which is connected to the gate electrodes of the transistor Tr1 and of the transistor Tr2.

A drain region of the transistor Tr3 is connected to a pixel electrode of the OLED 724. The electric potential of the power supply line Vi (power supply electric potential) is kept constant. The electric potential of an opposite electrode is also kept constant.

The transistor Tr4 may be an n-channel TFT or a p-channel TFT and the same applies to the transistor Tr5. However, the transistor Tr4 and the transistor Tr5 have to have the same polarity.

The transistor Tr1 may be an n-channel transistor or a p-channel transistor and the same applies to the transistors Tr2 and Tr3. However, the transistors Tr1. Tr2, and Tr3 have to have the same polarity. When the pixel electrode serves as an anode and the opposite electrode serves as a cathode, the transistors Tr1. Tr2, and Tr3 are p-channel transistors. On the other hand, n-channel transistors are used for the transistors Tr1, Tr2, and Tr3 when the opposite electrode serves as an anode and the pixel electrode serves as a cathode.

The transistor Tr6 may be an n-channel transistor or a p-channel transistor.

The storage capacitor 725 is formed between the gate electrode of the transistor Tr3 and the power supply line Vi. The storage capacitor 725 is provided to maintain the voltage between the gate electrode of the transistor Tr3 and the source region thereof (gate voltage) more securely but it may not always be necessary.

The transistors Tr1 and Tr2 may have storage capacitor s between their gate electrodes and the power supply line so that the gate voltages of the transistors Tr1 and Tr2 can be maintained more securely.

A light emitting device having a pixel structured as shown in FIGS. 30A, 30B or 30C is driven by a digital driving method and an analog driving method cannot be used to drive the device. In the pixels shown in FIGS. 30A, 30B, and 30C, it is possible to make the OLEDs 704, 714, and 724 stop emitting light by controlling the electric potential of the second scanning line Gbj so as to turn the transistor Try ON while the OLEDs are emitting light. Therefore display periods of pixels can be forcedly terminated while inputting digital video signals to pixels. Display periods thus can be made shorter than writing periods and the pixel structures are suitable for driving the device using digital video signals of high bit number.

The structure of this embodiment may be combined freely with the structures shown in Embodiments 1, 2, 5, 6, 7, 8, 9, 11, and 12.

Embodiment 14

The light emitting device using the OLED is of the self-emission type, and thus exhibits more excellent recognizability of the displayed image in a light place as compared to the liquid crystal display device. Furthermore, the light emitting device has a wider viewing angle. Accordingly, the light emitting device can be applied to a display portion in various electronic devices.

Such electronic devices using a light emitting device of the present invention include a video camera, a digital camera, a goggles-type display (head mount display), a navigation system, a sound reproduction device (a car audio equipment and an audio set), a lap-top computer, a game machine, a portable information terminal (a mobile computer, a portable telephone, a portable game machine, an electronic book, or the like), an image reproduction apparatus including a recording medium (more specifically, an apparatus which can reproduce a recording medium such as a digital video disc (DVD) and so forth, and includes a display for displaying the reproduced image), or the like. In particular, in the case of the portable information terminal, use of the light emitting device is preferable, since the portable information terminal that is likely to be viewed from a tilted direction is often required to have a wide viewing angle. FIG. 25A to 25H respectively shows various specific examples of such electronic equipment.

FIG. 25 (A) illustrates a display device using OLED which includes a casing 2001, a support table 2002, a display portion 2003, a speaker portion 2004, a video input terminal 2005 or the like. The present invention is applicable to the display portion 2003. The light emitting device is of the self-emission type and therefore requires no back light. Thus, the display portion thereof can have a thickness thinner than that of the liquid crystal display device. The OLED display device is including the entire display device for displaying information, such as a personal computer, a receiver of TV broadcasting and an advertising display.

FIG. 25 (B) illustrated a digital still camera which includes a main body 2101, a display portion 2102, an image receiving portion 2103, an operation key 2104, an external connection port 2105, a shutter 2106, or the like. The light emitting device in accordance with the present invention can be used as the display portion 2102.

FIG. 25 (C) illustrates a lap-top computer which includes a main body 2201, a casing 2202, a display portion 2203, a keyboard 2204, an external connection port 2205, a pointing mouse 2206, or the like. The light emitting device in accordance with the present invention can be used as the display portion 2203.

FIG. 25 (D) illustrated a mobile computer which includes a main body 2301, a display portion 2302, a switch 2303, an operation key 2304, an infrared port 2305, or the like. The light emitting device in accordance with the present invention can be used as the display portion 2302.

FIG. 25 (E) illustrates a portable image reproduction apparatus including a recording medium (more specifically, a DVD reproduction apparatus), which includes a main body 2401, a casing 2402, a display portion A 2403, another display portion B 2404, a recording medium (DVD or the like) reading portion 2405, an operation key 2406, a speaker portion 2407 or the like. The display portion A 2403 is used mainly for to displaying image information, while the display portion B 2404 is used mainly for displaying character information. The light emitting device in accordance with the present invention can be used as these display portions A 2403 and B 2404. The image reproduction apparatus including a recording medium further includes a game machine or the like.

FIG. 25 (F) illustrates a goggle type display (head mounted display) which includes a main body 2501, a display portion 2502, arm portion 2503 or the like. The light emitting device in accordance with the present invention can be used as the display portion 2502.

FIG. 25 (G) illustrates a video camera which includes a main body 2601, a display portion 2602, a casing 2603, an external connecting port 2604, a remote control receiving portion 2605, an image receiving portion 2606, a battery 2607, a sound input portion 2608, an operation key 2609, or the like. The light emitting device in accordance with the present invention can be used as the display portion 2602.

FIG. 25 (H) illustrates a portable telephone which includes a main body 2701, a casing 2702, a display portion 2703, a sound input portion 2704, a sound output portion 2705, an operation key 2706, an external connecting port 2707, an antenna 2708, or the like. The light emitting device in accordance with the present invention can be used as the display portion 2703. Note that the display portion 2703 can reduce power consumption of the portable telephone by displaying white-colored characters on a black-colored background.

When the brighter luminance of light emitted from the organic light emitting material becomes available in the future, the light emitting device in accordance with the present invention will be applicable to a front-type or rear-type projector in which light including output image information is enlarged by means of lenses or the like to be projected.

The aforementioned electronic equipments are more likely to be used for display information distributed through a telecommunication path such as Internet, a CATV (cable television system), and in particular likely to display moving picture information. The light emitting device is suitable for displaying moving pictures since the organic light emitting material can exhibit high response speed.

A portion of the light emitting device that is emitting light consumes power, so it is desirable to display information in such a manner that the light emitting portion therein becomes as small as possible. Accordingly, when the light emitting device is applied to a display portion which mainly displays character information, e.g. a display portion of a portable information terminal, and more particular, a portable telephone or a sound reproduction device, it is desirable to drive the light emitting device so that the character information is formed by a light emitting portion while a non-emission portion corresponds to the background.

As set forth above, the present invention can be applied variously to a wide range of electronic devices in all fields. The electronic device in this embodiment can be obtained by utilizing a light emitting device having the configuration in which the structures in Embodiments 1 to 13 are freely combined.

With the structure described above, a light emitting device of the present invention can keep the luminance constant without being influenced by temperature change. If the device is to display an image in color and different organic light emitting materials are used for OLEDs of different colors, the luminance of the OLEDs of different colors changes uniformly to obtain desired colors.

What is claimed is:
1. A display device comprising:
a driver circuit; and
a pixel comprising a light emitting element, a first transistor, a second transistor, a third transistor, a fourth transistor and a capacitor,
wherein the first transistor and the second transistor are electrically connected in series between the light emitting element and a first line, wherein one of a source and a drain of the third transistor is electrically connected to a gate of the first transistor, wherein one of a source and a drain of the fourth transistor is electrically connected to the other of the source and the drain of the third transistor, wherein the other of the source and the drain of the fourth transistor is electrically connected to a current source circuit via a second line, wherein a gate of the fourth transistor is electrically connected to a third line, wherein one electrode of the capacitor is electrically connected to the gate of the first transistor, wherein the other electrode of the capacitor is electrically connected to the first line, wherein the driver circuit is configured to output signals to turn off the second transistor several times in one frame, and wherein the driver circuit is formed over a same substrate as the pixel.

2. The display device according to claim 1,
wherein a gate of the third transistor is electrically connected to the gate of the fourth transistor.

3. The display device according to claim 1,
wherein one of a source and a drain of the second transistor is electrically connected to the first line,
wherein the other of the source and the drain of the second transistor is electrically connected to one of a source and a drain of the first transistor,
wherein the other of the source and the drain of the first transistor is electrically connected to the light emitting element, and
wherein the gate of the second transistor is electrically connected to the other of the source and the drain of the second transistor.

4. The display device according to claim 1,
wherein the first transistor comprises polycrystalline silicon.

5. The display device according to claim 1,
wherein the light emitting element is an organic light emitting diode.

6. The display device according to claim 1, further comprising a fifth transistor,
wherein one of a source and a drain of the fifth transistor is electrically connected to a gate of the second transistor,
wherein the other of the source and the drain of the fifth transistor is electrically connected to the first line,
wherein a gate of the fifth transistor is electrically connected to a fourth line, and
wherein the second transistor is turned off several times in the one frame by inputting the signals to the fourth line.

7. The display device according to claim 6,
wherein a gate of the third transistor is electrically connected to the gate of the fourth transistor.

8. The display device according to claim 6,
wherein one of a source and a drain of the second transistor is electrically connected to the first line,
wherein the other of the source and the drain of the second transistor is electrically connected to one of a source and a drain of the first transistor,
wherein the other of the source and the drain of the first transistor is electrically connected to the light emitting element, and
wherein the gate of the second transistor is electrically connected to the other of the source and the drain of the second transistor.

9. The display device according to claim 6,
wherein the first transistor comprises polycrystalline silicon.

10. The display device according to claim 6,
wherein the light emitting element is an organic light emitting diode.

11. The display device according to claim 6, further comprising a sixth transistor,
wherein a gate of the sixth transistor is electrically connected to the gate of the second transistor,
wherein one of a source and a drain of the sixth transistor is electrically connected to the first line, and
wherein the other of the source and the drain of the sixth transistor is electrically connected to the other of the source and the drain of the third transistor.

12. The display device according to claim 11,
wherein a gate of the third transistor is electrically connected to the gate of the fourth transistor.

13. The display device according to claim 11,
wherein one of a source and a drain of the second transistor is electrically connected to the first line,
wherein the other of the source and the drain of the second transistor is electrically connected to one of a source and a drain of the first transistor,
wherein the other of the source and the drain of the first transistor is electrically connected to the light emitting element, and
wherein the gate of the second transistor is electrically connected to the other of the source and the drain of the second transistor.

14. The display device according to claim 11,
wherein the first transistor comprises polycrystalline silicon.

15. The display device according to claim 11,
wherein the light emitting element is an organic light emitting diode.

* * * * *

UNITED STATES PATENT AND TRADEMARK OFFICE
CERTIFICATE OF CORRECTION

PATENT NO. : 8,071,982 B2
APPLICATION NO. : 12/966379
DATED : December 6, 2011
INVENTOR(S) : Jun Koyama It is certified that error appears in the above-identified patent and that said Letters Patent is hereby corrected as shown below:

Column 7, lines 3-4, replace "1()1" with --101--

Column 7, line 58, replace "Try" with --Tr5--

Column 9, line 52, replace "Try" with --Tr5--

Column 11, line 14, replace "Try" with --Tr5--

Column 13, line 42, replace "(Wa)" with --($WF_6$)--

Column 18, line 14, after "silicon oxide" delete "to"

Column 19, line 1, replace "Try" with --Tr5--

Column 19, line 54, replace "CHF:" with --$CHF_3$--

Column 20, line 51, after "method" delete "to"

Column 21, line 53, replace "22()" with --220--

Column 23, line 27, replace "Try" with --Tr5--

Column 23, line 28, replace "8026" with --802b--

Column 23, line 41, replace "8026" with --802b--

Column 32, line 49, replace "wring" with --wiring--

Column 33, line 26, replace "FPC 4000" with --FPC 4006--

Column 33, line 26, after "are" delete "to"

Column 33, line 28, replace "43011a" with --4300a--

Column 35, lines 20 and 21, replace "Try" with --Tr5--

Column 36, line 51, replace "Try" with --Tr5--

Column 37, line 59, after "for" delete "to"

Signed and Sealed this
Twenty-third Day of October, 2012

David J. Kappos
*Director of the United States Patent and Trademark Office*